United States Patent
Lee et al.

(10) Patent No.: US 9,618,568 B2
(45) Date of Patent: Apr. 11, 2017

(54) TEST EQUIPMENT FOR TESTING SEMICONDUCTOR DEVICE AND METHODS OF TESTING SEMICONDUCTOR DEVICE USING THE SAME

(71) Applicant: Samsung Electronics Co., Ltd., Suwon-si (KR)

(72) Inventors: Young-Chul Lee, Asan-si (KR); Nam-Hong Lee, Cheonan-si (KR); Kyung-Sook Lee, Daejeon (KR); Jung-Hyun Park, Asan-si (KR); Sang-Youl Lee, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 127 days.

(21) Appl. No.: 14/077,485

(22) Filed: Nov. 12, 2013

(65) Prior Publication Data
US 2014/0197861 A1   Jul. 17, 2014

(30) Foreign Application Priority Data
Jan. 17, 2013 (KR) .......................... 10-2013-0005493

(51) Int. Cl.
*G01R 31/20* (2006.01)
*G01R 31/26* (2014.01)
(Continued)

(52) U.S. Cl.
CPC ....... *G01R 31/2867* (2013.01); *G01R 31/287* (2013.01); *G01R 31/2893* (2013.01); *G01R 31/2894* (2013.01)

(58) Field of Classification Search
CPC .......... G01R 31/31907; G01R 31/2601; G01R 31/318511; G01R 31/31707;
(Continued)

(56) References Cited

U.S. PATENT DOCUMENTS 5,094,584 A * 3/1992 Bullock ..................... 414/800
6,844,717 B2 * 1/2005 Shim ................ G01R 31/2887
324/750.13
(Continued)

FOREIGN PATENT DOCUMENTS

JP           2000-131365       5/2000
KR      1020010010032 A     2/2001
(Continued)

*Primary Examiner* — Arleen M Vazquez
*Assistant Examiner* — Neel Shah
(74) *Attorney, Agent, or Firm* — Myers Bigel, P.A.

(57) ABSTRACT

A method of testing a semiconductor device using the test equipment includes loading an undivided printed circuit board (PCB) including unit PCBs in a test equipment. A semiconductor device is mounted in each of the unit PCBs. Product information of the undivided PCB loaded in the test equipment is confirmed. The undivided PCB whose product information has been confirmed is electrically connected to one of a plurality of main testers of the test equipment. Each of the main testers includes a main test interface directly connected to a cloud server in which firmwares for various kinds of tests are stored. The product information of the undivided PCB is transmitted to the main tester electrically connected to the undivided PCB. The main tester to which the product information has been transmitted performs a main test of the undivided PCB using the product information. The undivided PCB on which the main test has been performed by the main tester is unloaded from the test equipment.

19 Claims, 28 Drawing Sheets

(51) Int. Cl.
*H01R 12/52* (2011.01)
*H01R 12/00* (2006.01)
*G01R 31/28* (2006.01)

(58) Field of Classification Search
CPC ............ G01R 31/2834; G01R 31/2808; G01R 31/2893; G01R 31/2867; G01R 31/31908; G01R 31/2849; G01R 31/2801; G01R 1/0466; G01R 31/20; G01R 31/31; G01R 31/26; G06K 19/06; H01R 12/52; H01R 12/00
USPC ....... 324/537, 750, 754, 755, 762, 756, 757, 324/760, 765, 750.3, 756.02
See application file for complete search history.

(56) References Cited

U.S. PATENT DOCUMENTS

| | | | |
|---|---|---|---|
| 6,970,007 B2 * | 11/2005 | Miyakita ............ | G01R 31/2875 324/750.11 |
| 7,899,987 B2 | 3/2011 | Salomon | |
| 8,026,733 B2 | 9/2011 | Lee et al. | |
| 2006/0139044 A1 * | 6/2006 | Park ..................... | G01R 1/0408 324/763.01 |
| 2007/0075719 A1 * | 4/2007 | Chung ............... | G01R 31/2893 324/750.15 |
| 2007/0236235 A1 * | 10/2007 | Kang et al. .................... | 324/760 |
| 2010/0066631 A1 | 3/2010 | Puzella et al. | |
| 2010/0101844 A1 | 4/2010 | Hasegawa | |
| 2011/0179134 A1 | 7/2011 | Mayo et al. | |
| 2012/0062262 A1 * | 3/2012 | Lee .................... | G01R 31/2893 324/757.04 |
| 2012/0146673 A1 * | 6/2012 | Kim et al. ................. | 324/750.3 |
| 2013/0049790 A1 * | 2/2013 | Frost et al. .............. | 324/762.01 |

FOREIGN PATENT DOCUMENTS

| | | |
|---|---|---|
| KR | 1020050039955 A | 5/2005 |
| KR | 1020070035783 A | 4/2007 |
| KR | 100791050 B1 | 12/2007 |
| KR | 1020050030253 A | 3/2011 |
| KR | 1020110034860 A | 4/2011 |

* cited by examiner

S2200

S2400

TEST EQUIPMENT FOR TESTING SEMICONDUCTOR DEVICE AND METHODS OF TESTING SEMICONDUCTOR DEVICE USING THE SAME

CROSS-REFERENCE TO RELATED APPLICATION

This application claims priority under 35 U.S.C. §119 to Korean Patent Application No. 10-2013-0005493, filed on Jan. 17, 2013, the disclosure of which is hereby incorporated by reference in its entirety.

FIELD

Embodiments of the inventive concept relate to test equipment for testing a semiconductor device mounted on unit printed circuit boards (PCBs) of an undivided PCB and methods of testing the semiconductor device using the test equipment.

BACKGROUND

A semiconductor device may include a mass storage, such as a solid-state drive (SSD). The semiconductor device may be mounted on a printed circuit board (PCB). The semiconductor device may be mounted on each of unit PCBs of an undivided PCB. The semiconductor device may be fabricated using various test processes. Research has been conducted into various test equipments and test methods for efficiently performing a test process.

SUMMARY

Embodiments of the inventive concept provide test equipment for testing a semiconductor device and methods of testing a semiconductor device using the test equipment, by which a process of testing a semiconductor device may be efficiently performed.

Other embodiments of the inventive concept provide test equipment for testing a semiconductor device and methods of testing a semiconductor device using the test equipment, by which a process of testing a semiconductor device mounted in each of unit printed circuit boards (PCBs) may be performed on the level of an undivided PCB, which is not divided into unit PCBs.

Other embodiments of the inventive concept provide test equipment for testing a semiconductor device and methods of testing a semiconductor device using the test equipment, by which a process of testing undivided PCBs in which unit PCBs are differently arranged may be efficiently performed.

In accordance with an aspect of the inventive concept, a method of testing a semiconductor device includes loading in a test equipment at a loading part thereof an undivided PCB including a plurality of unit PCBs with a semiconductor device being mounted in each of the unit PCBs. The method includes confirming product information of the undivided PCB at the loading part of the test equipment. The method includes electrically connecting the undivided PCB whose product information has been confirmed to one of a plurality of main testers of the test equipment, wherein each of the main testers includes a main test interface directly connected to a cloud server in which firmwares for various kinds of tests are stored. The method includes transmitting the product information of the undivided PCB to the main tester electrically connected to the undivided PCB. The method includes, using the main tester, performing a main test of the undivided PCB using the transmitted product information. The method includes unloading the undivided PCB on which the main test has been performed by the main tester from the test equipment.

Performing the main test of the undivided PCB may include updating firmware for a main test corresponding to the product information, which is stored in the cloud server, and performing the main test of the undivided PCB using the updated firmware.

Electrically connecting the undivided PCB to one of the main testers may include confirming usable main testers of the plurality of main testers, selecting one of the usable main testers, and electrically connecting the undivided PCB to the selected main tester. Electrically connecting the undivided PCB to the selected main tester may fixing the undivided PCB into a drawer of the test equipment electrically connected to the selected main tester using a test controller of the test equipment.

Transmitting the product information of the undivided PCB to the main tester electrically connected to the undivided PCB may include confirming an electrical connection between the undivided PCB and the selected main tester using the test controller.

The method may further include: electrically connecting the undivided PCB whose product information has been confirmed with an electrical connection tester at the loading part of the test equipment; updating firmware for an electrical connection test corresponding to the product information from the cloud server; transmitting the updated firmware for the electrical connection test to the electrical connection tester; performing an electrical connection test of the undivided PCB using the updated firmware for the electrical connection test using the electrical connection tester; and electrically connecting the undivided PCB, which has passed the electrical connection test, to one of the main testers.

The method may further include stacking the undivided PCB, which has not passed the electrical connection test, in a recovery magazine unit of the test equipment.

The method may further include recording results of the main test of the undivided PCB that has completed the main test, and unloading the undivided PCB on which the results of the main test are recorded, from the test equipment.

Recording the results of the main test of the undivided PCB may include printing a mark in which the results of the main test are stored, on the undivided PCB.

Unloading the undivided PCB on which the results of the main test are recorded, from the test equipment may include classifying the undivided PCB based on the results of the main test.

Classifying the undivided PCB based on the results of the main test may include: ascertaining whether or not the undivided PCB has passed the main test; stacking the undivided PCB which has passed the main test, in a first keeping magazine unit; and stacking the undivided PCB, which has not passed the main test, in a second keeping magazine unit.

The method may further include storing the results of the main test to the cloud server.

Confirming the product information of the undivided PCB may include recognizing arrangement information of the unit PCBs stored in a code of the undivided PCB using a code recognition unit.

In accordance with another aspect of the inventive concept, a method of testing a semiconductor device includes: loading an undivided PCB in a test equipment, the undivided PCB including a plurality of unit PCBs, a semiconductor device being mounted in each of the unit PCBs; moving the undivided PCB to an electrical connection test chamber of the test equipment; confirming product information of the undivided PCB disposed in the electrical connection test chamber using a code recognition unit of the electrical connection test chamber; transmitting the product information of the undivided PCB to an electrical connection test unit of the electrical connection test chamber, the electrical connection test unit being directly connected to a cloud server; performing an electrical connection test of the undivided PCB using the product information using the electrical connection test unit; electrically connecting the undivided PCB, which has passed the electrical connection test, to one of a plurality of main testers of the test equipment, the main testers being discretely connected to the cloud server; transmitting the product information of the undivided PCB to the main tester electrically connected to the undivided PCB; using the main tester; performing a main test of the undivided PCB using the transmitted product information; recording results of the main test of the undivided PCB on which the main test has been performed by the main tester; and classifying the undivided PCB on which the results of the main test are recorded based on the results of the main test.

Performing the electrical connection test of the undivided PCB using the product information may include receiving updated firmware for an electrical connection test corresponding to the product information from the cloud server and performing the electrical connection test of the undivided PCB using the updated firmware.

The method may include storing results of the electrical connection test in the cloud server.

In accordance with another aspect of the inventive concept, a method of testing a semiconductor device includes: loading an undivided PCB in a loading area of a test equipment, the undivided PCB including a plurality of unit PCBs, each unit PCB including a semiconductor device; confirming product information of the undivided PCB using a code recognition unit disposed at the loading area; conveying the undivided PCB to a testing area of the test equipment; electrically connecting the undivided PCB to a main tester at the testing area; transmitting the product information to a cloud server using a controller associated with the main tester; receiving from the cloud server firmware corresponding to the product information at the controller associated with the main tester; and performing a main test of the undivided PCB at the main tester using the received firmware.

The loading area may include an electrical connection test chamber, and the method may include: loading the undivided PCB into the electrical connection test chamber; and performing an electrical connection test of the undivided PCB using an electrical connection test unit in the electrical connection test chamber.

In some embodiments, the method includes: transmitting the product information to a cloud server using a controller associated with the loading area; receiving from the cloud server firmware corresponding to the product information at the controller associated with the loading area; and performing the electrical connection test of the undivided PCB using the received firmware.

The code recognition unit may be disposed above a conveyor that conveys the undivided PCB into the electrical connection test chamber. The code recognition unit may be disposed within the electrical connection test chamber.

In some embodiments, the method includes: ascertaining whether the undivided PCB has passed the electrical connection test using an electrical connection tester disposed in the electrical connection test chamber; conveying the undivided PCB to the testing area if the undivided PCB has passed the electrical connection test; and conveying the undivided PCB to a recovery magazine unit if the undivided PCB has not passed the electrical connection test.

BRIEF DESCRIPTION OF THE DRAWINGS

The foregoing and other features and advantages of the inventive concepts will be apparent from the more particular description of embodiments of the inventive concepts, as illustrated in the accompanying drawings. The drawings are not necessarily to scale, emphasis instead being placed upon illustrating the principles of the inventive concepts. In the drawings.

DETAILED DESCRIPTION OF THE EMBODIMENTS

Figure 1:
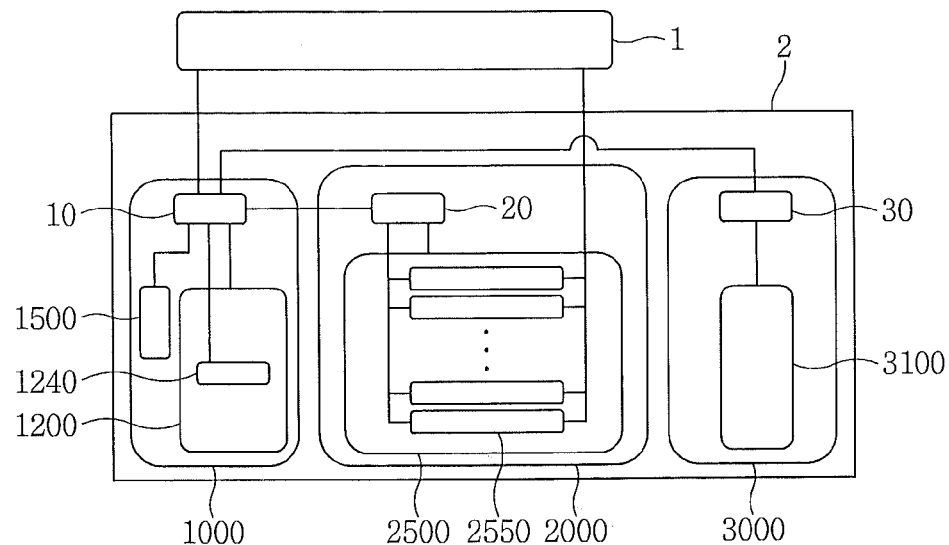
FIG. 1 is a block diagram of a test equipment for testing a semiconductor device according to embodiments of the inventive concept.

Embodiments of the inventive concept are described below in sufficient detail to enable those of ordinary skill in the art to embody and practice the inventive concept. It is important to understand that the inventive concept may be embodied in many alternate forms and should not be construed as limited to the embodiments set forth herein.

Elements of the example embodiments are consistently denoted by the same reference numerals throughout the drawings and detailed description. In the drawings, the thicknesses of layers and regions may be exaggerated for clarity. It will also be understood that when a layer is referred to as being "on" another layer or substrate, it can be directly on the other layer or substrate or intervening layers may also be present.

It will be understood that, although the terms first, second, etc. may be used herein in reference to elements of the invention, such elements should not be construed as limited by these terms. For example, a first element could be termed a second element, and a second element could be termed a first element, without departing from the scope of the present invention.

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

FIG. 1 is a block diagram of a test equipment for testing a semiconductor device according to embodiments of the inventive concept.

Referring to FIG. 1, the test equipment for testing the semiconductor device according to the embodiments of the inventive concept may include a cloud server 1 and a main equipment 2. The cloud server 1 may be spaced apart from the main equipment 2. The cloud server 1 may be disposed outside the main equipment 2.

Various kinds of firmwares may be stored in the cloud server 1. All kinds of firmwares required for performing a test process on undivided printed circuit boards (PCBs) loaded in the test equipment for testing the semiconductor device according to the embodiments of the inventive concept, may be stored in the cloud server 1. For example, firmwares for making an electrical connection test of the undivided PCBs, and firmwares for making a main test of the undivided PCBs may be stored in the cloud server 1.

The cloud server 1 may be electrically connected to the main equipment 2. Test results obtained using the main equipment 2 may be stored in the cloud server 1. For example, results of the electrical connection test and the main test performed on the undivided PCBs by the main equipment 2 may be stored in the cloud server 1.

The main equipment 2 may perform a test process on the undivided PCBs using the cloud server 1. The main equipment 2 may request a firmware required for performing the test process on the undivided PCBs from the cloud server 1. The cloud server 1 may transmit the corresponding firmware to the main equipment 2 at the request of the main equipment 2.

The main equipment 2 may include a loading area or part 1000, a test area or part 2000, and an unloading area or part 3000. The test part 2000 may be interposed between the loading part 1000 and the unloading part 3000. The loading part 1000, the test part 2000, and the unloading part 3000 may be disposed in one direction (or generally in one direction).

The loading part 1000 may transmit the undivided PCBs to the test part 2000. Each of the undivided PCBs may include unit PCBs. At least one semiconductor device may be disposed on each of the unit PCBs. Undivided PCBs on which the main test will be performed may be sequentially loaded on the loading part 1000. The loading part 1000 may perform the electrical connection test of the undivided PCBs. The electrical connection test may include a test of electrical connection between each of the unit PCBs and the corresponding semiconductor device. For instance, the electrical connection test may include performing an assembling process failure test of the undivided PCBs.

FIGS. 2A through 2E are schematic views of various kinds of undivided PCBs on which a test process is performed using the test equipment.

Referring to FIGS. 2A through 2E, front surfaces 100F (front side or front transverse side) of undivided PCBs 100 on which a test process is performed by the test equipment may have the same width. The width of back surfaces 100B (back side or back transverse side) of the undivided PCBs 100 may be equal to the width of the front surfaces 100F of the corresponding undivided PCBs 100. For example, each of the undivided PCBs 100 may have a rectangular shape. Each of the undivided PCBs 100 may have a pad portion 110, a fixing hole 120, unit PCBs 130, and a code 140.

The pad portion 110 may be disposed close to the front surface 100F of the corresponding undivided PCB 100. The pad portion 110 may be spaced apart from a first side surface 100L (or first longitudinal side) and a second side surface 100R (or second longitudinal side) of the corresponding undivided PCB 100.

The pad portion 110 may include test terminals 111. For instance, the test terminals 111 of the pad portion 110 may be disposed in two columns in the pad portion 110. The test terminals 111 may be disposed according to a Joint Test Action Group (JTAG) standard. The JTAG standard is a guiding principle for performing a test process on the unit PCBs 130 without test probes. The test terminals 111 of the undivided PCBs 100 may be arranged in the same manner.

The fixing hole 120 may penetrate the corresponding undivided PCB 100. The fixing hole 120 may be spaced apart from the unit PCBs 130 of the corresponding undivided PCB 100. The fixing hole 120 may be interposed between the pad portion 110 and the unit PCBs 130. The fixing hole 120 may be spaced apart from the code 140. The fixing hole 120 may be interposed between the pad portion 110 and the code 140. The fixing hole 120 may be disposed close to the pad portion 110. The fixing hole 120 may be interposed between the pad portion 110 and the first and second side surfaces 100L and 100R of the corresponding undivided PCB 100.

Each of the unit PCBs 130 may be electrically connected to the pad portion 110. The unit PCBs 130 may be disposed close to the back surface 100B of the corresponding undivided PCB 100. The unit PCBs 130 may be interposed between the pad portion 110 and the back surface 100B of the corresponding undivided PCB 100.

At least one semiconductor device 131 may be mounted on each of the unit PCBs 130. The at least one semiconductor device 131 may be mounted on each of the unit PCBs 130 in the same arrangement. The at least one semiconductor device 131 may be electrically connected to the test terminals 111 of the pad portion 110 through the unit PCBs 130.

Figure 2A:
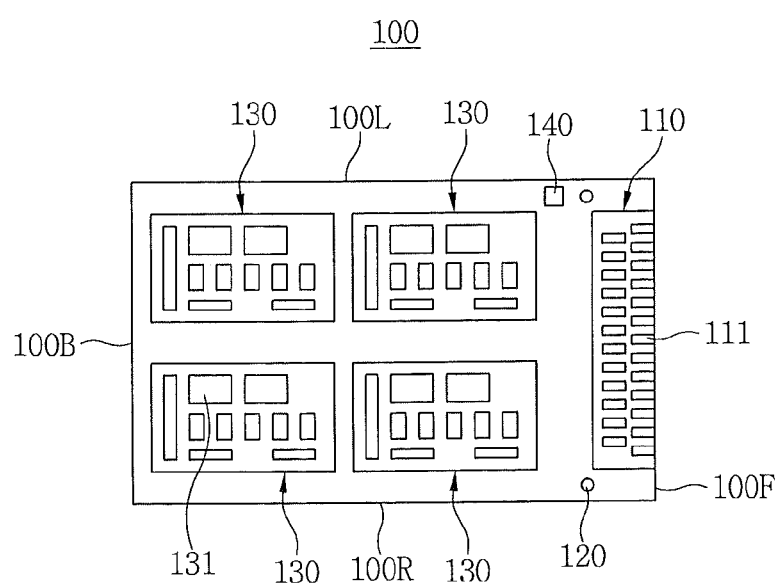
FIGS. 2A through 2E are schematic views of various kinds of undivided PCBs on which a test process is performed using test equipment according to embodiments of the inventive concept.
Figure 2B:
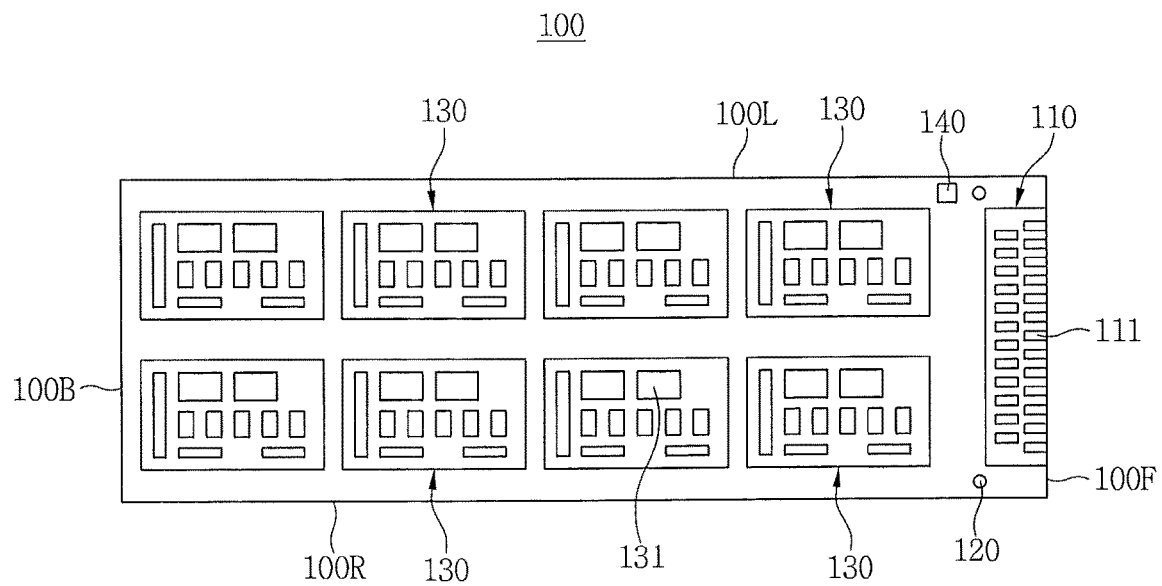
Figure 2C:
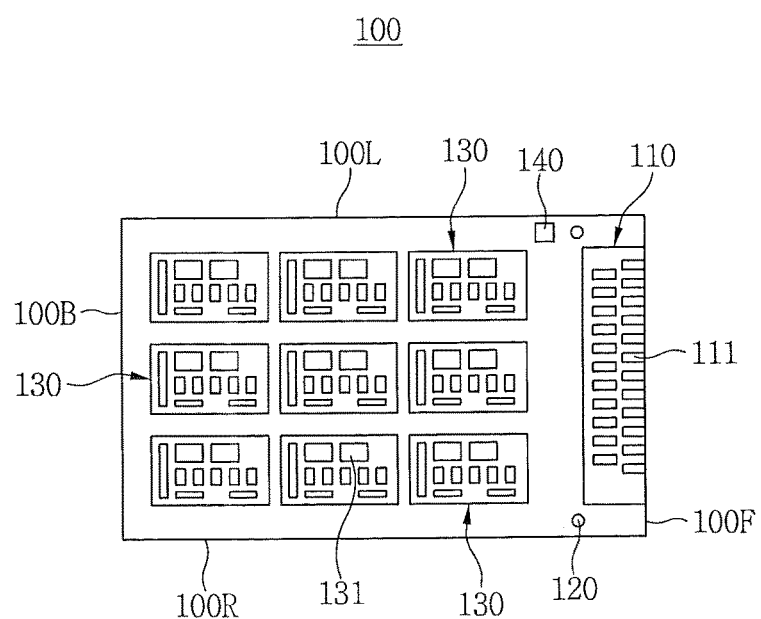
Figure 2D:
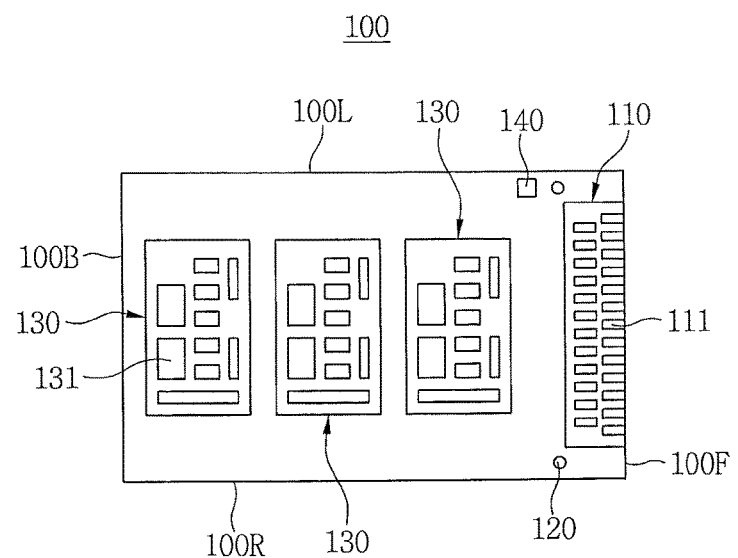
Figure 2E:
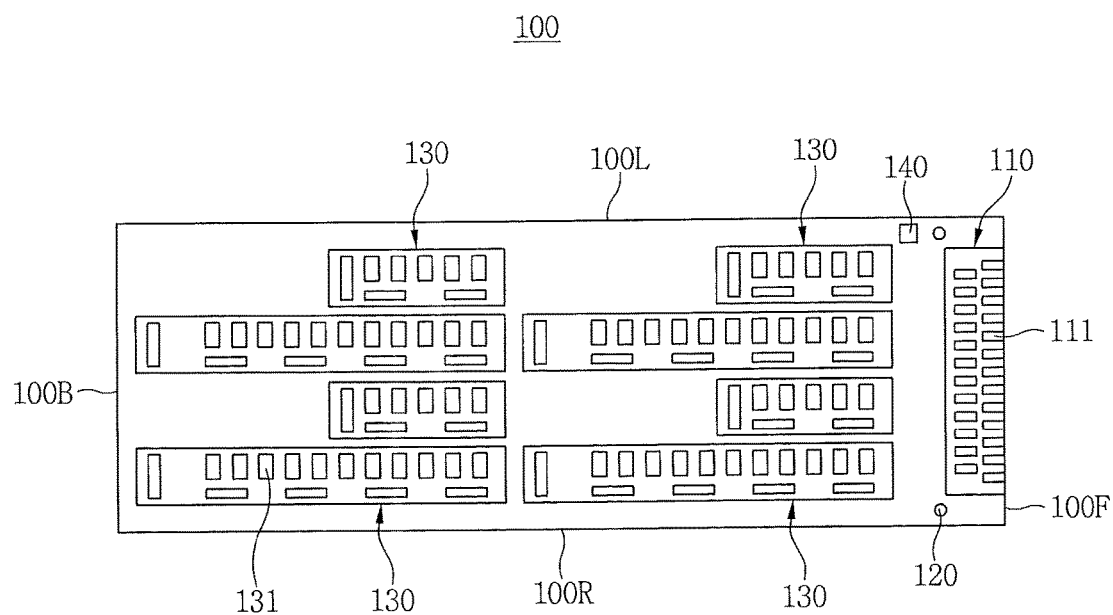

The unit PCBs 130 may be arranged on the corresponding undivided PCB 100 in various ways. For example, one of the undivided PCBs 100 may include four unit PCBs 130 arranged in two columns as shown in FIG. 2A. Another one of the undivided PCBs 100 may include eight unit PCBs 130 arranged in two columns as shown in FIG. 2B. Another one of the undivided PCBs 100 may include nine unit PCBs 130 arranged in three columns as shown in FIG. 2C. Another one of the undivided PCBs 100 may include three unit PCBs 130 arranged in one column as shown in FIG. 2D. Another one of the undivided PCBs 100 may include two pairs of unit PCBs 130 arranged in a 2×2 shape as shown in FIG. 2E, each of the pairs of unit PCBs 130 including two unit PCBs 130 having different lengths. Another one of the undivided PCBs 100 may include unit PCBs 130 having different lengths and arranged repetitively.

The code 140 may include product information regarding the corresponding undivided PCB 100. For instance, the product information may include arrangement information regarding the unit PCBs 130 included in the corresponding undivided PCB 100. The product information may include results of the previous process performed on the corresponding undivided PCB 100. The arrangement and previous process results of the unit PCBs 130 included in the corresponding undivided PCB 100 may be recorded in the code 140.

The code 140 may be spaced apart from the unit PCBs 130. The code 140 may be interposed between the fixing hole 120 and the unit PCBs 130. The code 140 may be disposed close to one side surface of the corresponding undivided PCB 100. For instance, the code 140 may be disposed close to the first side surface 100L of the corresponding undivided PCB 100. The code 140 may be a 2-dimensional (2D) bar code.

Figure 3A:
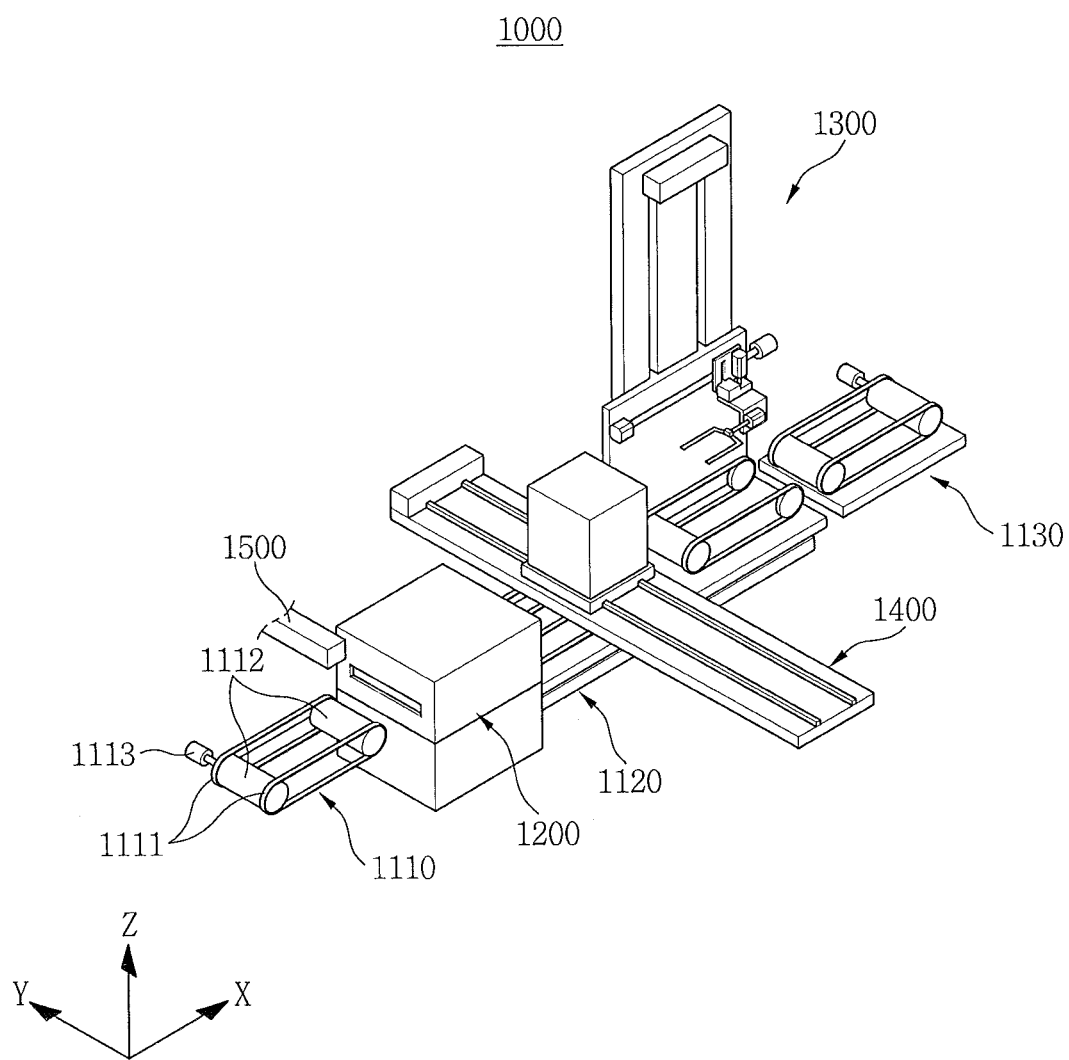
FIGS. 3A through 3E are diagrams of a loading part of a main equipment of the test equipment shown in FIG. 1.
Figure 3B:
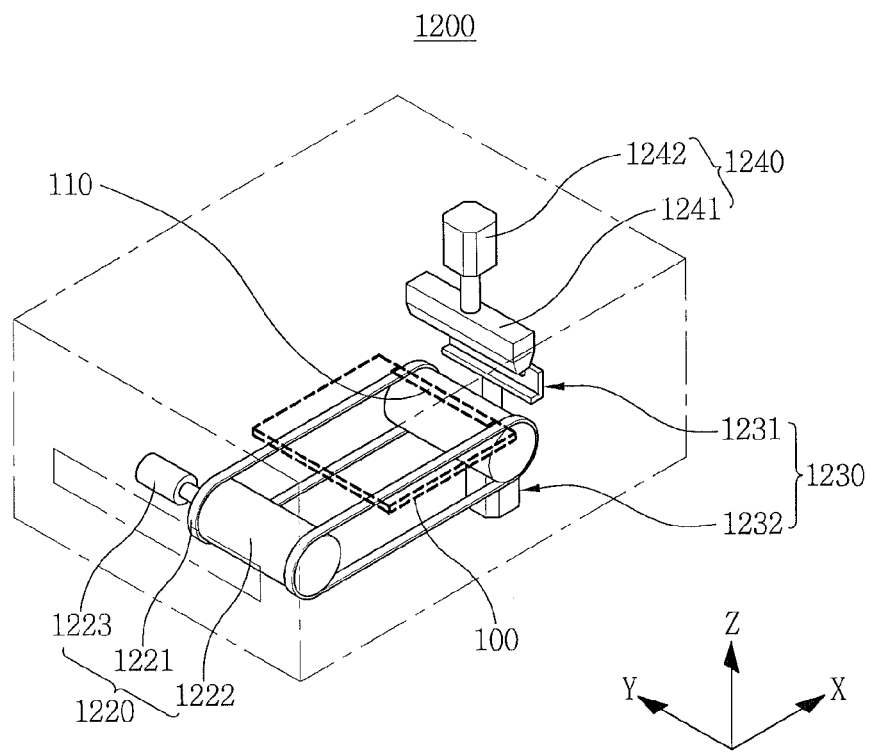
Figure 3C:
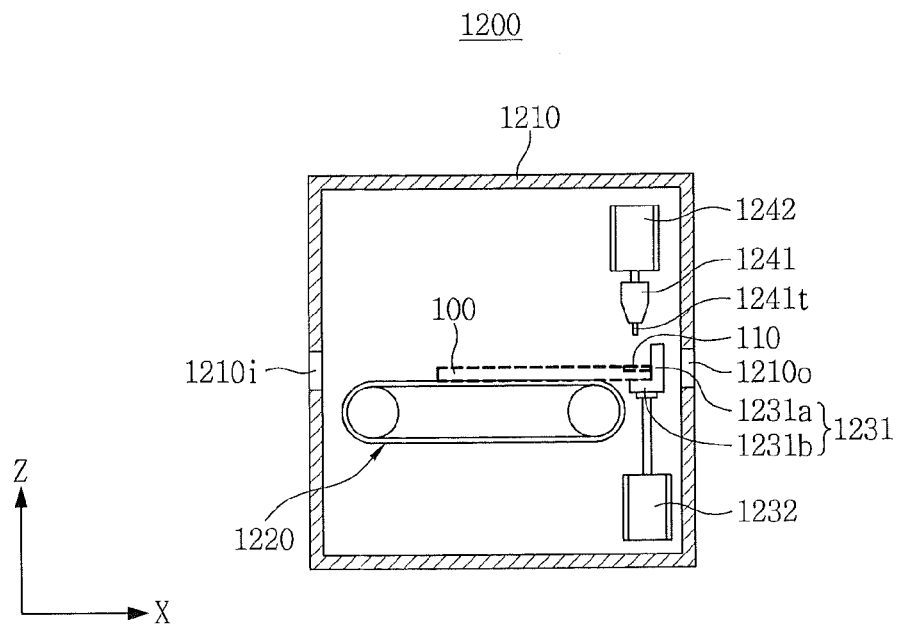
Figure 3D:
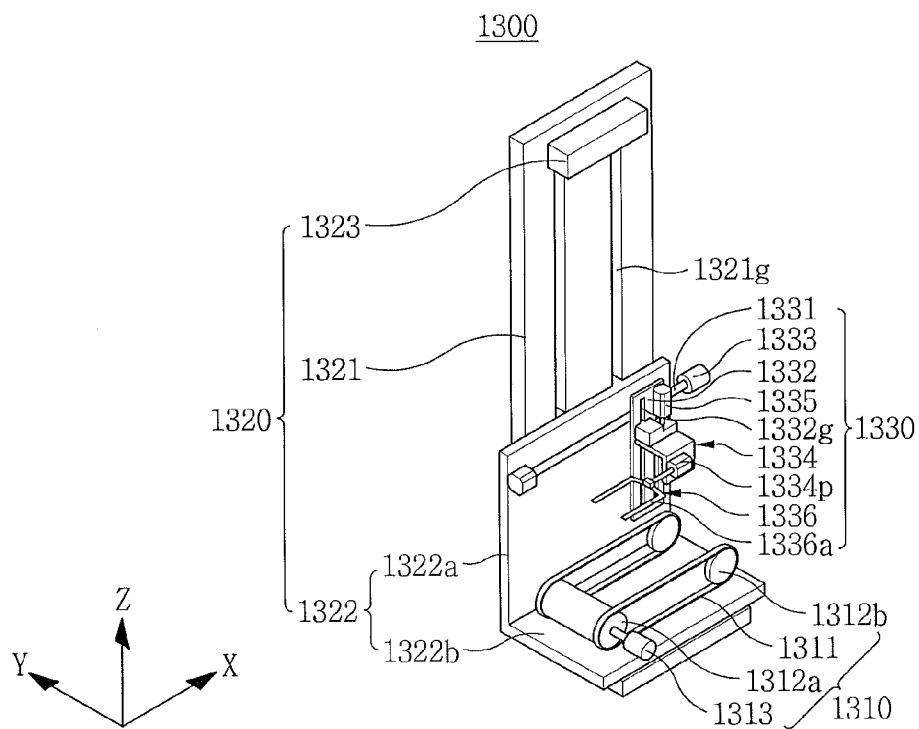
Figure 3E:
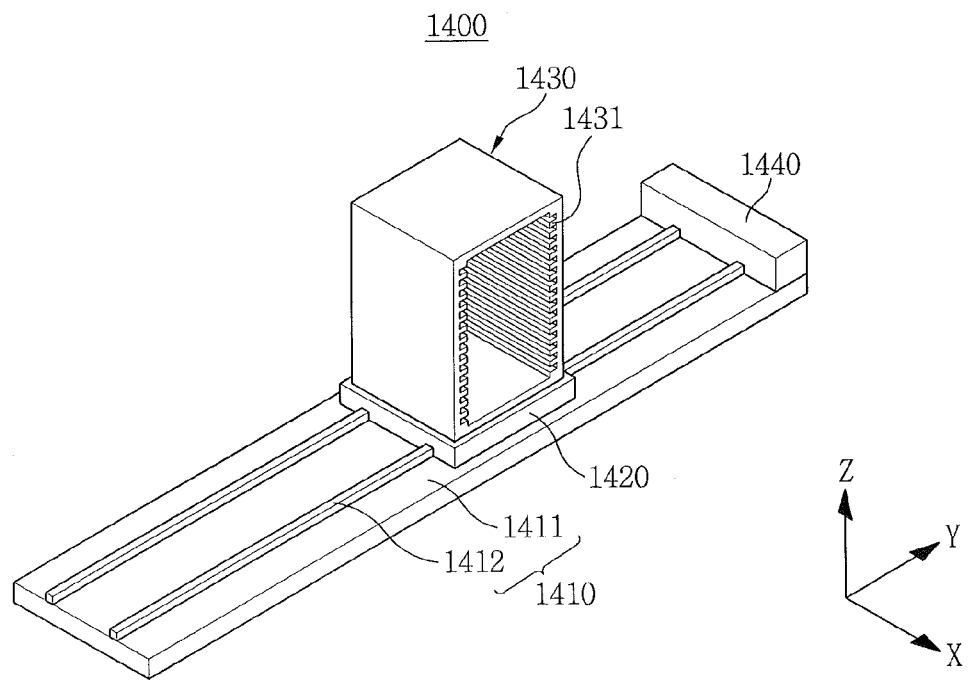

FIG. 3A is a perspective view of the loading part 1000 of the main equipment 2 of the test equipment shown in FIG. 1. FIG. 3B is a perspective view of an electrical connection test chamber of the loading part 1000 of the test equipment shown in FIG. 1. FIG. 3C is a cross-sectional view of the electrical connection test chamber of the loading part 1000 of the test equipment shown in FIG. 1. FIG. 3D is a perspective view of a recovery unit of the loading part 1000 of the test equipment shown in FIG. 1. FIG. 3E is a perspective view of a recovery magazine unit of the loading part 1000 of the test equipment shown in FIG. 1.

Referring to FIGS. 1, 2A through 2E, and 3A through 3E, the loading part 1000 of the main equipment 2 of the test equipment of the semiconductor device according to the present embodiments of the inventive concept may include a loading controller 10, a first loading conveyor unit 1110, a second loading conveyor unit 1120, a third loading conveyor unit 1130, an electrical connection test chamber 1200, the recovery unit 1300, the recovery magazine unit 1400, and a code recognition unit 1500.

The loading controller 10 may be electrically connected to the first loading conveyor unit 1110, the second loading conveyor unit 1120, the third loading conveyor unit 1130, the electrical connection test chamber 1200, the recovery unit 1300, the recovery magazine unit 1400, and the code recognition unit 1500. The first loading conveyor unit 1110, the second loading conveyor unit 1120, the third loading conveyor unit 1130, the electrical connection test chamber 1200, the recovery unit 1300, the recovery magazine unit 1400, and the code recognition unit 1500 may be controlled by the loading controller 10.

The loading controller 10 may be electrically connected to the cloud server 1. The loading controller 10 may be directly connected to the cloud server 1. The electrical connection test chamber 1200 may be connected to the cloud server 1 through the loading controller 10.

The first loading conveyor unit 1110 may move the undivided PCB 100 loaded in the loading part 1000 in a first direction X. The undivided PCB 100 loaded in the loading part 1000 may be moved by the first loading conveyor unit 1110 in the first direction X. The first loading conveyor unit 1110 may include a pair of loading conveyor belts 1111, a pair of loading conveyor rollers 1112, and a loading conveyor driving element 1113.

The pair of loading conveyor belts 1111 may be in direct contact with the undivided PCB 100 loaded in the loading part 1000. The undivided PCB 100 loaded in the loading part 1000 may be mounted on the pair of loading conveyor belts 1111. The pair of loading conveyor belts 1111 may extend in the first direction X. The pair of loading conveyor belts 1111 may be spaced apart from each other in a second direction Y. The second direction Y may be perpendicular to the first direction X.

The pair of loading conveyor rollers 1112 may support the pair of loading conveyor belts 1111. The pair of loading conveyor belts 1111 may surround the pair of loading conveyor rollers 1112. The pair of loading conveyor rollers 1112 may extend in the second direction Y. The pair of loading conveyor rollers 1112 may be spaced apart from each other in the first direction X.

The loading conveyor driving element 1113 may drive the pair of loading conveyor belts 1111. The loading conveyor driving element 1113 may rotate at least one of the pair of loading conveyor rollers 1112. For example, the loading conveyor driving element 1113 may rotate the loading conveyor roller 1112 disposed far from the electrical connection test chamber 1200.

The loading conveyor driving element 1113 may be electrically connected to the loading controller 10. The loading conveyor driving element 1113 may be controlled by the loading controller 10. The loading conveyor driving element 1113 may drive the pair of loading conveyor belts 1111 under the control of the loading controller 10. The undivided PCB 100 loaded in the loading part 1000 may move in the first direction X under the control of the loading controller 10. The loading conveyor driving element 1113 may include a motor.

The second loading conveyor unit 1120 may move the undivided PCB 100 loaded in the loading part 1000 from the electrical connection test chamber 1200 to the recovery unit 1300. The second loading conveyor unit 1120 may be interposed between the electrical connection test chamber 1200 and the recovery unit 1300. The electrical connection test chamber 1200, the second loading conveyor unit 1120, and the recovery unit 1300 may be disposed in the first direction X. The undivided PCB 100 loaded in the loading part 1000 may be moved by the second loading conveyor unit 1120 in the first direction X. The second loading conveyor unit 1120 may have the same or similar structure as the first loading conveyor unit 1110.

The second loading conveyor unit 1120 may be electrically connected to the loading controller 10. The second loading conveyor unit 1120 may be controlled by the loading controller 10. The undivided PCB 100 loaded in the loading part 1000 may move from the electrical connection test chamber 1200 to the recovery unit 1300 under the control of the loading controller 10.

The undivided PCB 100 that has passed through the recovery unit 1300 may be moved by the third loading conveyor unit 1130 to the test part 2000 of the main equipment 2. The third loading conveyor unit 1130 may be interposed between the recovery unit 1300 and the test part 2000. The recovery unit 1300, the third loading conveyor unit 1130, and the test part 2000 may be disposed in the first direction X. The undivided PCB 100 loaded in the loading part 1000 may be moved by the third loading conveyor unit 1130 in the first direction X. The third loading conveyor unit 1130 may have the same or similar structure as the first loading conveyor unit 1110.

The third loading conveyor unit 1130 may be electrically connected to the loading controller 10. The third loading conveyor unit 1130 may be controlled by the loading controller 10. The undivided PCB 100 that has passed through the recovery unit 1300 may move from the electrical connection test chamber 1200 to the test part 2000 of the main equipment 2 under the control of the loading controller 10.

The electrical connection test chamber 1200 may perform an electrical connection test of the undivided PCB 100. The electrical connection test chamber 1200 may be interposed between the first loading conveyor unit 1110 and the second loading conveyor unit 1120. The first loading conveyor unit 1110, the electrical connection test chamber 1200, and the second loading conveyor unit 1120 may be disposed in the first direction X. The undivided PCB 100 loaded in the loading part 1000 may be loaded into the electrical connection test chamber 1200 by the first loading conveyor unit 1110. The undivided PCB 100 that has completed the electrical connection test using the electrical connection test chamber 1200 may be discharged from the electrical connection test chamber 1200 and mounted on the second loading conveyor unit 1120.

The electrical connection test chamber 1200 may include an electrical connection test housing 1210, an electrical connection conveyor unit 1220, an electrical connection stopper unit 1230, and an electrical connection test unit 1240.

The electrical connection test housing 1210 may provide a space for performing the electrical connection test of the undivided PCB 100. The electrical connection test housing 1210 may include an electrical connection inlet port 1210*i* and an electrical connection outlet port 1210*o*.

The electrical connection inlet port 1210*i* may be disposed in the first direction X along with the first loading conveyor unit 1110. The undivided PCB 100 loaded in the loading part 1000 may load into the electrical connection test housing 1210 through the electrical connection inlet port 1210*i*. The electrical connection outlet port 1210*o* may be disposed in the first direction X along with the second loading conveyor unit 1120. The undivided PCB 100 disposed in the electrical connection test housing 1210 may be unloaded to the second loading conveyor unit 1120 through the electrical connection outlet port 1210*o*. The electrical connection outlet port 1210*o* may be disposed in the first direction X along with the electrical connection inlet port 1210*i* (e.g., the ports 1210*i*, 1210*o* may be aligned). For instance, the electrical connection outlet port 1210*o* may be symmetrical to the electrical connection inlet port 1210*i*. The ports 1210*i*, 1210*o* may match or substantially match in shape and size.

The undivided PCB 100 that has loaded into the electrical connection test housing 1210 through the electrical connection inlet port 1210*i* may be moved by the electrical connection conveyor unit 1220 to the electrical connection outlet port 1210*o*. The electrical connection conveyor unit 1220 may be interposed between the electrical connection inlet port 1210*i* and the electrical connection outlet port 1210*o*. The electrical connection inlet port 1210*i*, the electrical connection conveyor unit 1220, and the electrical connection outlet port 1210*o* may be disposed in the first direction X. The undivided PCB 100 disposed in the electrical connection test housing 1210 may be moved by the electrical connection conveyor unit 1220 in the first direction X.

The electrical connection conveyor unit 1220 may include a pair of electrical connection conveyor belts 1221, a pair of electrical connection conveyor rollers 1222, and an electrical connection conveyor driving element 1223.

The pair of electrical connection conveyor belts 1221 may be in direct contact with the undivided PCB 100 that has loaded into the electrical connection test housing 1210. The undivided PCB 100 disposed in the electrical connection test housing 1210 may be mounted on the pair of electrical connection conveyor belts 1221. The pair of electrical connection conveyor belts 1221 may extend in the first direction X. The pair of electrical connection conveyor belts 1221 may be spaced apart from each other in the second direction Y.

The pair of electrical connection conveyor rollers 1222 may support the pair of electrical connection conveyor belts 1221. The pair of electrical connection conveyor belts 1221 may surround the pair of electrical connection conveyor rollers 1222. The pair of electrical connection conveyor rollers 1222 may extend in the second direction Y. The pair of electrical connection conveyor rollers 1222 may be spaced apart from each other in the first direction X.

The electrical connection conveyor driving element 1223 may drive the pair of electrical connection conveyor belts 1221. The electrical connection conveyor driving element 1223 may rotate at least one of the pair of electrical connection conveyor rollers 1222. For instance, the electrical connection conveyor driving element 1223 may rotate the electrical connection conveyor roller 1222 disposed close to the electrical connection inlet port 1210*i*.

The electrical connection conveyor driving element 1223 may be electrically connected to the loading controller 10. The electrical connection conveyor driving element 1223 may be controlled by the loading controller 10. The electrical connection conveyor driving element 1223 may drive the pair of electrical connection conveyor belts 1221 under the control of the loading controller 10. The undivided PCB 100 disposed in the electrical connection test housing 1210 may move in the first direction X under the control of the loading controller 10. The electrical connection conveyor driving element 1223 may include a motor.

The electrical connection stopper unit 1230 may stop the undivided PCB 100 disposed in the electrical connection test housing 1210 before or during the electrical connection test. The undivided PCB 100 that is on the move due to the electrical connection conveyor unit 1220 may be stopped by the electrical connection stopper unit 1230.

The electrical connection stopper unit 1230 may be disposed close to the electrical connection outlet port 1210*o* of the electrical connection test housing 1210. The electrical connection stopper unit 1230 may be interposed between the electrical connection conveyor unit 1220 and the electrical connection outlet port 1210*o*. The electrical connection stopper unit 1230 may include an electrical connection stopper 1231 and an electrical connection stopper driving element 1232.

The electrical connection stopper 1231 may be in direct contact with the undivided PCB 100 disposed on the electrical connection conveyor unit 1220. The electrical connection stopper 1231 may include a first electrical connection stopper plate 1231*a* and a second electrical connection stopper plate 1231*b*.

The first electrical connection stopper plate 1231*a* may be in direct contact with the front surface 100F of the undivided PCB 100 disposed on the electrical connection conveyor unit 1220. The first electrical connection stopper plate 1231*a* may have a predetermined length in a third direction Z. The third direction Z may be a direction perpendicular to a plane surface formed by the first direction X and the second direction Y. For example, the third direction Z may be a vertical direction. The first electrical connection stopper plate 1231*a* may extend in the second direction Y. For example, the first electrical connection stopper plate 1231*a* may be a plate shape parallel to a plane surface formed by the second direction Y and the third direction Z. The first electrical connection stopper plate 1231*a* may have a rectangular shape.

The second electrical connection stopper plate 1231*b* may support the undivided PCB 100 stopped by the first electrical connection stopper plate 1231*a*. The second electrical connection stopper plate 1231*b* may be in direct contact with a bottom surface of the undivided PCB 100 that is in contact with the first electrical connection stopper plate 1231*a*. The second electrical connection stopper plate 1231*b* may support the pad portion 110 of the undivided PCB 100 stopped by the first electrical connection stopper plate 1231*a*.

The second electrical connection stopper plate 1231*b* may have a plate shape parallel to a plane surface formed by the first direction X and the second direction Y. The second electrical connection stopper plate 1231*b* may have a rectangular shape. The second electrical connection stopper plate 1231*b* may be combined with a lower end portion of the first electrical connection stopper plate 1231*a*. The second electrical connection stopper plate 1231*b* may protrude from the first electrical connection stopper plate 1231*a* toward the electrical connection conveyor unit 1220. For example, the first electrical connection stopper plate 1231*a* and the second electrical connection stopper plate 1231*b* may have an L shape facing the electrical connection conveyor unit 1220. The second electrical connection stopper plate 1231*b* may be integrally formed with the first electrical connection stopper plate 1231*a*.

The electrical connection stopper driving element 1232 may drive the electrical connection stopper 1231. The electrical connection stopper driving element 1232 may move the electrical connection stopper 1231 from an interrupting position to a standby position. The interrupting position of the electrical connection stopper 1231 may be a position for stopping the undivided PCB 100 that is on the move due to the electrical connection conveyor unit 1220. The standby position of the electrical connection stopper 1231 may be a position that does not interrupt the movement of the undivided PCB 100 due to the electrical connection conveyor unit 1220. The standby position of the electrical connection stopper 1231 may be a position where the undivided PCB 100 that is on the move due to the electrical connection conveyor unit 1220 does not stop.

The interrupting position of the electrical connection stopper 1231 may be above the standby position of the electrical connection stopper 1231. The standby position of the electrical connection stopper 1231 may be below the interrupting position of the electrical connection stopper 1231. The electrical connection stopper 1231 may be moved by the electrical connection stopper driving element 1232 in the third direction Z.

The electrical connection stopper driving element 1232 may be electrically connected to the loading controller 10. The electrical connection stopper driving element 1232 may be controlled by the loading controller 10. The electrical connection stopper driving element 1232 may drive the electrical connection stopper 1231 under the control of the loading controller 10. The electrical connection stopper 1231 may move in the third direction Z under the control of the loading controller 10. The electrical connection stopper driving element 1232 may include a hydraulic cylinder.

The electrical connection test unit 1240 may perform an electrical connection test of the undivided PCB 100 that has stopped due to the electrical connection stopper unit 1230. The electrical connection test unit 1240 may be disposed over the electrical connection stopper unit 1230. The electrical connection test unit 1240 may be disposed in the third direction Z along with the electrical connection stopper unit 1230.

The electrical connection test unit 1240 may include an electrical connection tester 1241 and a tester driving element 1242.

The electrical connection tester 1241 may be in direct contact with the pad portion 110 of the undivided PCB 100, which has stopped due to the electrical connection stopper unit 1230, during the electrical connection test. The electrical connection test may be performed on the undivided PCB 100 disposed in the electrical connection chamber 1200 by the electrical connection tester 1241.

The electrical connection tester 1241 may be disposed over the electrical connection stopper 1231. The electrical connection tester 1241 may be disposed over the second electrical connection stopper plate 1231*b*. The electrical connection tester 1241 may be disposed over the pad portion 110 of the undivided PCB 100 that has stopped due to the electrical connection stopper unit 1230.

The electrical connection tester 1241 may include a tester tip 1241*t*. The tester tip 1241*t* may protrude from the electrical connection tester 1241 toward the electrical connection stopper unit 1230. The tester tip 1241*t* may be in direct contact with the test terminals 111 of the undivided PCB 100 that has stopped due to the electrical connection stopper unit 1230.

The electrical connection tester 1241 may be electrically connected to the loading controller 10. The electrical connection tester 1241 may be controlled by the loading controller 10. The electrical connection tester 1241 may perform the electrical connection test of the undivided PCB 100 under the control of the loading controller 10. The electrical connection tester 1241 may transmit results of the electrical connection test performed on the undivided PCB 100 to the loading controller 10.

The tester driving element 1242 may drive the electrical connection tester 1241. The tester driving element 1242 may move the electrical connection tester 1241 from a standby position to a test position. The standby position of the electrical connection tester 1241 may be a position where the electrical connection tester 1241 is not electrically connected to the undivided PCB 100 that has stopped due to the electrical connection stopper unit 1230. The standby position of the electrical connection tester 1241 may be a position where the tester tip 1241*t* of the electrical connection tester 1241 is not in direct contact with the pad portion 110 of the undivided PCB 100. The test position of the electrical connection tester 1241 may be a position where the tester tip 1241*t* is in direct contact with the pad portion 110 of the undivided PCB 100 that has stopped due to the electrical connection stopper unit 1230.

The test position of the electrical connection tester 1241 may be below the standby position of the electrical connection tester 1241. The standby position of the electrical connection tester 1241 may be above the test position of the electrical connection tester 1241. The electrical connection tester 1241 may be moved by the tester driving element 1242 in the third direction Z.

The tester driving element 1242 may be electrically connected to the loading controller 10. The tester driving element 1242 may be controlled by the loading controller 10. The tester driving element 1242 may drive the electrical connection tester 1241 under the control of the loading controller 10. The electrical connection tester 1241 may move in the third direction Z under the control of the loading controller 10. The electrical connection tester 1241 may include a hydraulic cylinder. The electrical connection tester 1241 (or the tester driving element 1242) may have the same or similar structure as the electrical connection stopper driving element 1232.

The recovery unit 1300 may move the undivided PCB 100 based on the results of the electrical connection test. The recovery unit 1300 may be interposed between the second loading conveyor unit 1120 and the third loading conveyor unit 1130. The second loading conveyor unit 1120, the recovery unit 1300, and the third loading conveyor unit 1130 may be disposed along the first direction X. The undivided PCB 100 disposed in the loading part 1000 may pass through the recovery unit 1300 based on the results of the electrical connection test. For example, when the undivided PCB 100 has not passed the electrical connection test, the undivided PCB 100 disposed in the loading part 1000 may be moved by the recovery unit 1300 to the recovery magazine unit 1400. When the undivided PCB 100 has passed the electrical connection test, the undivided PCB 100 may pass through the recovery unit 1300 and move to the third loading conveyor unit 1130.

The recovery unit 1300 may include a recovery conveyor unit 1310, a recovery conveyor moving element 1320, and a recovery gripper unit 1330.

The recovery conveyor unit 1310 may move the undivided PCB 100 disposed in the recovery unit 1300. The undivided PCB 100 disposed in the recovery unit 1300 may be moved by the recovery conveyor unit 1310 to the third loading conveyor unit 1130 based on the results of the electrical connection test. The recovery conveyor unit 1310 may be disposed in the first direction X along with the second loading conveyor unit 1120. The recovery conveyor unit 1310 may be interposed between the second loading conveyor unit 1120 and the third loading conveyor unit 1130. The second loading conveyor unit 1120, the recovery conveyor unit 1310, and the third loading conveyor unit 1130 may be disposed along the first direction X.

The recovery conveyor unit 1310 may include a pair of recovery conveyor belts 1311, a first recovery conveyor roller 1312*a*, a pair of second recovery conveyor rollers 1312*b*, and a recovery conveyor driving element 1313.

The pair of recovery conveyor belts 1311 may be in direct contact with the undivided PCB 100 disposed in the recovery unit 1300. The undivided PCB 100 disposed in the recovery unit 1300 may be mounted on the pair of recovery conveyor belts 1311. The pair of recovery conveyor belts 1311 may extend in the first direction X. The pair of recovery conveyor belts 1311 may be spaced apart from each other in the second direction Y.

The first recovery conveyor roller 1312*a* may support first ends or sides of the pair of recovery conveyor belts 1311. The first recovery conveyor roller 1312*a* may be disposed close to the second loading conveyor unit 1120. The pair of recovery conveyor belts 1311 may surround the first recovery conveyor roller 1312*a*. The first recovery conveyor roller 1312*a* may extend in the second direction Y.

The pair of second recovery conveyor rollers 1312*b* may support second ends or sides of the pair of recovery conveyor belts 1311. The second sides of the pair of recovery conveyor belts 1311 may be disposed opposite the first sides of the pair of recovery conveyor belts 1311. The pair of second recovery conveyor rollers 1312*b* may be disposed close to the third loading conveyor unit 1130. Each of the pair of second recovery conveyor rollers 1312*b* may be surrounded with the corresponding one of the pair of recovery conveyor belts 1311. The pair of second recovery conveyor rollers 1312*b* may be spaced apart from each other in the second direction Y.

The recovery conveyor driving element 1313 may drive the pair of recovery conveyor belts 1311. The recovery conveyor driving element 1313 may be combined with the first recovery conveyor roller 1312*a*. The recovery conveyor driving element 1313 may rotate the first recovery conveyor roller 1312*a*.

The recovery conveyor driving element 1313 may be electrically connected to the loading controller 10. The recovery conveyor driving element 1313 may be controlled by the loading controller 10. The recovery conveyor driving element 1313 may drive the pair of recovery conveyor belts 1311 under the control of the loading controller 10. The undivided PCB 100 disposed in the recovery unit 1300 may move in the first direction X under the control of the loading controller 10. The recovery conveyor driving element 1313 may include a motor.

The recovery conveyor moving element 1320 may move the recovery conveyor unit 1310 and the recovery gripper unit 1330. The recovery conveyor unit 1310 and the recovery gripper unit 1330 may be moved by the recovery conveyor moving element 1320 to a recovery position. The recovery position may be a position where the recovery conveyor unit 1310 and the recovery gripper unit 1330 are disposed in a row along with the recovery magazine unit 1400. For instance, the recovery conveyor moving element 1320 may move the recovery conveyor unit 1310 and the recovery gripper unit 1330 in the third direction Z.

The recovery conveyor moving element 1320 may include a recovery base plate 1321, a recovery conveyor support element 1322, and a recovery base driving element 1323.

The recovery base plate 1321 may be spaced apart from a side surface of the recovery conveyor unit 1310. The recovery base plate 1321 may face the side surface of the recovery conveyor unit 1310. The recovery base plate 1321 may extend in the third direction Z. The recovery base plate 1321 may have a plate shape parallel to a plane surface formed by the first direction X and the third direction Z. The recovery base plate 1321 may include a recovery guide groove 1321*g*. The recovery guide groove 1321*g* may extend in the third direction Z.

The recovery conveyor support element 1322 may support the recovery conveyor unit 1310 and the recovery gripper unit 1330. The recovery conveyor unit 1310 may include a first recovery support plate 1322*a* and a second recovery support plate 1322*b*.

The first recovery support plate 1322*a* may support the recovery gripper unit 1330. The recovery gripper unit 1330 may be fixed on the first recovery support plate 1322*a*. The first recovery support plate 1322*a* may have a plate shape parallel to a plane surface formed by the first direction X and the third direction Z.

The first recovery support plate 1322*a* may be combined with the recovery guide groove 1321*g* of the recovery base plate 1321. The first recovery support plate 1322*a* may move along the recovery guide groove 1321*g* in the third direction Z.

The second recovery support plate 1322*b* may support the recovery conveyor unit 1310. The recovery conveyor unit 1310 may be disposed on the second recovery support plate 1322*b*. The second recovery support plate 1322*b* may have a plate shape parallel to a plane surface formed by the first direction X and the second direction Y.

The second recovery support plate 1322*b* may be combined with the first recovery support plate 1322*a*. For example, the second recovery support plate 1322*b* may be combined with a lower end portion of the first recovery support plate 1322*a*. The second recovery support plate 1322*b* may protrude from the first recovery support plate 1322*a* in the second direction Y. For example, the first recovery support plate 1322*a* and the second recovery support plate 1322*b* may have an L shape. The second recovery support plate 1322*b* may be integrally formed with the first recovery support plate 1322*a*.

The recovery base driving element 1323 may drive the recovery conveyor support element 1322. The recovery base driving element 1323 may move the recovery conveyor support element 1322 to a recovery position. For example, the recovery conveyor support element 1322 may be moved by the recovery base driving element 1323 in the third direction Z.

The recovery base driving element 1323 may be disposed on the recovery base plate 1321. The recovery base driving element 1323 may be disposed at an upper end portion of the recovery base plate 1321. The recovery base driving element 1323 may include a motor.

The recovery base driving element 1323 may be electrically connected to the loading controller 10. The recovery base driving element 1323 may be controlled by the loading controller 10. The loading controller 10 may control the recovery base driving element 1323 based on the results of the electrical connection test. The undivided PCB 100 disposed in the recovery unit 1300 may move in the third direction Z under the control of the loading controller 10 based on the results of the electrical connection test.

The recovery gripper unit 1330 may space the undivided PCB 100, which is located in the recovery position, apart from the recovery conveyor unit 1310. The undivided PCB 100 located in the recovery position may be moved by the recovery gripper unit 1330 to the recovery magazine unit 1400. The recovery gripper unit 1330 may include a recovery horizontal guide rail 1331, a recovery horizontal block 1332, a recovery horizontal block driving element 1333, a recovery vertical block 1334, a recovery vertical block driving element 1335, and a recovery gripper 1336.

The recovery horizontal guide rail 1331 may be fixed to the first recovery support plate 1322*a*. The recovery horizontal guide rail 1331 may be disposed over the recovery conveyor unit 1310. The recovery horizontal guide rail 1331 may be disposed at an upper end portion of the first recovery support plate 1322*a*. The recovery horizontal guide rail 1331 may extend in the first direction X.

The recovery horizontal block 1332 may be combined with the recovery horizontal guide rail 1331. The recovery horizontal block 1332 may move along the recovery horizontal guide rail 1331 in the first direction X. The recovery horizontal block 1332 may include a recovery block guide groove 1332*g*. The recovery block guide groove 1332*g* may extend in the third direction Z.

The recovery horizontal block driving element 1333 may drive the recovery horizontal block 1332. The recovery horizontal block 1332 may be moved by the recovery horizontal block driving element 1333 in the first direction X. The recovery horizontal block driving element 1333 may be electrically connected to the loading controller 10. The recovery horizontal block driving element 1333 may be controlled by the loading controller 10. The recovery horizontal block 1332 may move in the first direction X under the control of the loading controller 10.

The recovery vertical block 1334 may be combined with the recovery block guide groove 1332*g* of the recovery horizontal block 1332. The recovery vertical block 1334 may move along the recovery block guide groove 1332*g* in the third direction Z. The recovery vertical block 1334 may include a gripper fixing unit 1334*p*.

The recovery vertical block driving element 1335 may drive the recovery vertical block 1334. The recovery vertical block 1334 may be moved by the recovery vertical block driving element 1335 in the third direction Z. The recovery vertical block driving element 1335 may be electrically connected to the loading controller 10. The recovery vertical block driving element 1335 may be controlled by the loading controller 10. The recovery vertical block 1334 may move in the third direction Z under the control of the loading controller 10.

The recovery gripper 1336 may be in direct contact with the undivided PCB 100 disposed on the recovery conveyor unit 1310 in the recovery position. The recovery gripper 1336 may be in direct contact with the undivided PCB 100 in the recovery position. The undivided PCB 100 located in the recovery position may be mounted on the recovery gripper 1336.

The recovery gripper 1336 may be combined with the gripper fixing unit 1334*p* of the recovery vertical block 1334. The recovery gripper 1336 may be moved by the recovery horizontal block driving element 1333 in the first direction X. The recovery gripper 1336 may be moved by the recovery vertical block driving element 1335 in the third direction Z. The recovery gripper 1336 may move in the first direction X and the third direction Z under the control of the loading controller 10. The recovery gripper 1336 may be interposed between the pair of recovery conveyor belts 1311.

The recovery gripper 1336 may have such a shape as to safely transfer the undivided PCB 100. For example, the recovery gripper 1336 may have a fork shape. The recovery gripper 1336 may include a pair of gripper arms 1336*a*. Each of the pair of gripper arms 1336*a* may extend in the first direction X.

The recovery magazine unit 1400 may contain the undivided PCB 100 that has been moved by the recovery unit 1300. The undivided PCB 100 that did not pass the electrical connection test may be stacked by the loading controller 10 in the recovery magazine unit 1400.

The recovery magazine unit 1400 may be located on the second loading conveyor unit 1120. The recovery magazine unit 1400 may include a recovery magazine base 1410, a recovery magazine support block 1420, a recovery magazine 1430, and a recovery magazine driving element 1440.

The recovery magazine base 1410 may provide a path along which the recovery magazine 1430 moves. The recovery magazine base 1410 may include a magazine base plate 1411 and a magazine base guide rail 1412.

The magazine base plate 1411 may extend in a direction intersecting (e.g., perpendicular to) the second loading conveyor unit 1120. The recovery magazine base 1410 may extend in the second direction Y.

The magazine guide rail 1412 may be disposed on the magazine base plate 1411. The magazine guide rail 1412 may extend in the same direction as the magazine base plate 1411. The magazine guide rail 1412 may extend in the second direction Y.

The recovery magazine support block 1420 may provide a space in which the recovery magazine 1430 will be mounted. The recovery magazine support block 1420 may be combined with the magazine guide rail 1412. The recovery magazine support block 1420 may move along the magazine guide rail 1412 in the second direction Y.

The recovery magazine 1430 may provide a space in which the undivided PCB 100 that has been moved by the recovery unit 1300 will be contained. The undivided PCB 100 that did not pass the electrical connection test may be stacked in the recovery magazine 1430. The recovery magazine 1430 may have an open surface toward the recovery unit 1300. Side surfaces of the recovery magazine 1430 may include magazine slots 1431. The undivided PCB 100 that has been moved by the recovery unit 1300 may be inserted into one of the magazine slots 1431.

The recovery magazine driving element 1440 may drive the recovery magazine support block 1420. The recovery magazine support block 1420 may be moved by the recovery magazine driving element 1440 in the second direction Y.

The recovery magazine driving element 1440 may be disposed on the magazine base plate 1411. The recovery magazine driving element 1440 may be disposed on an end portion of one side of the magazine base plate 1411. The recovery magazine driving element 1440 may include a motor.

The recovery magazine driving element 1440 may be electrically connected to the loading controller 10. The recovery magazine driving element 1440 may be controlled by the loading controller 10. The recovery magazine 1430 may be moved by the loading controller 10 in the second direction Y.

The code recognition unit 1500 may confirm product information of the undivided PCB 100 disposed in the loading part 1000. The code recognition unit 1500 may recognize data recorded in the code 140 of the undivided PCB 100. For example, arrangement information regarding the unit PCBs 130 of the undivided PCB 100 and the results of the previous process may be confirmed by the code recognition unit 1500. The code recognition unit 1500 may include a 2D bar code recognizes.

The code recognition unit 1500 may be disposed over the first loading conveyor unit 1110. The code recognition unit 1500 may be disposed close to the electrical connection test chamber 1200.

The code recognition unit 1500 may be electrically connected to the loading controller 10. The code recognition unit 1500 may be controlled by the loading controller 10. The product information of the undivided PCB 100 may be transmitted by the code recognition unit 1500 to the loading controller 10.

Figure 4A:
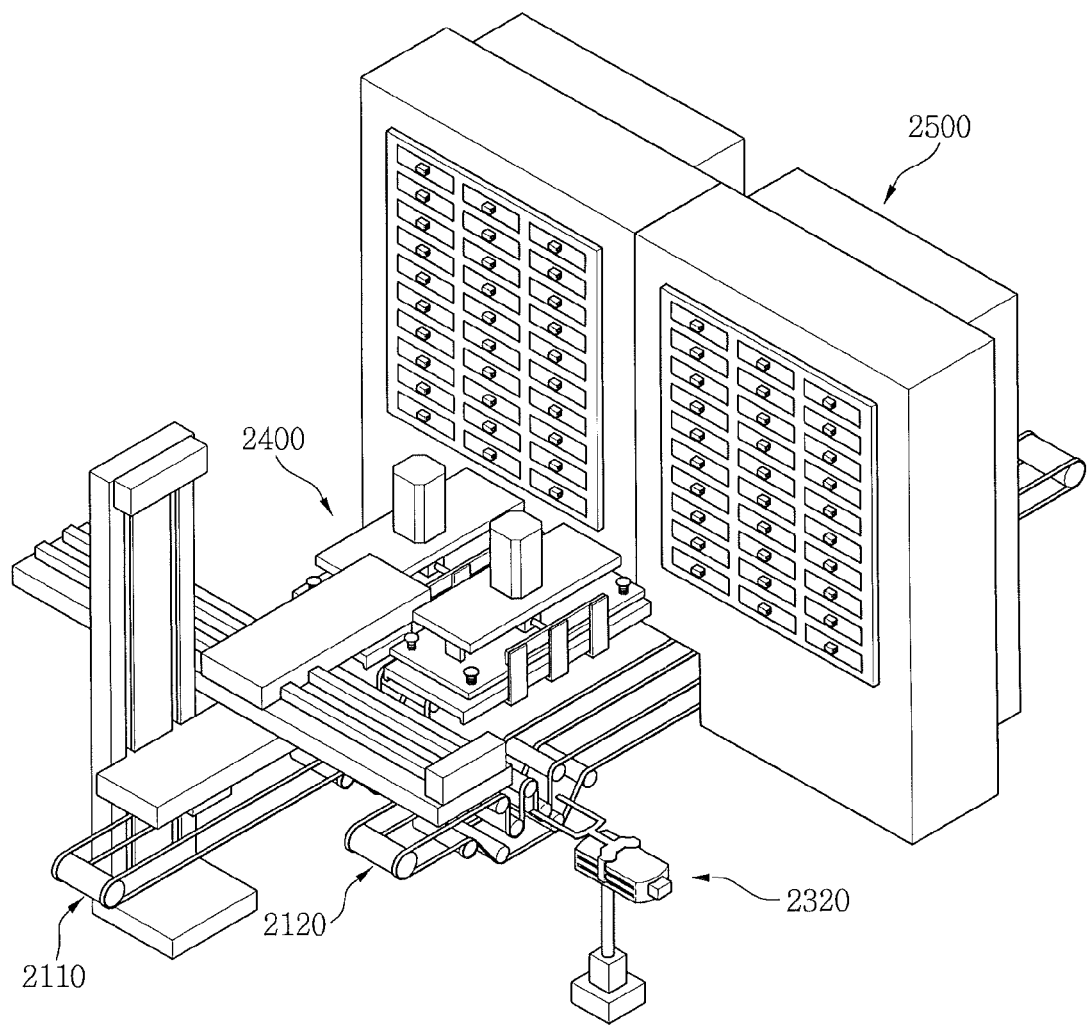
FIGS. 4A through 4O are diagrams of a test part of the main equipment of the test equipment shown in FIG. 1.
Figure 4B:
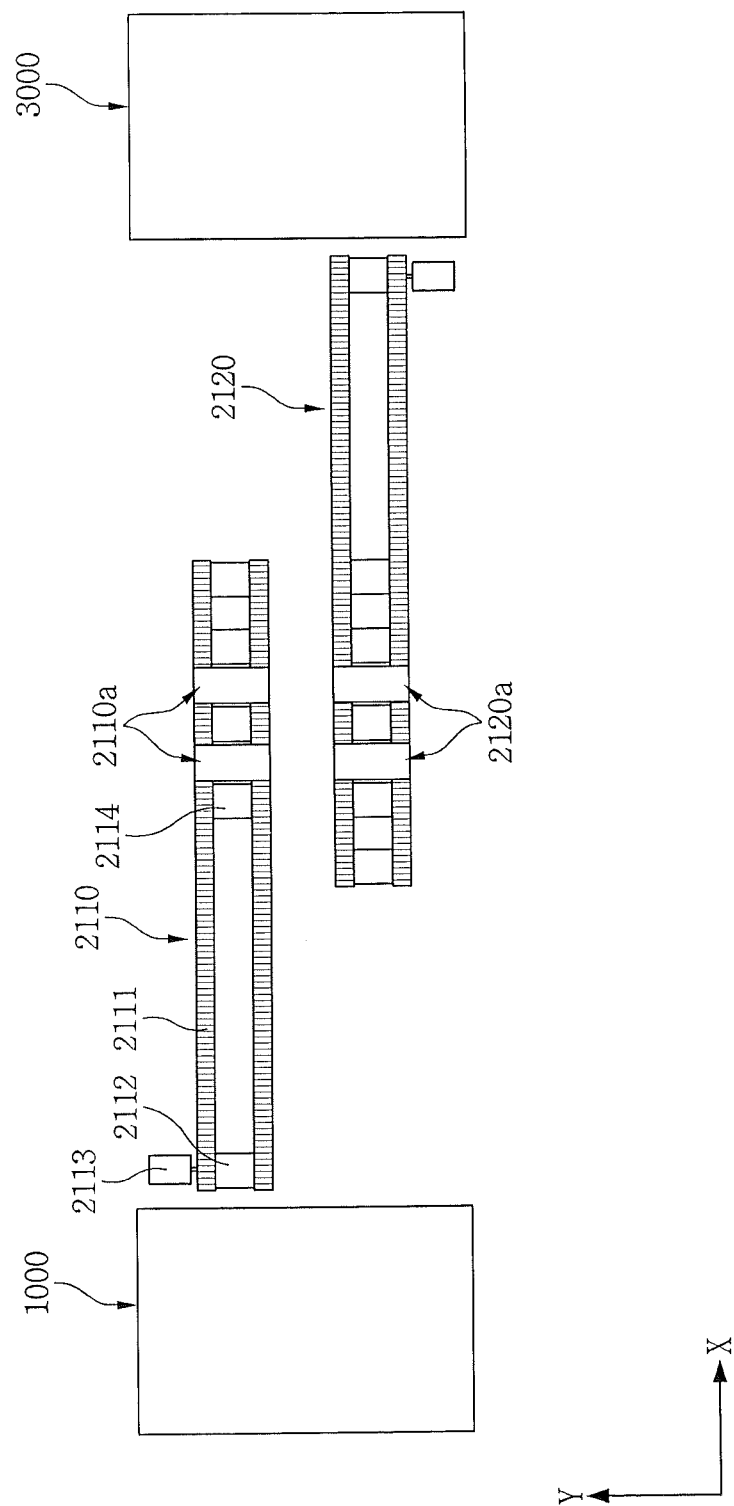
Figure 4C:
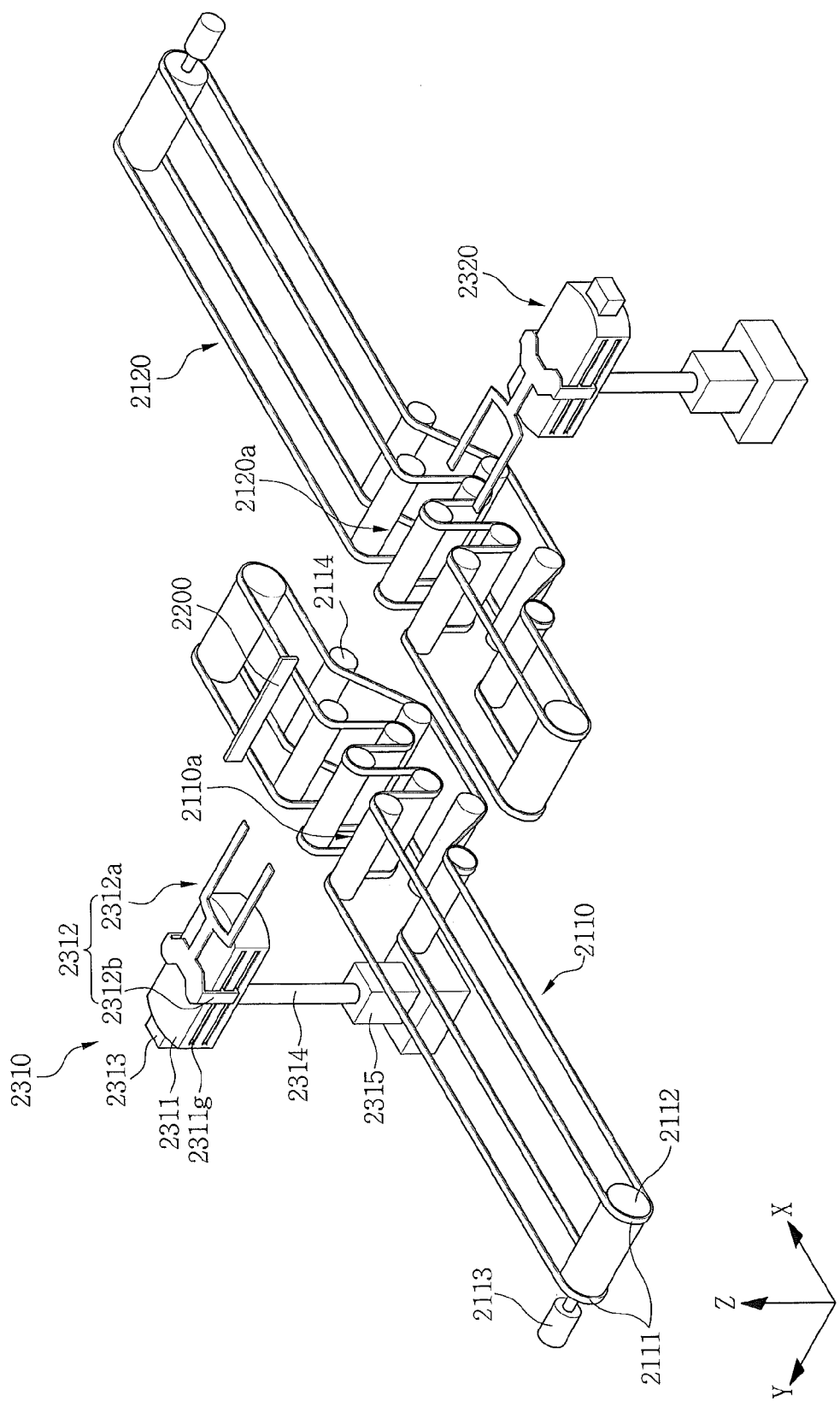
Figure 4D:
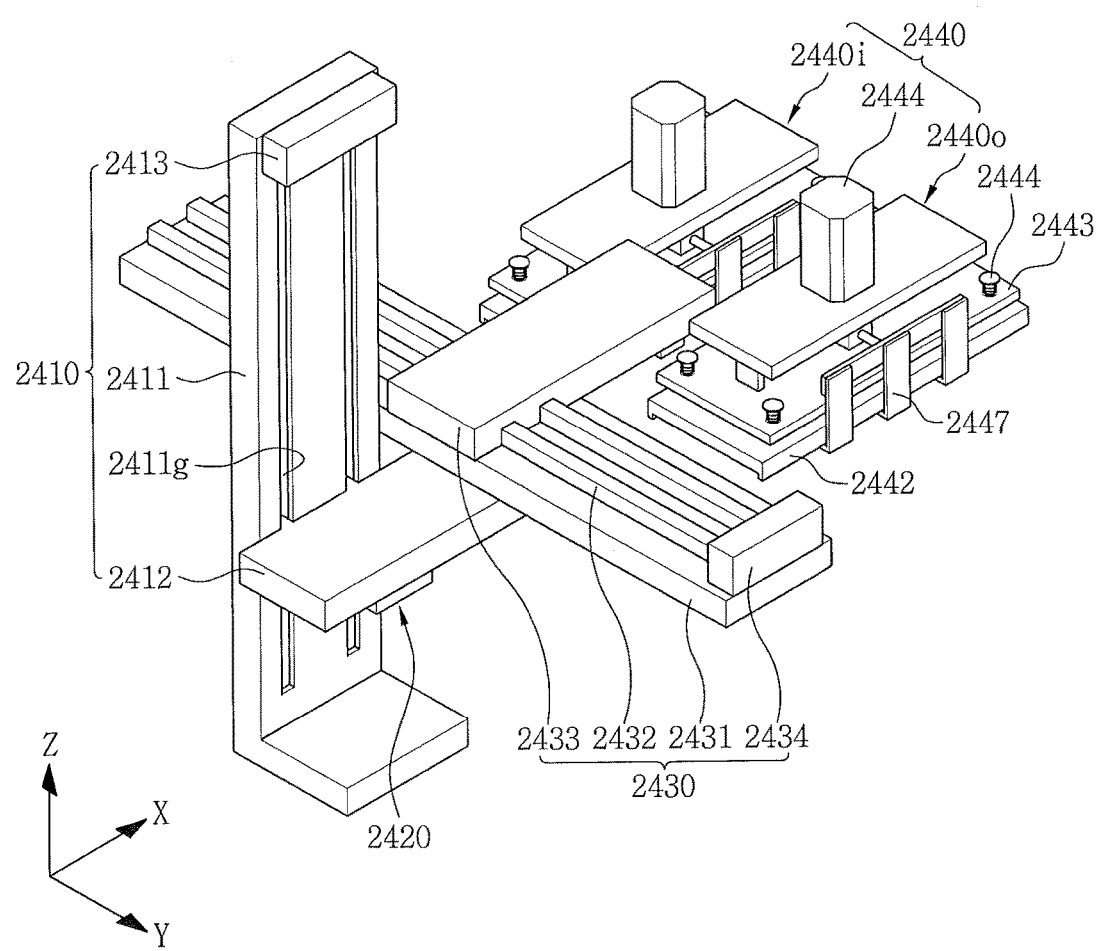
Figure 4E:
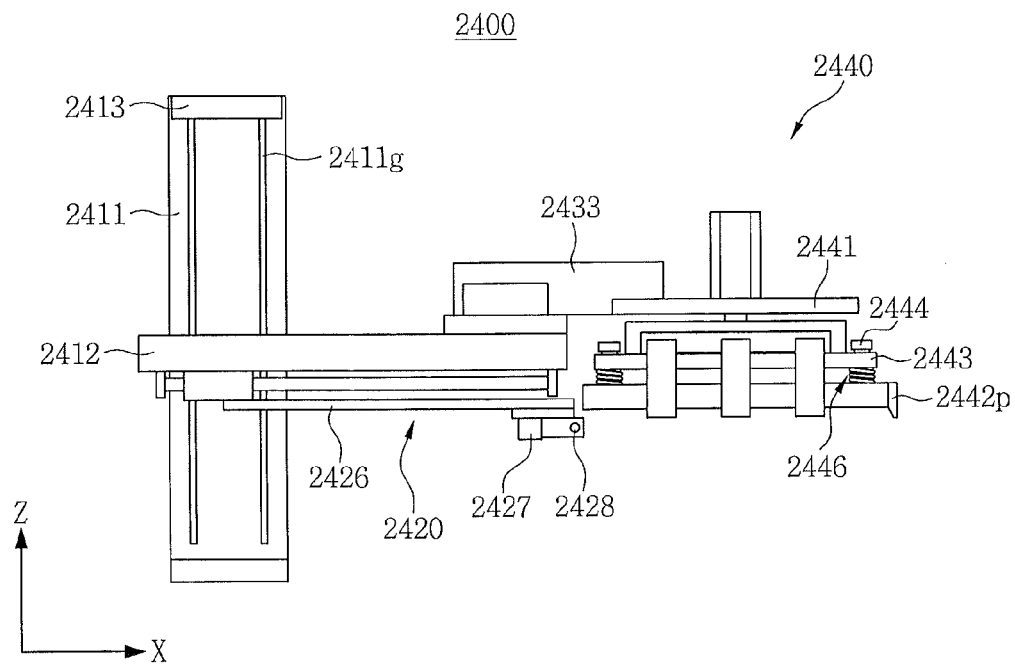
Figure 4F:
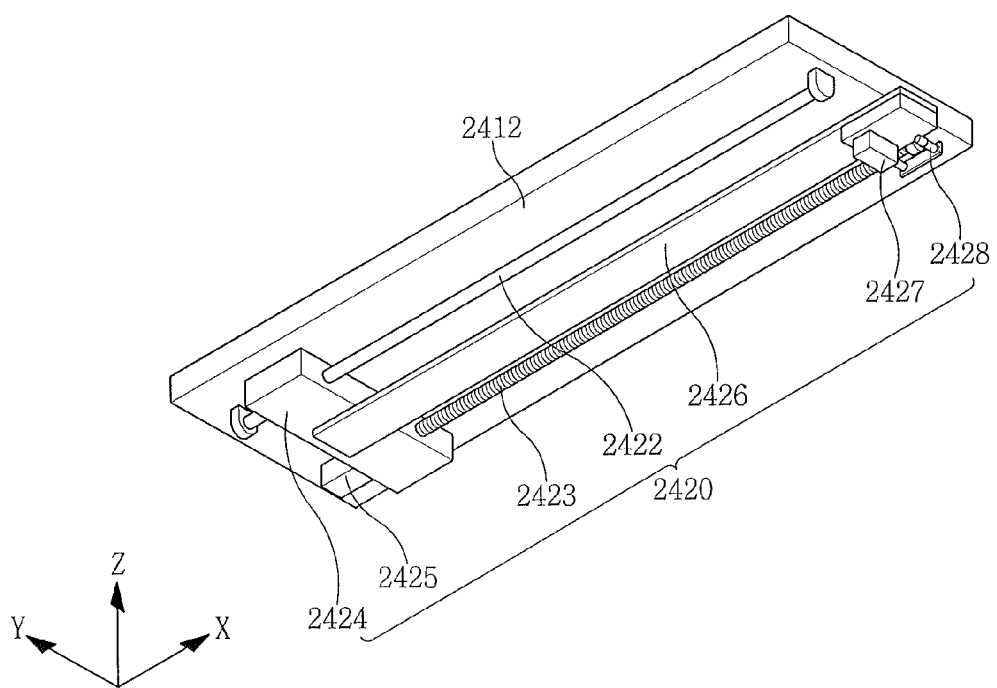
Figure 4G:
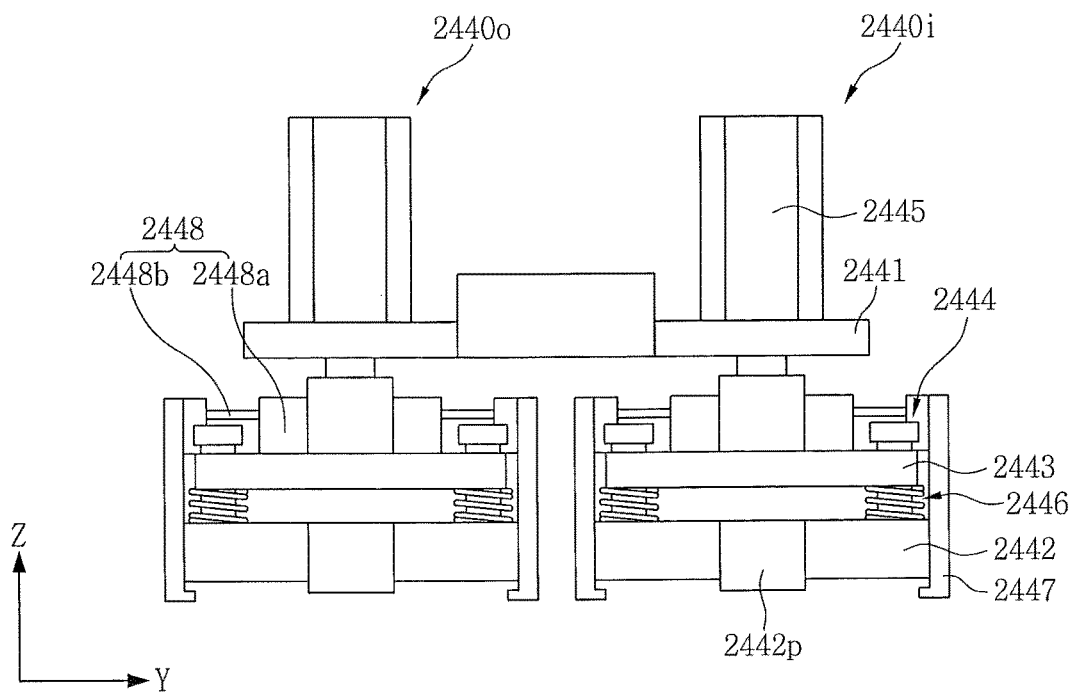
Figure 4H:
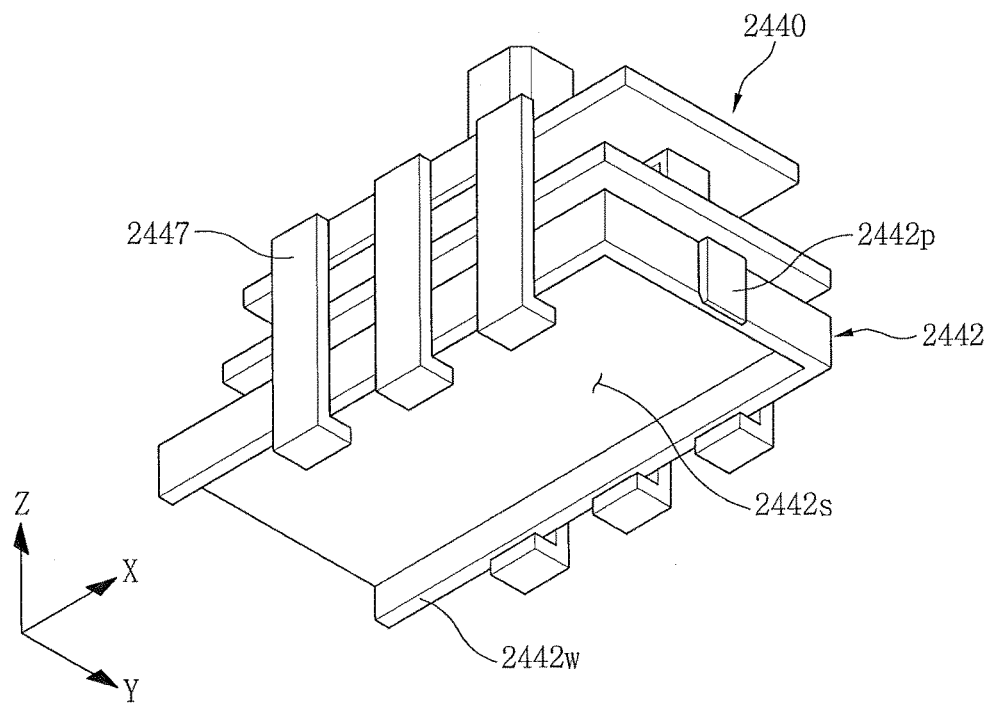
Figure 4I:
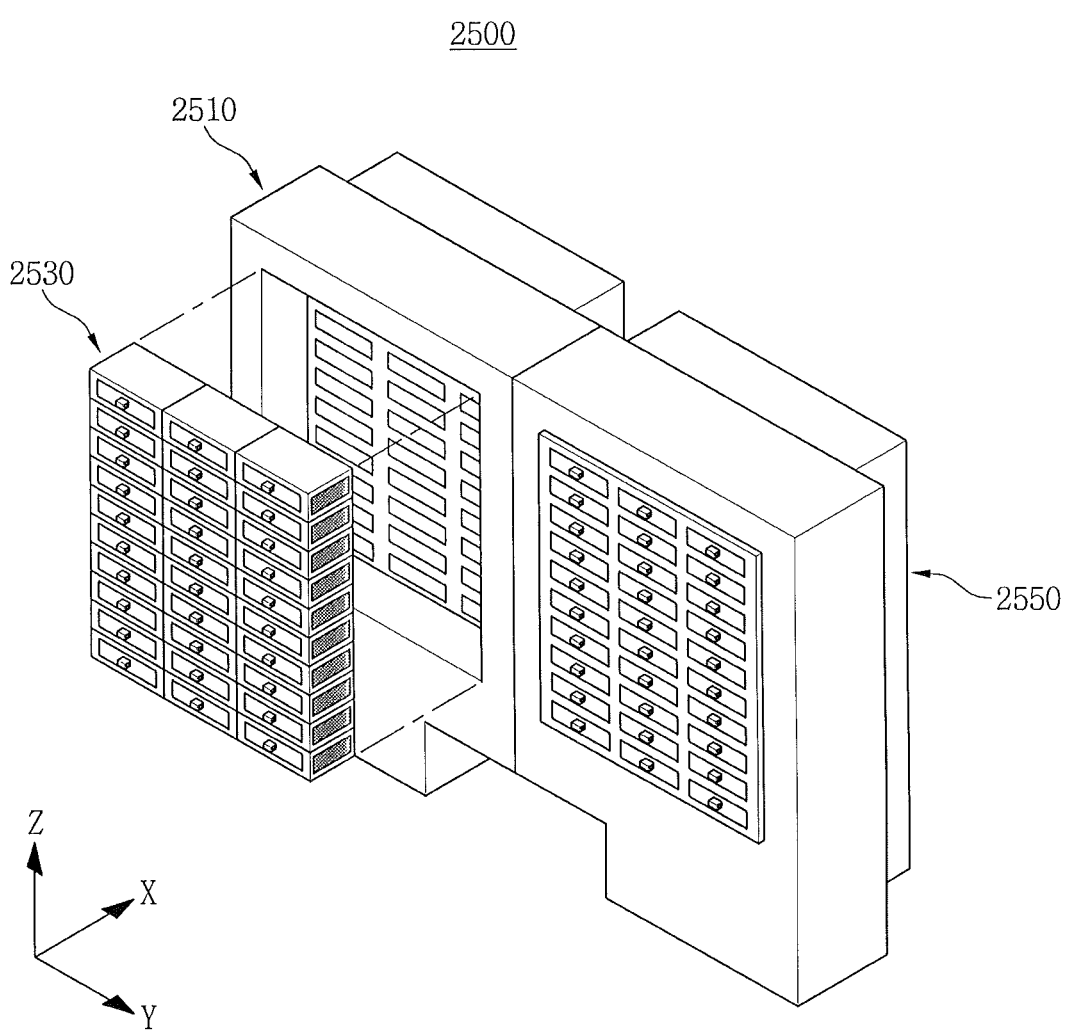
Figure 4J:
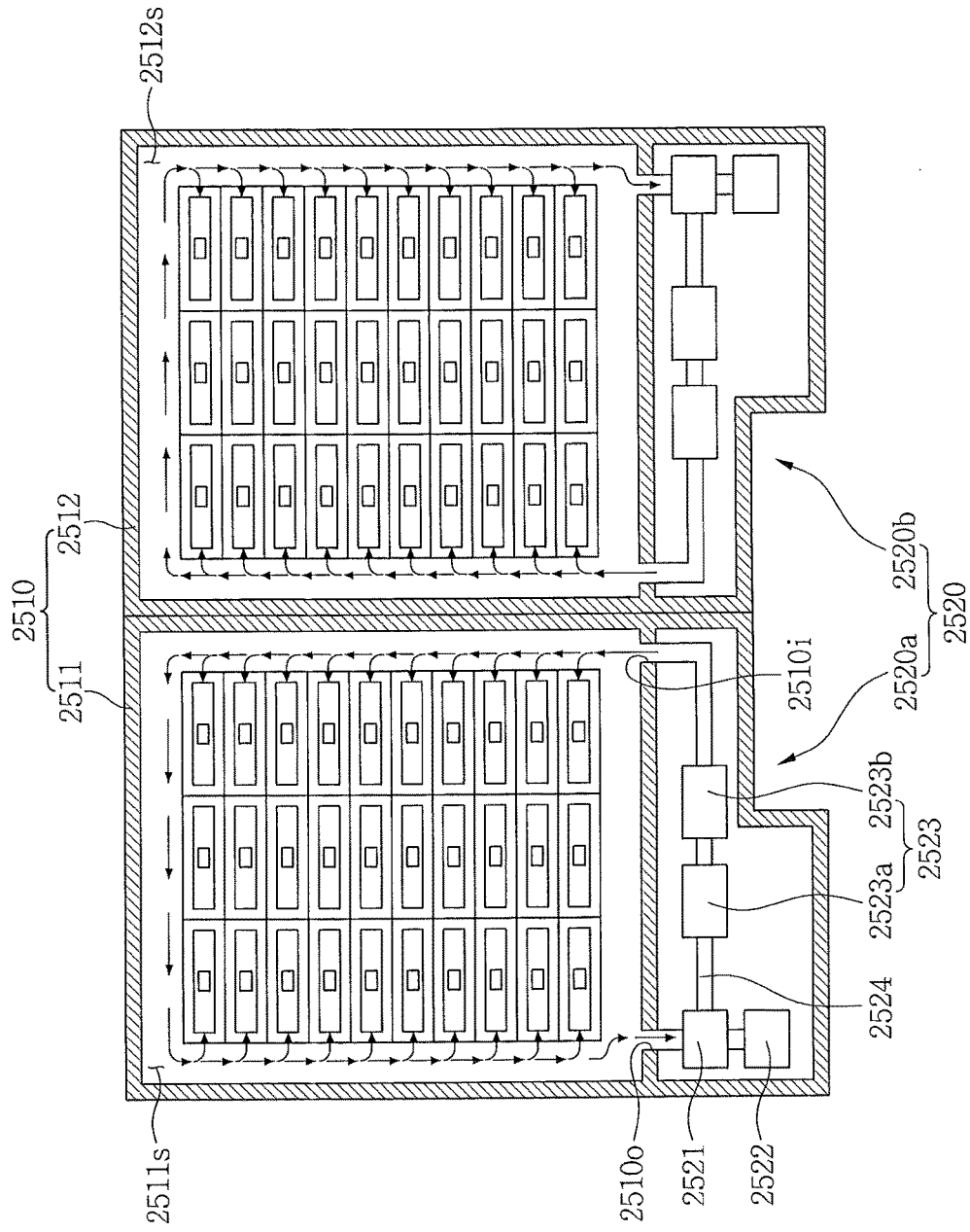
Figure 4K:
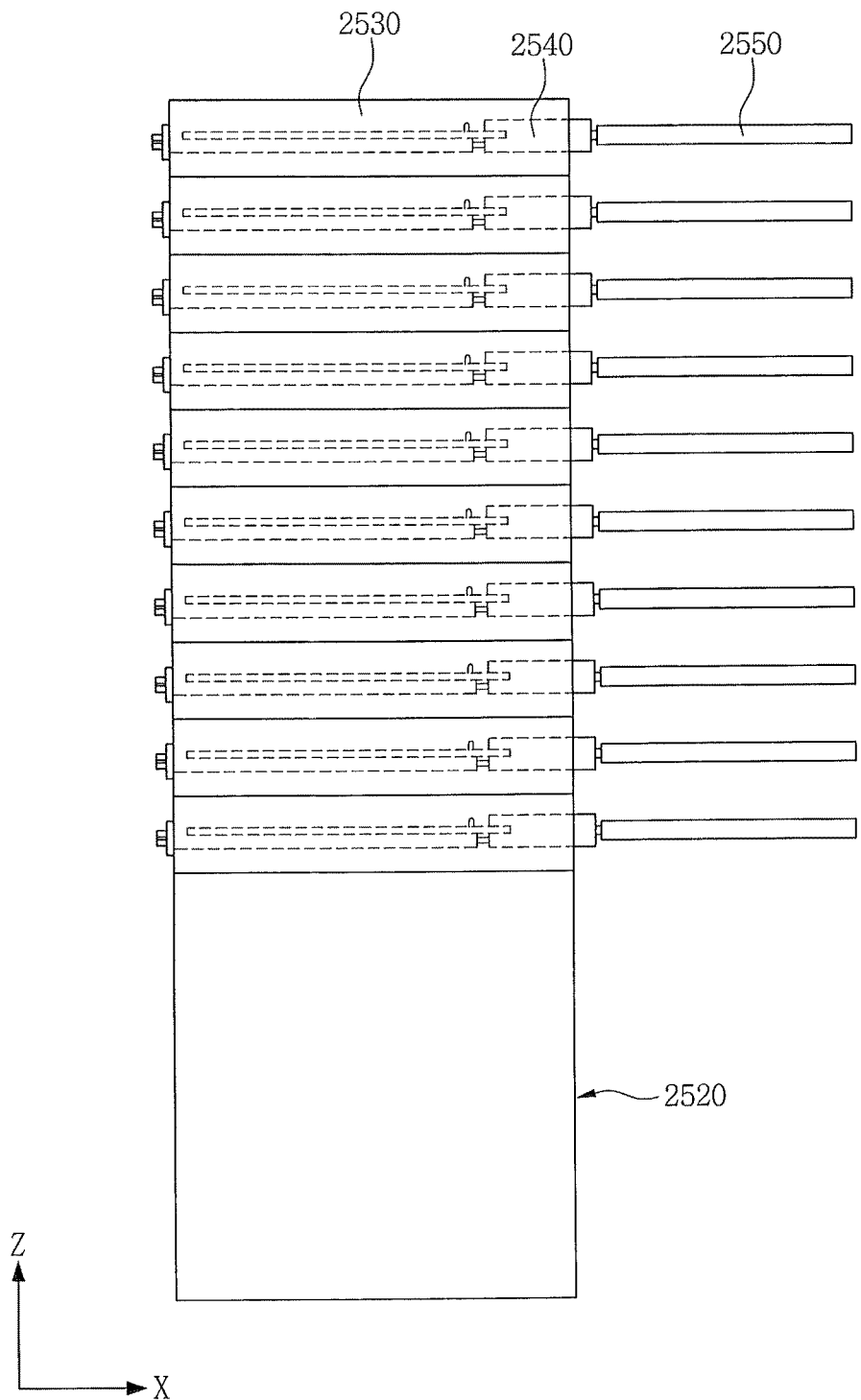
Figure 4L:
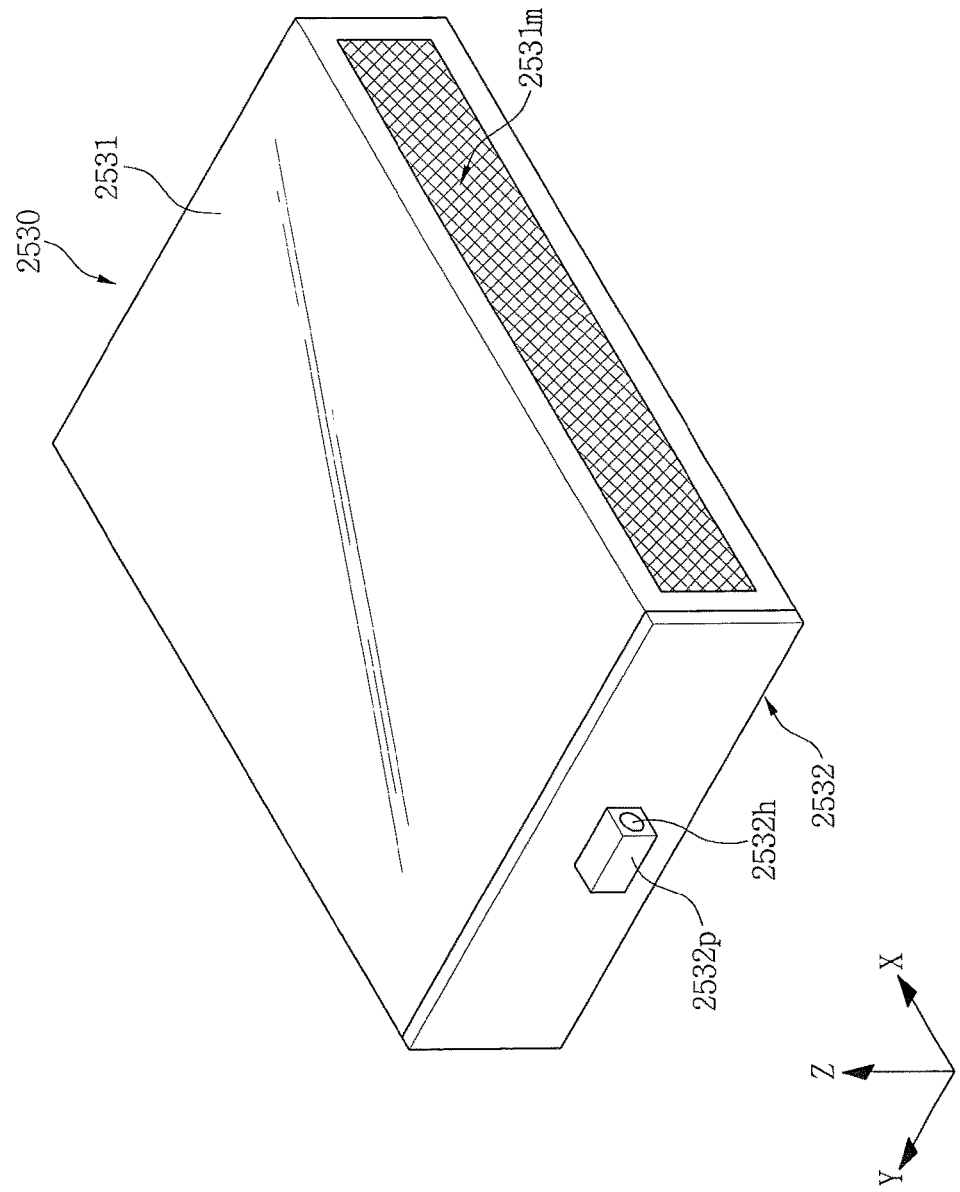
Figure 4M:
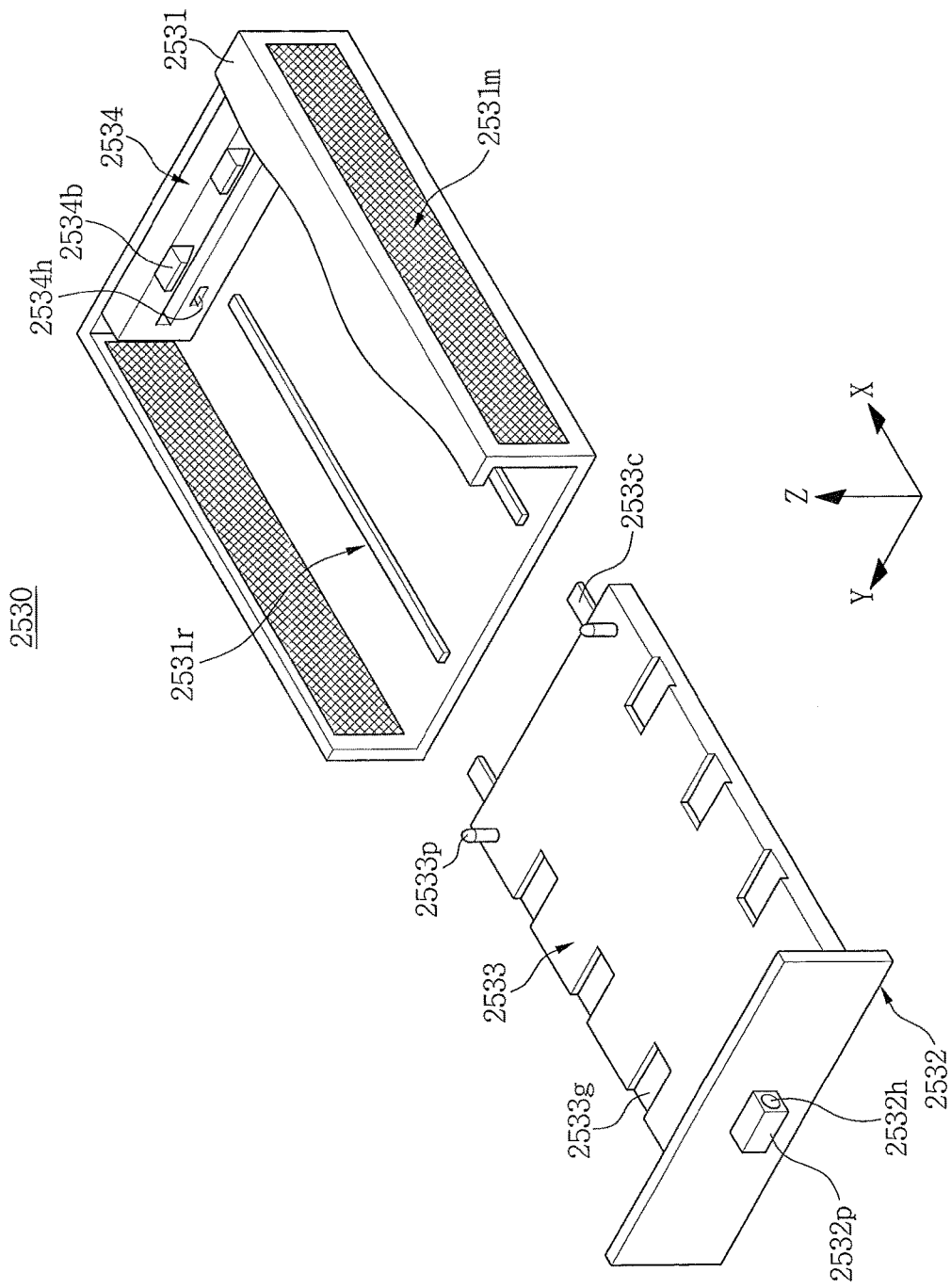
Figure 4N:
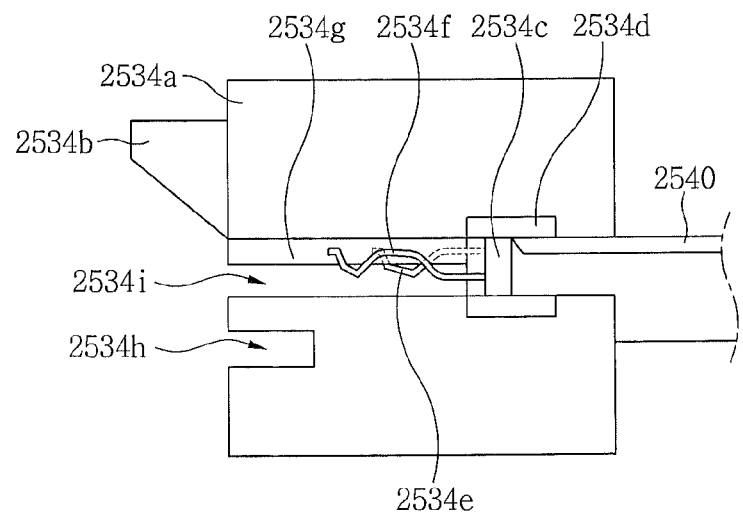
Figure 4O:
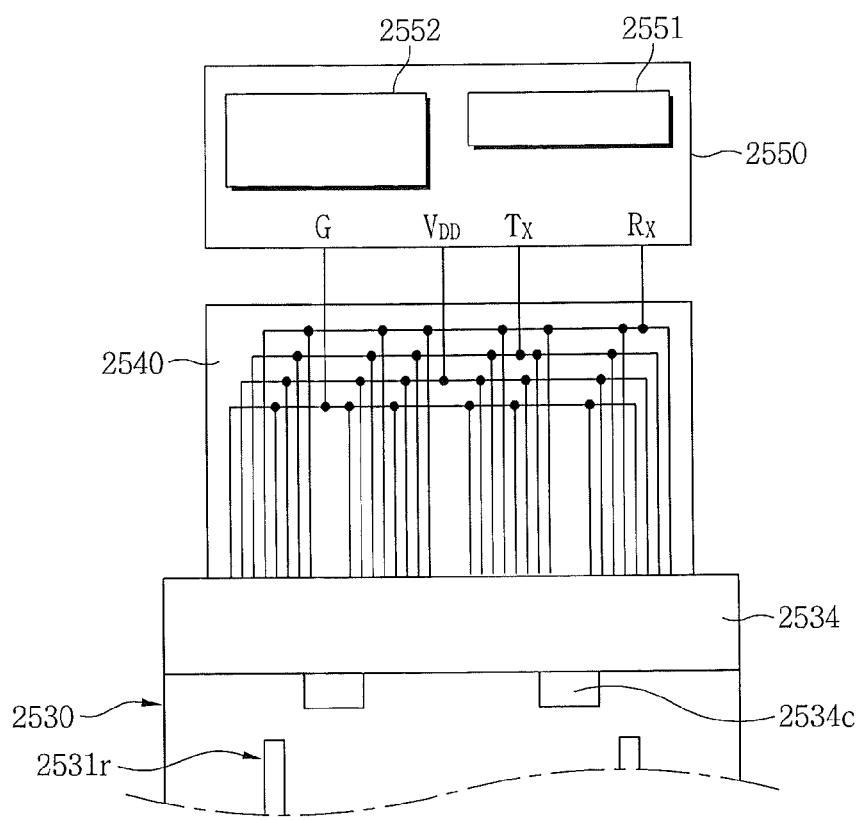

FIG. 4A is a perspective view of the test part 2000 of the main equipment 2 of the test equipment shown in FIG. 1. FIG. 4B is a plan view of a first test conveyor unit and a second test conveyor unit of the test equipment shown in FIG. 4A. FIG. 4C is a perspective view of a first test conveyor unit, a second test conveyor unit, a first lift unit, and a second lift unit of the test equipment shown in FIG. 4A. FIG. 4D is a perspective view of a PCB transfer unit of the test equipment shown in FIG. 4A. FIG. 4E is a side view of the PCB transfer unit of the test equipment shown in FIG. 4A. FIG. 4F is a bottom perspective view of a door opener of the test equipment shown in FIG. 4A. FIG. 4G is a front view of a holder element of the test equipment shown in FIG. 4A. FIG. 4H is a bottom perspective view of the holder element of the test equipment shown in FIG. 4A. FIG. 4I is a partial exploded perspective view of a main test chamber of the test equipment shown in FIG. 4A. FIG. 4J is a cross-sectional view of the main test chamber of the test equipment shown in FIG. 4I. FIG. 4K is a side view of the main test chamber of the test equipment shown in FIG. 4I. FIG. 4L is a perspective view of a drawer of the test equipment shown in FIG. 4A. FIG. 4M is an exploded perspective view of the drawer of the test equipment shown in FIG. 4A. FIG. 4N is a cross-sectional view of a socket of the test equipment shown in FIG. 4A. FIG. 4O is a schematic view of a socket, an interconnector, and a main tester of the test equipment shown in FIG. 4A.

Referring to FIGS. 1, 2A through 2E, and 4A through 4O, the test part 2000 of the test equipment for testing the semiconductor device according to the embodiments of the inventive concept may perform a main test of the undivided PCB 100 that has moved from the loading part 1000. For example, the main test may include performing an operation test of the unit PCBs 130 of the undivided PCB 100. The main test may include performing a performance test of the semiconductor device 131 mounted on each of the unit PCBs 130.

The test part 2000 may include a test controller 20, a first test conveyor unit 2110, a second test conveyor unit 2120, a main stopper 2200, a first lift unit 2310, a second lift unit 2320, a PCB transfer unit 2400, and a main test chamber 2500.

The test controller 20 may be electrically connected to one or more of the first test conveyor unit 2110, the second test conveyor unit 2120, the main stopper 2200, the first lift unit 2310, the second lift unit 2320, the PCB transfer unit 2400, and the main test chamber 2500. One or more of the first test conveyor unit 2110, the second test conveyor unit 2120, the main stopper 2200, the first lift unit 2310, the second lift unit 2320, the PCB transfer unit 2400, and the main test chamber 2500 may be controlled by the test controller 20.

The test controller 20 may be electrically connected to the loading controller 10. The loading controller 10 may confirm results of the main test via the test controller 20. The test controller 20 may not be directly connected to the cloud server 1. The main test chamber 2500 may not be directly connected to the cloud server 1.

The first test conveyor unit 2110 may move the undivided PCB 100 disposed in the test part 2000 to the main test chamber 2500. The first test conveyor unit 2110 may be disposed close to the loading part 1000. For example, the first test conveyor unit 2110 may be disposed in the first direction X along with the third loading conveyor unit 1130 of the loading part 1000. The undivided PCB 100 that has moved to the test part 2000 may be moved by the first test conveyor unit 2110 in the first direction X.

The first test conveyor unit 2110 may include a pair of test conveyor belts 2111, a pair of test conveyor rollers 2112, a conveyor driving element 2113, and a direction shift rollers 2114.

The pair of test conveyor belts 2111 may be in direct contact with the undivided PCB 100 that has moved into the test part 2000. The undivided PCB 100 disposed in the test part 2000 may be mounted on the pair of test conveyor belts 2111. The pair of test conveyor belts 2111 may extend in the first direction X. The pair of test conveyor belts 2111 may be spaced apart from each other in the second direction Y.

The pair of test conveyor rollers 2112 may support the pair of test conveyor belts 2111. The pair of test conveyor belts 2111 may surround the pair of test conveyor rollers 2112. The pair of test conveyor rollers 2112 may extend in the second direction Y. The pair of test conveyor rollers 2112 may be spaced apart from each other in the first direction X.

The test conveyor driving element 2113 may drive the pair of test conveyor belts 2111. The test conveyor driving element 2113 may rotate at least one of the pair of test conveyor rollers 2112. For example, the test conveyor driving element 2113 may rotate the test conveyor roller 2112 disposed close to the loading part 1000.

The test conveyor driving element 2113 may be electrically connected to the test controller 20. The test conveyor driving element 2113 may be controlled by the test controller 20. The test conveyor driving element 2113 may drive the pair of test conveyor belts 2111 under the control of the test controller 20. The undivided PCB 100 disposed in the test part 2000 may move in the first direction X under the control of the test controller 20.

The direction shift rollers 2114 may shift the direction of the pair of test conveyor belts 2111. The pair of test conveyor belts 2111 may repetitively move down and up in the third direction Z due to the direction shift rollers 2114. The direction shift rollers 2114 may form a first bent portion 2110a in the pair of test conveyor belts 2111. The first bent portion 2110a may be interposed between the loading part 1000 and the main test chamber 2500. The first bent portion 2110a may be disposed close to the main test chamber 2500.

The second test conveyor unit 2120 may move the undivided PCB 100 disposed in the test part 2000 to the unloading part 3000. The undivided PCB 100 that has been unloaded from the main test chamber 2500 may be moved by the second test conveyor unit 2120 to the unloading part 3000. The second test conveyor unit 2120 may be disposed close to the unloading part 3000.

The second test conveyor unit 2120 may be spaced apart from the first test conveyor unit 2110 in the second direction Y. A portion of the second test conveyor unit 2120 may be disposed parallel to a portion of the first test conveyor unit 2110. The second test conveyor unit 2120 may have the same or similar structure as the first test conveyor unit 2110. The second test conveyor unit 2120 may move the undivided PCB 100 disposed in the test part 2000 in the first direction X. The second test conveyor unit 2120 may include a second bent portion 2120a.

The second bent portion 2120a may be interposed between the loading part 1000 and the main test chamber 2500. The second bent portion 2120a may be disposed close to the main test chamber 2500. The second bent portion 2120a may be disposed parallel to the first bent portion 2110a. The second test conveyor unit 2120 may intersect the main test chamber 2500 (e.g., extend under the main test chamber 2500).

The main stopper 2200 may stop the undivided PCB 100 that is on the move due to the first test conveyor unit 2110.

The undivided PCB 100 disposed on the first test conveyor unit 2110 may be stopped by the main stopper 2200 on the first bent portion 2110a.

The main stopper 2200 may be disposed on the first test conveyor unit 2110. The main stopper 2200 may be interposed between the first bent portion 2110a and the main test chamber 2500.

The main stopper 2200 may be in direct contact with the undivided PCB 100 disposed on the first test conveyor unit 2110. The front surface 100F of the undivided PCB 100 disposed on the first test conveyor unit 2110 may be in direct contact with the main stopper 2200. The main stopper 2200 may extend in the second direction Y. The main stopper 2200 may have a predetermined length in the third direction Z. The main stopper 2200 may have a plate shape parallel to a plane surface formed by the second direction Y and the third direction Z.

The undivided PCB 100 that has been stopped by the main stopper 2200 may be moved by the first lift unit 2310 to the PCB transfer unit 2400. The undivided PCB 100 that has been stopped by the main stopper 2200 may be spaced apart or lifted from the first test conveyor unit 2110 by the first lift unit 2310. The undivided PCB 100 that has been stopped by the main stopper 2200 on the first bent portion 2110a may be moved by the first lift unit 2310 in the third direction Z.

The first lift unit 2310 may be disposed close to a side surface of the first test conveyor unit 2110. The first lift unit 2310 may be spaced apart from the first test conveyor unit 2110 in the second direction Y. The first test conveyor unit 2110 may be interposed between the second test conveyor unit 2120 and the first lift unit 2310. The first lift unit 2310 may be disposed close to the first bent portion 2110a of the first test conveyor unit 2110. The first lift unit 2310 may be disposed parallel to the first bent portion 2110a. The first lift unit 2310 may include a lift body 2311, a lift element 2312, a lift driving element 2313, a lift elevation axis or member 2314, and an elevation axis or member driving element 2315.

The lift body 2311 may support the lift element 2312. The lift body 2311 may have a rectangular parallelepiped shape. A length of the lift body 2311 measured in the second direction Y may be greater than a length of the lift body 2311 measured in the first direction X. The lift body 2311 may include a lift guide groove 2311g.

The lift guide groove 2311g may be disposed in a side surface of the lift body 2311. The lift guide groove 2311g may extend in the second direction Y.

The lift element 2312 may be combined with the lift guide groove 2311g. The lift element 2312 may move along the lift guide groove 2311g in the second direction Y. The lift element 2312 may include a lift 2312a and a lift support 2312b.

The lift 2312a may be in direct contact with the undivided PCB 100 stopped on the first bent portion 2110a. The lift 2312a may be in direct contact with the bottom surface of the undivided PCB 100 that has been stopped by the main stopper 2200. The lift 2312a may have the same or similar shape as the recovery gripper 1336. For example, the lift 2312a may have a fork shape.

The lift support 2312b may support the lift 2312a. The lift 2312a may protrude from the lift support 2312b toward the first bent portion 2110a. The lift support 2312b may be combined with the lift guide groove 2311g. The lift 2312a may move together with the lift support 2312b in the second direction Y.

The lift driving element 2313 may drive the lift element 2312. The lift element 2312 may be moved by the lift driving element 2313 in the second direction Y. The lift 2312a may be inserted by the lift driving element 2313 into the first bent portion 2110a.

The lift driving element 2313 may be disposed on the lift body 2311. For instance, the lift driving element 2313 may be disposed on a portion of the lift body 2311 that does not face the first bent portion 2110a.

The lift driving element 2313 may be electrically connected to the test controller 20. The lift driving element 2313 may be controlled by the test controller 20. The lift driving element 2313 may move the lift element 2312 in the second direction Y under the control of the test controller 20. The lift element 2312 may be inserted into the first bent portion 2110a under the control of the test controller 20.

The lift elevation axis 2314 may connect the lift body 2311 and the elevation axis driving element 2315. The lift elevation axis 2314 may extend in the third direction Z. For example, the lift elevation axis 2314 may have a cylindrical shape extending in the third direction Z.

The elevation axis driving element 2315 may drive the lift elevation axis 2314. The lift elevation axis 2314 may be moved by the elevation axis driving element 2315 in the third direction Z. The lift body 2311 may be moved by the elevation axis driving element 2315 in the third direction Z. The elevation axis driving element 2315 may be disposed below the lift body 2311.

The elevation axis driving element 2315 may be electrically connected to the test controller 20. The elevation axis driving element 2315 may be controlled by the test controller 20. The elevation axis driving element 2315 may move the lift body 2311 in the third direction Z under the control of the test controller 20. The lift element 2312 may space the undivided PCB 100, which has been stopped by the main stopper 2200, apart from the first test conveyor unit 2110 under the control of the test controller 20.

The second lift unit 2320 may move the undivided PCB 100, which has been moved by the PCB transfer unit 2400, onto the second test conveyor unit 2120. The undivided PCB 100, which has been moved by the PCB transfer unit 2400, may move onto the second bent portion 2120a of the second test conveyor unit 2120 due to the second lift unit 2320.

The second lift unit 2320 may move the undivided PCB 100, which has been moved by the PCB transfer unit 2400, onto the second test conveyor unit 2120. The undivided PCB 100, which has been moved by the PCB transfer unit 2400, may move onto the second bent portion 2120a due to the second lift unit 2320. The second lift unit 2320 may move the undivided PCB 100, which has been moved by the PCB transfer unit 2400, in the third direction Z.

The second lift unit 2320 may be disposed close to a side surface of the second test conveyor unit 2120. The second lift unit 2320 may be spaced apart from the second test conveyor unit 2120 in the second direction Y. The second test conveyor unit 2120 may be disposed between the first test conveyor unit 2110 and the second lift unit 2320. The second lift unit 2320 may be disposed close to the second bent portion 2120a of the second test conveyor unit 2120. The second lift unit 2320 may be disposed parallel with the second bent portion 2120a. The first lift unit 2310, the first bent portion 2110a, the second bent portion 2120a, and the second lift unit 2320 may be arranged in the second direction Y. The second lift unit 2320 may have the same structure as the first lift unit 2310.

The PCB transfer unit 2400 may insert the undivided PCB 100, which has been moved by the first lift unit 2310, into the main test chamber 2500. The PCB transfer unit 2400 may unload the undivided PCB 100, which has completed the main test, from the test chamber 2500. The PCB transfer unit 2400 may move the undivided PCB 100 disposed in the main test chamber 2500 to the second lift unit 2320. The PCB transfer unit 2400 may include a vertical transfer element 2410, a door opener 2420, a horizontal transfer element 2430, and a holder element 2440.

The vertical transfer element 2410 may move the door opener 2420, the horizontal transfer element 2430, and the holder element 2440 in the third direction Z. The vertical transfer element 2410 may include a vertical base plate 2411, a first horizontal support plate 2412, and a vertical driving element 2413.

The vertical base plate 2411 may be spaced apart from a side surface of the first test conveyor unit 2110. The vertical base plate 2411 may face the side surface of the first test conveyor unit 2110. The vertical base plate 2411 may extend in the third direction Z. The vertical base plate 2411 may have a plate shape parallel to a plane surface formed by the first direction X and the third direction Z. The vertical base plate 2411 may include a vertical guide groove 2411g. The vertical guide groove 2411g may extend in the third direction Z. The vertical base plate 2411 may have the same or similar structure as the recovery base plate of the loading part 1000.

The first horizontal support plate 2412 may be combined with the vertical guide groove 2411g. The first horizontal support plate 2412 may move along the vertical guide groove 2411g in the third direction Z. The first horizontal support plate 2412 may have a plate shape parallel to a plane surface formed by the first direction X and the second direction Y.

The vertical driving element 2413 may drive the first horizontal support plate 2412. The first horizontal support plate 2412 may be moved by the vertical driving element 2413 in the third direction Z.

The vertical driving element 2413 may be disposed on the vertical base plate 2411. The vertical driving element 2413 may be disposed at an upper end portion of the vertical base plate 2411. For example, the vertical driving element 2413 may include a motor.

The vertical driving element 2413 may be electrically connected to the test controller 20. The vertical driving element 2413 may be controlled by the test controller 20. The vertical driving element 2413 may move the first horizontal support plate 2412 in the third direction Z under the control of the test controller 20.

The door opener 2420 may be disposed under the first horizontal support plate 2412. The door opener 2420 may be combined with the first horizontal support plate 2412. The door opener 2420 may be fixed to a bottom surface of the first horizontal support plate 2412. The door opener 2420 may include a door guide rail 2422, a door moving rail 2423, a connection block 2424, a connection block driving element 2425, a clasp support plate 2426, a clasp driving element 2427, and a clasp element 2428.

The door guide rail 2422 may be fixed to the bottom surface of the first horizontal support plate 2412. The door guide rail 2422 may extend in the first direction X.

The door moving rail 2423 may be fixed to the bottom surface of the first horizontal support plate 2412. The door moving rail 2423 may be spaced apart from the door guide rail 2422. The door moving rail 2423 may extend in the first direction X. The door moving rail 2423 may be parallel to the door guide rail 2422.

The connection block 2424 may be combined with the door guide rail 2422 and the door moving rail 2423. The connection block 2424 may connect the door guide rail 2422 and the door moving rail 2423. The connection block 2424 may move in the first direction X along the door guide rail 2422 and the door moving rail 2423.

The connection block driving element 2425 may drive the connection block 2424. The connection block 2424 may be moved by the connection block driving element 2425 in the first direction X. The connection block driving element 2425 may be combined with the door moving rail 2423. The connection block driving element 2425 may rotate the door moving rail 2423 and move the connection block 2424 in the first direction X.

The connection block driving element 2425 may be electrically connected to the test controller 20. The connection block driving element 2425 may be controlled by the test controller 20. The connection block driving element 2425 may move the connection block 2424 in the first direction X under the control of the test controller 20.

The clasp support plate 2426 may be disposed under the connection block 2424. The clasp support plate 2426 may be fixed to a bottom surface of the connection block 2424. The clasp support plate 2426 may be in direct contact with the bottom surface of the connection block 2424. The clasp support plate 2426 may extend in the first direction X.

The clasp support plate 2426 may be interposed between the door guide rail 2422 and the door moving rail 2423. The clasp support plate 2426 may be spaced apart from the first horizontal support plate 2412. The clasp support plate 2426 may be parallel to the door guide rail 2422 and the door moving rail 2423. The clasp support plate 2426 may extend in the first direction X.

The clasp driving element 2427 may drive the clasp element 2428. The clasp driving element 2427 may move the clasp element 2428 in the second direction Y.

The clasp driving element 2427 may be disposed on a lower portion of the clasp support plate 2426. The clasp driving element 2427 may be fixed to a bottom surface of the clasp support plate 2426. The clasp driving element 2427 may be disposed close to the main test chamber 2500.

The clasp driving element 2427 may be electrically connected to the test controller 20. The clasp driving element 2427 may be controlled by the test controller 20. The clasp driving element 2427 may drive the clasp element 2428 under the control of the test controller 20. The clasp driving element 2427 may move the clasp element 2428 in the second direction Y under the control of the test controller 20.

The horizontal transfer element 2430 may move the holder element 2440 in the second direction Y. The horizontal transfer element 2430 may include a horizontal base plate 2431, a second horizontal support plate 2433, and a horizontal driving element 2434.

The horizontal base plate 2431 may be disposed on an upper portion of the first horizontal support plate 2412. The horizontal base plate 2431 may be combined with the first horizontal support plate 2412. The horizontal base plate 2431 may be fixed to the first horizontal support plate 2412. The horizontal base plate 2431 may extend in the second direction Y. The horizontal base plate 2431 may include a second horizontal guide rail 2432. The second horizontal guide rail 2432 may extend in the second direction Y.

The second horizontal support plate 2433 may be disposed on an upper portion of the horizontal base plate 2431. The second horizontal support plate 2433 may be combined with the second horizontal guide rail 2432. The second horizontal support plate 2433 may move along the second horizontal guide rail 2432 in the second direction Y.

The horizontal driving element 2434 may drive the second horizontal support plate 2433. The horizontal driving element 2434 may move the second horizontal support plate 2433 in the second direction Y.

The horizontal driving element 2434 may be disposed on the horizontal base plate 2431. The horizontal driving element 2434 may be disposed on an end portion of one side of the horizontal base plate 2431. The horizontal driving element 2434 may have the same or similar structure as the vertical driving element 2413. For example, the horizontal driving element 2434 may include a motor.

The horizontal driving element 2434 may be electrically connected to the test controller 20. The horizontal driving element 2434 may be controlled by the test controller 20. The horizontal driving element 2434 may move the second horizontal support plate 2433 in the second direction Y under the control of the test controller 20.

The holder element 2440 may fix the undivided PCB 100 that has been moved by the first lift unit 2310. The undivided PCB 100 disposed on the first lift unit 2310 may be brought into close contact with the holder element 2440. The holder element 2440 may move the undivided PCB 100, which has been unloaded from the main test chamber 2500, to the second lift unit 2320. The holder element 2440 may include a load holder element 2440*i* and an unload holder element 2440*o*.

The load holder element 2440*i* may be brought into close contact with the undivided PCB 100 disposed on the first lift unit 2310. The load holder element 2440*i* may include a fixing plate 2441, a pickup head 2442, a head support plate 2443, a fixing pin 2444, a head driving element 2445, an elastic element 2446, a clamp 2447, and a clamp driving unit 2448.

The fixing plate 2441 may be fixed to the horizontal transfer element 2430. The fixing plate 2441 may be combined with a side surface of the second horizontal support plate 2433. The fixing plate 2441 may have a plate shape parallel to a plane surface formed by the first direction X and the second direction Y.

The pickup head 2442 may be in contact with the undivided PCB 100 disposed on the first lift unit 2310. A top surface of the pickup head 2442 may be parallel to the fixing plate 2441.

The pickup head 2442 may include a sidewall 2442*w*. The sidewall 2442*w* may protrude from a bottom surface of the pickup head 2442 along the third direction Z. A bottom surface of the sidewall 2442*w* may be in direct contact with the undivided PCB 100 disposed on the first lift unit 2310. The semiconductor devices 131 of the undivided PCB 100 may be inserted into a space 2442*s* surrounded with the sidewall 2442*w*.

The pickup head 2442 may further include a PCB stopper 2442*p*. The PCB stopper 2442*p* may prevent the undivided PCB 100, which is in contact with the pickup head 2442, from moving in the first direction X.

The PCB stopper 2442*p* may be disposed on a front surface of the pickup head 2442. A length of the PCB stopper 2442*p*, which is measured in the third direction Z, may be greater than a length of the sidewall 2442*w*, which is measured in the third direction Z. The PCB stopper 2442*p* may protrude downward a greater distance than the sidewall 2442*w*. The front surface 100F of the undivided PCB 100 in contact with the pickup head 2442 may be in contact with the PCB stopper 2442*p*. A lower portion of the PCB stopper 2442*p* may be thinner away from the sidewall 2442*w* of the pickup head 2442.

The head support plate 2443 may be interposed between the fixing plate 2441 and the pickup head 2442. The head support plate 2443 may be parallel to the fixing plate 2441. The head support plate 2443 may be spaced apart from the pickup head 2442.

The fixing pin 2444 may combine the pickup head 2442 with the head support plate 2443. The pickup head 2442 may be fixed to the head support plate 2443 by the fixing pin 2444. The fixing pin 2444 may penetrate the head support plate 2443. A lower portion of the fixing pin 2444 may be combined with the pickup head 2442.

The head driving element 2445 may move the head support plate 2443. The head driving element 2445 may move the head support plate 2443 in the third direction Z. The pickup head 2442 may move along with the head support plate 2443. The pickup head 2442 may be moved by the head driving element 2445 in the third direction Z.

The head driving element 2445 may be combined with the head support plate 2443. The head driving element 2445 may be disposed on the fixing plate 2441. The head driving element 2445 may be fixed to the fixing plate 2441. The head driving element 2445 may penetrate the fixing plate 2441.

The head driving element 2445 may be electrically connected to the test controller 20. The head driving element 2445 may be controlled by the test controller 20. The pickup head 2442 may be moved in the third direction Z under the control of the test controller 20.

The elastic element 2446 may maintain a distance between the pickup head 2442 and the head support plate 2443. The elastic element 2446 may be interposed between the pickup head 2442 and the head support plate 2443. The fixing pin 2444 may penetrate the elastic element 2446. The elastic element 2446 may surround the fixing pin 2444. For instance, the elastic element 2446 may be a spring.

The clamp 2447 may fix the undivided PCB 100 disposed on the first lift unit 2310 to the pickup head 2442. The clamp 2447 may be in contact with a bottom surface of the undivided PCB 100 in contact with the pickup head 2442. For example, the clamp 2447 may have an L shape extending along an outer surface of the holder element 2440.

The clamp driving unit 2448 may move the clamp 2447 in the second direction Y. The clamp driving unit 2448 may move the clamp 2447 from a standby position to a moving position. The moving position of the clamp 2447 may be a position where the clamp 2447 is in direct contact with the sidewall 2442w of the pickup head 2442. The standby position of the clamp 2447 may be a position where the clamp 2447 is spaced apart from the sidewall 2447w of the pickup head 2442.

The standby position of the clamp 2447 may be located along the second direction Y from the moving position of the clamp 2447. The clamp driving unit 2448 may move the clamp 2447 in the second direction Y.

The clamp driving unit 2448 may be disposed on the head support plate 2443. The clamp driving unit 2448 may include a clamp driving element 2448a and a clamp driving axis or member 2448b.

The clamp driving element 2448a may drive the clamp 2447. The clamp driving axis 2448b may connect the clamp 2447 and the clamp driving element 2448a. The clamp driving element 2448a may drive the clamp 2447 about or along the clamp driving axis 2448b. The clamp driving element 2448a may be disposed close to the head driving element 2445. The clamp driving axis 2448b may extend in the second direction Y.

The clamp driving element 2448a may be electrically connected to the test controller 20. The clamp driving element 2448a may be controlled by the test controller 20. The clamp 2447 may be moved by the test controller 20 in the second direction Y.

The unload holder element 2440o may be brought into close contact with the undivided PCB 100 unloaded from the main test chamber 2500. The unload holder element 2440o may have the same structure as the load holder element 2440i.

The main test chamber 2500 may perform the main test of the undivided PCB 100 that has been transferred by the PCB transfer unit 2400. The main test chamber 2500 may include a main test housing 2510, a temperature control unit 2520, drawers 2530, interconnectors 2540, and main testers 2550.

The main test housing 2510 may provide a space in which the drawers 2530 will be disposed. The main test housing 2510 may control the ambient temperature of the drawers 2530. The main test housing 2510 may include a first body 2511 and a second body 2512.

The first body 2511 may be disposed along with the first test conveyor unit 2110 in the first direction X. The first body 2511 may be disposed on the first test conveyor unit 2110. The first body 2511 may run across and over the first test conveyor unit 2110.

The first body 2511 may include an air inlet port 2510i and an air outlet port 2510o. The air inlet port 2510i and the air outlet port 2510o may be disposed in the same surface of the first body 2511. For instance, the air inlet port 2510i and the air outlet port 2510o may be disposed in a bottom surface of the first body 2511.

The first body 2511 may surround the drawers 2530. The drawers 2530 may be spaced apart from the first body 2511. An air circulation path 2511s may be formed between the first body 2511 and the drawers 2530. The air circulation path 2511s may be connected to (e.g., in fluid communication with) the air inlet port 2510i and the air outlet port 2510o.

The second body 2512 may be disposed along with the second test conveyor unit 2120 in the first direction X. The second body 2512 may be disposed on the second test conveyor unit 2120. The second body 2512 may run across and over the second test conveyor unit 2120. The second body 2512 may be disposed parallel with the first body 2511. The second body 2512 may be in direct contact with the first body 2511.

The second body 2512 may surround the drawers 2530. The second body 2512 may have the same or similar structure as the first body 2511. For example, an air inlet port 2510i and an air outlet port 2510o may be disposed in a bottom surface of the second body 2512. An air circulation path 2511s may be formed between the second body 2512 and the drawers 2530 and connected to the air inlet port 2510i and the air outlet port 2510o.

The temperature control unit 2520 may control an inner temperature of the main test housing 2510. The air inside the main test housing 2510 may be maintained at a constant or substantially constant temperature by the temperature control unit 2520. The temperature control unit 2520 may circulate the inner air of the main test housing 2510. The temperature control unit 2520 may flow heated or cooled air into the main test housing 2510.

The temperature control unit 2520 may be disposed under the main test housing 2510. The temperature control unit 2520 may include a first temperature control unit 2520a and a second temperature control unit 2520b.

The first temperature control unit 2520a may be disposed under the first body 2511. The first temperature control unit 2520a may run across and over the first test conveyor unit 2110. The first temperature control unit 2520*a* may be disposed between the first test conveyor unit 2110 and the first body 2511.

The first temperature control unit 2520*a* may include a ventilator 2521, a ventilator driving element 2522, a temperature control element 2523, and pipes 2524. The pipes 2524 may connect the ventilator 2521, the ventilator driving element 2522, and the temperature control element 2523. The pipes 2524 may connect the ventilator 2521 with the air outlet port 2510*o*. The pipes 2524 may connect the temperature control element 2523 with the air inlet port 2520*i*.

The ventilator 2521 may suck the inner air out of the first body 2511. The inner air of the first body 2511 may be exhausted by the ventilator 2521 through the air outlet port 2510*o*.

The ventilator driving element 2522 may drive the ventilator 2521. The ventilator 2521 may forcibly exhaust the inner air of the first body 2511 using the ventilator driving element 2522. For example, the ventilator driving element 2522 may include a motor.

The ventilator driving element 2522 may be electrically connected to the test controller 20. The ventilator driving element 2522 may be controlled by the test controller 20. The inner air of the first body 2511 may be forcibly exhausted under the control of the test controller 20.

The temperature control element 2523 may heat or cool the air that has been forcibly exhausted by the ventilator 2521. The temperature control element 2523 may flow the heated or cooled air through the air inlet port 2510*i* into the first body 2511. The temperature control element 2523 may include a heater 2523*a* and a cooler 2523*b*.

The second temperature control unit 2520*b* may be disposed under the second body 2512. The second temperature control unit 2520*b* may run over and across the second test conveyor unit 2120. The second temperature control unit 2520*b* may be disposed between the second test conveyor unit 2120 and the second body 2512.

The second temperature control unit 2520*b* may be disposed parallel with the first temperature control unit 2520*a*. The second temperature control unit 2520*b* may be in contact with the first temperature control unit 2520*a*.

The second temperature control unit 2520*b* may have the same or similar structure as the first temperature control unit 2520*a*. For instance, the second temperature control unit 2520*b* may include a ventilator 2521, a ventilator driving element 2522, a temperature control element 2523, and pipes 2524.

The drawers 2530 may provide a space where the main test will be performed on the undivided PCB 100 that has been transferred by the PCB transfer unit 2400. The undivided PCB 100 that has been transferred by the PCB transfer unit 2400 may be mounted in one of the drawers 2530. The undivided PCB 100 that has been transferred by the PCB transfer unit 2400 may be fixed to the inside of the corresponding drawer 2530 during the main test.

The drawers 2530 may be stacked in the second direction Y and the third direction Z. The drawers 2530 may be disposed on a plane surface formed by the second direction Y and the third direction Z. For example, the drawers 2530 may be disposed in a 3×16 shape on each of the first body 2511 and the second body 2512. Each of the drawers 2530 may include a drawer body 2531, a door or door element 2532, a drawer support plate 2533, and a socket element 2534.

The drawer body 2531 may surround the undivided PCB 100 disposed in the corresponding drawer 2530. The drawer body 2531 may have an open surface toward the PCB transfer unit 2400. The drawer body 2531 may include a ventilation portion or hole(s) 2531*m* and a drawer guide rail 2531*r*.

The ventilation hole(s) 2531*m* may exchange the inner air of the main test housing 2510 with the inner air of the drawer body 2531. The inner air of the main test housing 2510 may flow through the ventilation hole(s) 2531*m* into the drawer body 2531. An inner temperature of the drawer body 2531 may be the same or substantially the same as an inner temperature of the main test housing 2510 due to the ventilation hole(s) 2531*m*. The ventilation hole(s) 2531*m* may be disposed in a lateral side or surface of the drawer body 2531. Ventilation holes 2531*m* of two adjacent drawers 2531 may face each other.

The drawer guide rail 2531*r* may be disposed on a bottom surface of the drawer body 2531. The drawer guide rail 2531*r* may extend in the first direction X.

The door element 2532 may cover the open surface of the drawer body 2531. The drawer body 2531 may be opened by the door element 2532. The door element 2532 may include a door protrusion 2532*p*.

The door protrusion 2532*p* may protrude from the door element 2532 toward the PCB transfer unit 2400. The door protrusion 2532*p* may face the door opener 2420. The door protrusion 2532*p* may include a door aperture, channel or hole 2532*h*.

The door hole 2532*h* may penetrate the door protrusion 2532*p* in the second direction Y. The clasp driving element 2427 of the door opener 2420 may be inserted into the door hole 2532*h*. The door element 2532 may be inserted into the door hole 2532*h* by the clasp driving element 2427. The door element 2532 may move under the control of the test controller 20.

The drawer support plate 2533 may support the undivided PCB 100 disposed in the corresponding drawer 2530. The drawer support plate 2533 may be in direct contact with the undivided PCB 100 that has been moved by the PCB transfer unit 2400. The undivided PCB 100 disposed in the corresponding drawer 2530 may be fixed to the drawer support plate 2533.

The drawer support plate 2533 may be disposed close to the bottom surface of the drawer body 2531. The drawer support plate 2533 may be parallel to the bottom surface of the drawer body 2531. The drawer support plate 2533 may be combined with the drawer guide rail 2531*r* of the drawer body 2531. The drawer support plate 2533 may move along the drawer guide rail 2531*r* in the first direction X.

The drawer support plate 2533 may be combined with the door element 2532. The drawer support plate 2533 may be fixed to the door element 2532. For example, the drawer support plate 2533 may be fixed to a lower end of the door element 2532.

The drawer support plate 2533 may be moved by the door element 2532. For instance, the drawer support plate 2533 may be moved by the door opener 2420 along with the door element 2532. The drawer support plate 2533 may include a substrate fixing pin 2533*p*, a socket coupling pin 2533*c*, and a clamp groove 2533*g*.

The substrate fixing pin 2533*p* may be combined with the undivided PCB 100 disposed in the corresponding drawer 2530. The substrate fixing pin 2533*p* may be inserted into or received by the fixing hole 120 of the undivided PCB 100 disposed in the corresponding drawer 2530. The substrate fixing pin 2533*p* may be disposed close to the main testers 2550.

The socket coupling pin 2533*c* may be combined with the socket element 2534. The drawer support plate 2533 may be fixed to the socket element 2534 by the socket coupling pin 2533c. The socket coupling pin 2533c may protrude from the drawer support plate 2533 toward the socket element 2534.

While the undivided PCB 100 disposed in the corresponding drawer 2530 is in contact with the drawer support plate 2533, the clamp groove 2553g may allow the clamp 2447 to be spaced apart from the undivided PCB 100. The clamp groove 2553g may hinder or prevent the undivided PCB 100 fixed to the drawer support plate 2533 from being damaged due to the clamp 2447. When the undivided PCB 100, which has been transferred by the PCB transfer unit 2400, is mounted on the drawer support plate 2533, the clamp 2447 may be inserted into the clamp groove 2553g.

The socket element 2534 may electrically connect the undivided PCB 100 disposed in the corresponding drawer 2530 with the corresponding interconnector 2540. The undivided PCB 100 disposed in the corresponding drawer 2530 may be electrically connected to the corresponding interconnector 2540 by the socket element 2534. The undivided PCB 100 disposed in the corresponding drawer 2530 may be combined with the socket element 2534 during the main test.

The socket element 2534 may be disposed close to the front surface 100F of the undivided PCB 100 disposed in the corresponding drawer 2530. The socket element 2534 may be disposed on a surface facing the open surface or opening of the drawer 2530. When the door element 2532 is in contact with the open surface or opening of the drawer body 2531, the pad portion 110 of the undivided PCB 100 disposed in the corresponding drawer 2530 may be inserted into the socket element 2534.

The socket element 2534 may include a socket body 2534a, PCB guide blocks 2534b, a socket terminal block 2534c, socket terminals 2534d, first slide pins 2534e, second slide pins 2534f, and a socket spacer 2534g.

The socket body 2534a may include a drawer coupling groove 2534h and a PCB insertion hole or slot 2534i. The drawer coupling groove 2534h and the PCB insertion hole 2534i may be disposed in a surface of the socket body 2534a, which faces the door element 2532. The socket coupling pin 2533c of the drawer support plate 2533 may be inserted into the drawer coupling groove 2534h due to the motion of the drawer support plate 2533. The pad portion 110 of the undivided PCB 100 disposed in the corresponding drawer 2530 may be inserted into the PCB insertion hole 2534i due to the motion of the drawer support plate 2533.

The PCB guide blocks 2534b may guide the pad portion 110 of the undivided PCB 100 disposed in the corresponding drawer 2530 into the PCB insertion hole 2534i. The pad portion 110 of the undivided PCB 100 may be precisely inserted by the PCB guide blocks 2534b into the PCB insertion hole 2534i.

The PCB guide blocks 2534b may be disposed on the socket body 2534a. The PCB guide blocks 2534b may be disposed over the PCB connection hole 2534i of the socket body 2534a. A bottom surface of each of the PCB guide blocks 2534b may be inclined or sloped toward the PCB connection hole 2534i. The PCB guide blocks 2534b may be spaced apart from one another.

The socket terminals 2534c may be electrically connected to the corresponding interconnector 2540. The socket terminals 2534c may be disposed within the PCB insertion hole 2534i. The socket terminals 2534c may be in direct contact with the corresponding interconnector 2540.

The socket terminal block 2534d may fix the socket terminals 2534c. Each of the socket terminals 2534c may be combined with the socket terminal block 2534d. The socket terminals 2534c may be surrounded with the socket terminal block 2534d. The socket terminal block 2534d may be disposed in the socket body 2534a.

The first slide pins 2534e and the second slide pins 2534f may electrically connect each of the test terminals 111 of the undivided PCB 100 with the corresponding socket terminal 2534c.

Each of the first slide pins 2534e and the second slide pins 2534f may be fixed to the corresponding socket terminal 2534c. The first slide pins 2534e and the second slide pins 2534f may extend from the corresponding socket terminal 2534c into the PCB insertion hole 2534i.

The second slide pins 2534f may be spaced apart from the first slide pins 2534e. The first slide pins 2534e and the second slide pins 2534f may be electrically connected to respective different test terminals 111. The test terminals 111 electrically connected to the second slide pins 2534f may be disposed in a different column from the test terminals 111 electrically connected to the first slide pins 2534e. For example, the first slide pins 2534e may be electrically connected to the test terminals 111 disposed close to the front surface 100F of the undivided PCB 100. The second slide pins 2534f may be electrically connected to the test terminals 111 disposed close to the unit PCBs 130. The first slide pins 2534e may have a smaller length than the second slide pins 2534f.

The socket spacer 2534g may insulate the socket terminals 2534d from one another. The socket spacer 2534g may extend along the PCB insertion hole 2534i. The socket spacer 2534g may be disposed between the first slide pins 2534e and the second slide pins 2534f. The first slide pins 2534e and the second slide pins 2534f may be insulated from each other by the socket spacer 2534g.

Each of the interconnectors 2540 may be electrically connected to one of the drawers 2530. Each of the interconnectors 2540 may electrically connect the socket element 2534 of the corresponding drawer 2530 with the corresponding main tester 2550. For instance, each of the interconnectors 2540 may divide a line connected to a ground G, a power supply Vdd, a transmitter T, and a receiver R of the corresponding main tester 2550, and connect the divided line with each socket terminal 2534c of the corresponding socket element 2534. The interconnectors 2540 may be disposed in the main test housing 2510.

Each of the main testers 2550 may perform a main test of the undivided PCB 100 electrically connected through the corresponding interconnector 2540. Each of the main testers 2550 may be disposed along with the corresponding interconnector 2540 in the first direction X. For example, the main testers 2550 may be parallel to one another. The main testers 2550 may be spaced apart from each other. Each of the main testers 2550 may include a main test controller 2551 and a main test interface 2552.

The main test controller 2551 may control the main test of the undivided PCB 100 through the corresponding interconnector 2540. The main test controller 2551 may be electrically connected to the test controller 20. The main test controller 2551 may start the main test under the control of the test controller 20. The test controller 20 may ascertain whether or not the corresponding main tester 2550 is being used, through the main test controller 2551. The main test controller 2551 may transmit a state of electrical connection of the corresponding main tester 2550 with the undivided PCB 100.

The main test interface 2552 may be directly connected to the cloud server 1. The main test interface 2552 may electrically connect the corresponding main tester 2550 with the cloud server 1. The main test controller 2551 may request data from the cloud server 1 via the main test interface 2552. The cloud server 1 may directly transmit data to the corresponding main tester 2550 via the main test interface 2552.

Figure 5:
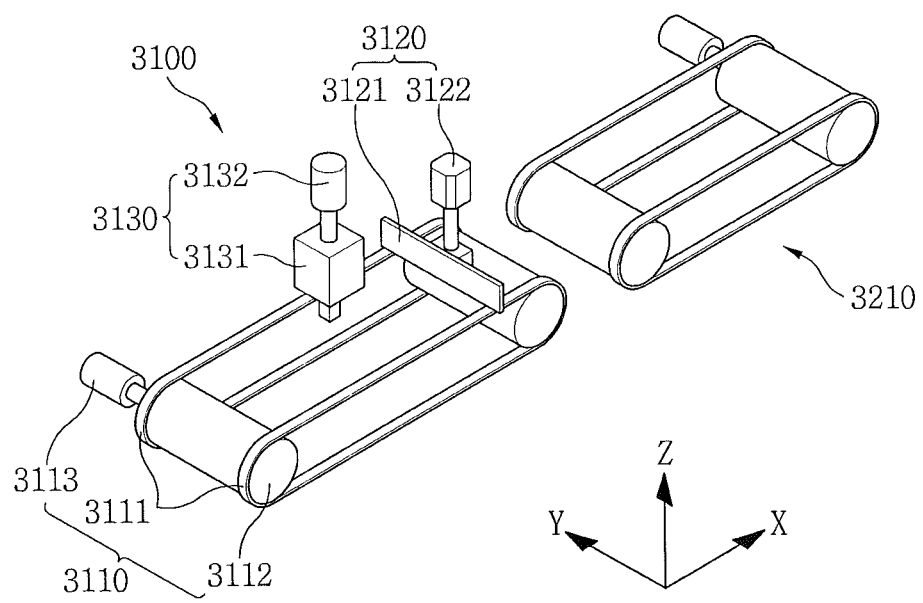
FIG. 5 is a perspective view of an unloading part of the main equipment of the test equipment shown in FIG. 1.

FIG. 5 is a perspective view of the unloading part 3000 of the main equipment 2 of the test equipment shown in FIG. 1.

Referring to FIGS. 1, 2A through 2E, and 5, the unloading part 3000 of the test equipment of the semiconductor device according to the embodiments of the inventive concept may unload the undivided PCB 100 that has been transferred from the test part 2000. The unloading part 3000 may unload the undivided PCB 100, which has completed the main test. The unloading part 3000 may record results of the main test of the undivided PCB 100. The unloading part 3000 may classify the undivided PCB 100 based on the results of the main test. The unloading part 3000 may include an unloading controller 30, a marking unit 3100, and an unloading conveyor unit 3210.

The unloading controller 30 may be electrically connected to the marking unit 3100 and the unloading conveyor unit 3210. The marking unit 3100 and the unloading conveyor unit 3210 may be controlled by the unloading controller 30.

The unloading controller 30 may be electrically connected to the loading controller 10. The loading controller 10 may transmit results of the main test to the unloading controller 30. The unloading controller 30 may not be directly connected to the cloud server 1. The marking unit 3100 may not be directly connected to the cloud server 1.

The marking unit 3100 may record the results of the main test of the undivided PCB 100 that has been transferred from the test part 2000. A mark in which the results of the main test are stored may be formed on the undivided PCB 100 disposed in the unloading part by the marking unit 3100. The marking unit 3100 may include a marking conveyor unit 3110, a marking stopper unit 3120, and a marking element 3130.

The marking conveyor unit 3110 may convey the undivided PCB 100 that has been transferred from the test part 2000. The marking conveyor unit 3110 may be disposed close to the test part 2000. For example, the marking conveyor unit 3110 may be disposed along with the second test conveyor unit of the test part 2000 in the first direction X. The marking conveyor unit 3110 may include a pair of marking conveyor belts 3111, a pair of marking conveyor rollers 3112, and a marking conveyor driving element 3113.

The pair of marking conveyor belts 3111 may be in direct contact with the undivided PCB 100 that has been transferred into the unloading part 3000. The undivided PCB 100 disposed in the unloading part 3000 may be mounted on the marking conveyor belt 3111. The pair of marking conveyor belts 3111 may extend in the first direction X. The pair of marking conveyor belts 3111 may be spaced apart from one another in the second direction Y.

The pair of marking conveyor roller 3112 may support the pair of marking conveyor belts 3111. The pair of marking conveyor belts 3111 may surround the pair of marking conveyor roller 3112. The pair of marking conveyor rollers 3112 may extend in the second direction Y. The pair of marking conveyor rollers 3112 may be spaced apart from one another in the first direction X.

The marking conveyor driving element 3113 may drive the pair of marking conveyor belts 3111. The marking conveyor driving element 3113 may rotate at least one of the pair of marking conveyor rollers 3112. For instance, the marking conveyor driving element 3113 may rotate the marking conveyor roller 3112 disposed close to the test part 2000.

The marking conveyor driving element 3113 may be electrically connected to the unloading controller 30. The marking conveyor driving element 3113 may be controlled by the unloading controller 30. The marking conveyor driving element 3113 may drive the pair of marking conveyor belts 3111 under the control of the unloading controller 30. The undivided PCB 100 disposed in the unloading part 3000 may move in the first direction X under the control of the unloading controller 30.

The marking stopper unit 3120 may stop the undivided PCB 100 disposed in the unloading part 3000 during the recording of the results of the main test. The undivided PCB 100, which is on the move due to the marking conveyor unit 3110, may be stopped by the marking stopper unit 3120.

The marking stopper unit 3120 may be disposed on the marking conveyor unit 3110. The marking stopper unit 3120 may be disposed close to the marking conveyor roller 3112 disposed away from the test part 2000. The marking stopper unit 3120 may include a marking stopper 3121 and a marking stopper driving element 3122.

The marking stopper 3121 may be in direct contact with the undivided PCB 100 disposed on the marking conveyor unit 3110. The front surface 100F of the undivided PCB 100 disposed on the marking conveyor unit 3110 may be in direct contact with the marking stopper 3121. The marking stopper 3121 may extend in the second direction Y. The marking stopper 3121 may have a predetermined length in the third direction Z. The marking stopper 3121 may have a plate shape parallel to a plane surface formed by the second direction Y and the third direction Z.

The marking stopper driving element 3122 may drive the marking stopper 3121. The marking stopper driving element 3122 may move the marking stopper 3121 from an interrupting or stopping position to a standby position. The interrupting position of the marking stopper 3121 may be a position for stopping the undivided PCB 100 that is on the move due to the marking conveyor unit 3110. The standby position of the marking stopper 3121 may be a position that does not interrupt the movement of the undivided PCB 100 due to the marking conveyor unit 3110.

The standby position of the marking stopper 3121 may be above the interrupting position of the marking stopper 3121. The marking stopper 3121 may be moved by the marking stopper driving element 3122 in the third direction Z.

The marking stopper driving element 3122 may be electrically connected to the unloading controller 30. The marking stopper driving element 3122 may be controlled by the unloading controller 30. The marking stopper driving element 3122 may drive the marking stopper 3121 under the control of the unloading controller 30. The marking stopper 3121 may move in the third direction Z under the control of the unloading controller 30. The marking stopper driving element 3122 may include a hydraulic cylinder.

The marking element 3130 may record results of the main test of the undivided PCB 100 that has been stopped by the marking stopper unit 3120. A mark in which the results of the main test are stored may be printed by the marking element 3130 on the undivided PCB 100 disposed in the unloading part 3000. The marking element 3130 may include a marker 3131 and a marker driving element 3132.

The marker 3131 may print the mark on the undivided PCB 100 that has been stopped by the marking stopper unit 3120. The mark may include a 2D bar code. For instance, the marker 3131 may include a 2D bar code printing unit.

The marker driving element 3132 may drive the marker 3131. The marker 3131 may be moved by the marker driving element 3132 in the third direction Z.

The marker driving element 3132 may be electrically connected to the unloading controller 30. The marker driving element 3132 may be controlled by the unloading controller 30. The marker 3131 may be moved by the unloading controller 30 in the third direction Z. The marker 3131 may print the mark in which the results of the main test are stored, on the undivided PCB 100 that has been stopped by the marking stopper 3120 under the control of the unloading controller 30.

Figure 6A:
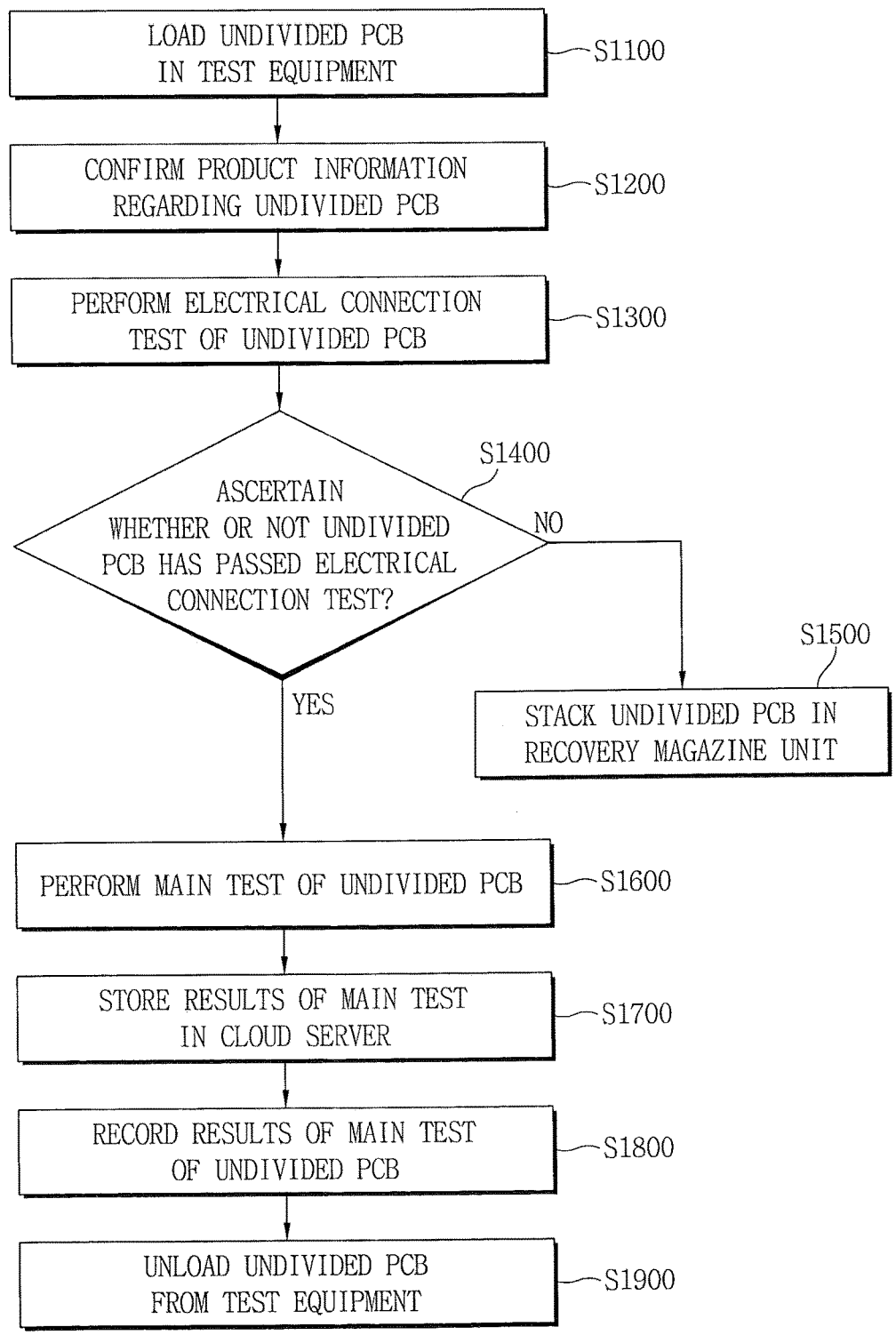
FIGS. 6A and 6B are flowcharts illustrating a method of testing a semiconductor device according to embodiments of the inventive concept.
Figure 6B:
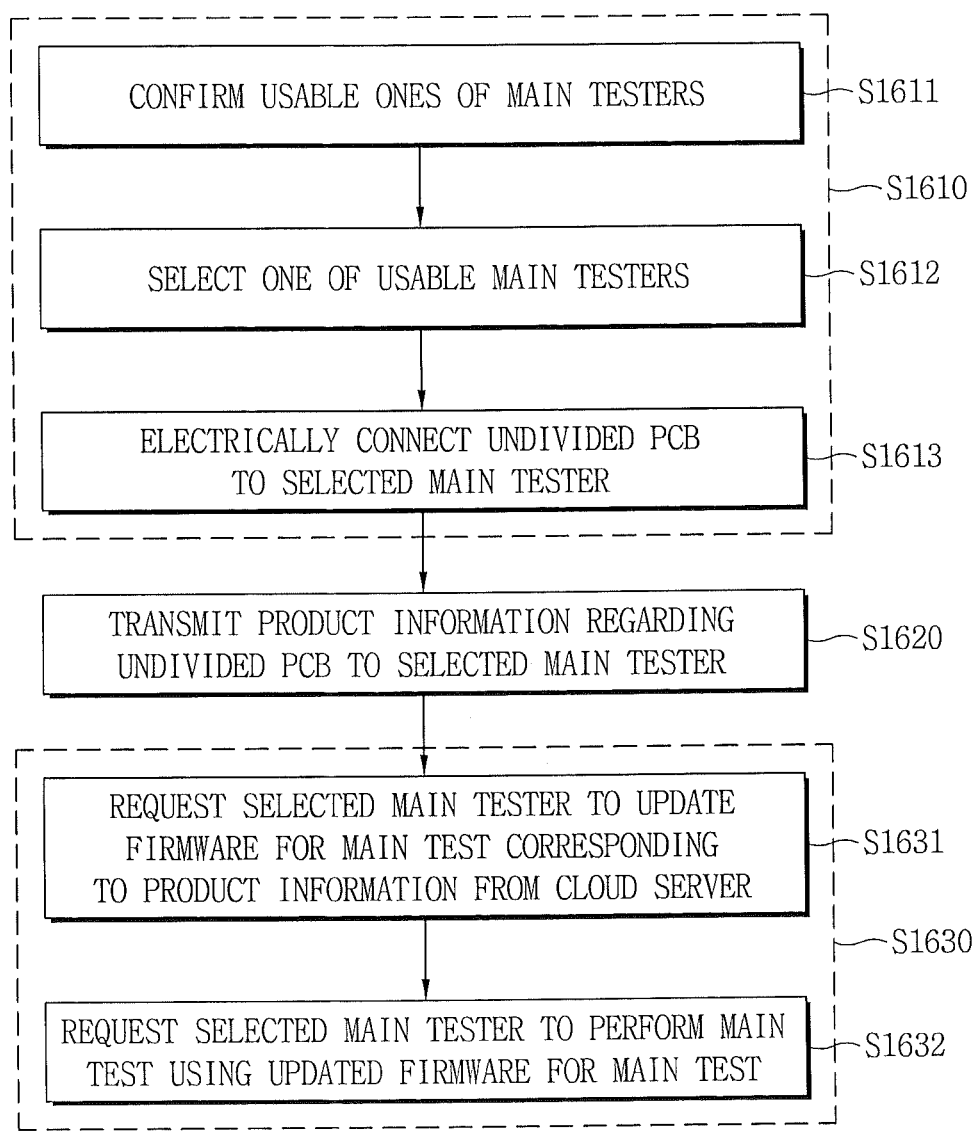

FIGS. 6A and 6B are flowcharts illustrating a method of testing a semiconductor device using test equipment according to embodiments of the inventive concept.

A method of testing a semiconductor device according to embodiments of the inventive concept will now be described with reference to FIGS. 1 through 5, 6A, and 6B. First, the method of testing the semiconductor device according to embodiments of the inventive concept may include a step of loading the undivided PCB 100 into the test equipment according to the embodiments of the inventive concept (operation S1100).

The step of loading the undivided PCB 100 into the test equipment (operation S1100) may include a step of loading the undivided PCB 100 into the loading part 1000 of the main equipment 2 of the test equipment. The step of loading the undivided PCB 100 into the loading part 1000 of the main equipment 2 may include a step of mounting the undivided PCB 100 on the first loading conveyor unit 1110 of the loading part 1000.

The method of testing the semiconductor device according to embodiments of the inventive concept may include a step of confirming product information of the undivided PCB 100 disposed on the first loading conveyor unit 1110 (operation S1200).

The step of confirming the product information of the undivided PCB 100 disposed on the first loading conveyor unit 1110 (operation S1200) may include a step of moving the undivided PCB 100 under the code recognition unit 1500 of the loading part 1000 and a step of confirming the code 140 of the undivided PCB 100 using the code recognition unit 1500. The step of moving the undivided PCB 100 under the code recognition unit 1500 of the loading part 100 may include a step of driving the first loading conveyor unit 1110.

The method of testing the semiconductor device according to embodiments of the inventive concept may include a step of performing an electrical connection test of the undivided PCB 100 whose product information is confirmed (operation S1300).

The step of performing the electrical connection test of the undivided PCB 100 whose product information has been confirmed (operation S1300) may include a step of inserting the undivided PCB 100 whose product information has been confirmed into the electrical connection test chamber 1200 of the loading part 1000 by driving the first loading conveyor unit 1110, a step of moving the undivided PCB 100 under the electrical connection test unit 1240 of the electrical connection test chamber 1200 by driving the electrical connection conveyor unit 1220 of the electrical connection test chamber 1200, a step of electrically connecting the undivided PCB 100 with an electrical connection tester 1241 of the electrical connection test unit 1240, and a step of performing the electrical connection test of the undivided PCB 100 using the electrical connection tester 1241.

The step of inserting the undivided PCB 100 whose product information has been confirmed into the electrical connection test chamber 1200 may include a step of moving the undivided PCB 100 whose product information has been confirmed onto the electrical connection conveyor unit 1220 by driving the first loading conveyor unit 1110.

The step of moving the undivided PCB 100 under the electrical connection test unit 1240 by driving the electrical connection conveyor unit 1220 may include a step of stopping the undivided PCB 100 under the electrical connection test unit 1240 using the electrical connection stopper unit 1230 of the electrical connection test chamber 1200.

The step of stopping the undivided PCB 100 under the electrical connection test unit 1240 using the electrical connection stopper unit 1230 may include a step of moving the electrical connection stopper 1231 of the electrical connection stopper unit 1230 to an interrupting position of the electrical connection stopper 1231.

The step of performing the electrical connection test of the undivided PCB 100 using the electrical connection tester 1241 may include a step of updating firmware for an electrical connection test corresponding to the product information from the cloud server 1, a step of transmitting the updated firmware for the electrical connection test to the electrical connection tester 1241, a step of electrically connecting the electrical connection tester 1241 with the pad portion 110 of the undivided PCB 100 that has been stopped by the electrical connection stopper unit 1230, and a step of requesting the electrical connection tester 1241 to perform the electrical connection test using the updated firmware for the electrical connection test.

The method of testing the semiconductor device according to the embodiments of the inventive concept may include a step of ascertaining whether or not the undivided PCB 100, which has completed the electrical connection test, has passed the electrical connection test (operation S1400).

The step of ascertaining whether or not the undivided PCB 100, which has completed the electrical connection test, has passed the electrical connection test (operation S1400) may include a step of confirming results of the electrical connection test performed of the undivided PCB 100.

The step of confirming the results of the electrical connection test performed of the undivided PCB 100 may include a step of receiving an end signal of the electrical connection test from the electrical connection tester 1241, a step of requesting the results of the electrical connection test from the electrical connection tester 1241, and a step of receiving the results of the electrical connection test from the electrical connection tester 1241.

The method of testing the semiconductor device according to the embodiments of the inventive concept may include a step stacking the undivided PCB 100 on the recovery magazine unit 1400 of the loading part 1000 when the undivided PCB 100 has not passed the electrical connection test (operation S1500).

The step of stacking the undivided PCB 100 on the recovery magazine unit 1400 of the loading part 1000 (operation S1500) may include a step of moving the undivided PCB 100 to the recovery magazine unit 1400 using the recovery unit 1300 of the loading part 1000.

The method of testing the semiconductor device according to embodiments of the inventive concept may include a step of performing a main test of the undivided PCB 100 when the undivided PCB 100 has passed the electrical connection test (operation S1600).

The step of performing the main test of the undivided PCB 100 may include a step of electrically connecting the undivided PCB 100 with one of the main testers 2550 of the test part 2000 (operation S1610), a step of transmitting the product information of the undivided PCB 100 to the main tester 2550 electrically connected to the undivided PCB 100 (operation S1620), and a step of requesting the main tester 2550 to which the product information is transmitted to perform the main test of the undivided PCB 100 (operation S1630).

The step of electrical connecting the undivided PCB 100 with one of the main testers 2550 (operation S1610) may include a step of confirming usable ones from among the main testers 2550 (operation S1611), a step of selecting one of the usable main testers 2550 (operation S1612), and a step of electrically connecting the undivided PCB 100 with the selected main tester 2550 (operation S1613).

The step of confirming the usable ones from among the main testers 2550 (operation S1611) may include a step of requesting the test controller 20 of the test part 2000 to confirm the usable main testers 2550, and a step of receiving the usable main testers 2550 from the test controller 20.

The step of requesting of the test controller 20 to confirm the usable main testers 2550 may include a step of requesting the test controller 20 to confirm operation states of the main testers 2550. The step of requesting the test controller 20 to confirm the operation states of the main testers 2550 may include a step of requesting the test controller 20 to confirm main testers 2550, which are not electrically connected to an undivided PCB 100, among the main testers 2550.

The step of electrically connecting of the undivided PCB 100 with the selected main tester 2550 (operation S1613) may include a step of moving the undivided PCB 100, which has passed the electrical connection test, to the test part 2000, a step of transmitting the selected main tester 2550 to the test controller 20, and a step of requesting the test controller 20 to electrically connect the undivided PCB 100 with the selected main tester 2550.

The step of moving the undivided PCB 100 to the test part 2000 may include a step of mounting the undivided PCB 100 on the first test conveyor unit 2110 on the test part 2000.

The step of transmitting the selected main tester 2550 to the test controller 20 may be performed simultaneously with the step of moving the undivided PCB 100 to the test part 2000.

The step of requesting the test controller 20 to electrically connect the undivided PCB 100 with the selected main tester 2550 may include a step of requesting the test controller 20 to fix the undivided PCB 100 to the inside of the drawer 2530 associated with or electrically connected to the selected main tester 2550, and a step of requesting the test controller 20 to electrically connect the socket element 2534 of the corresponding drawer 2530 with the undivided PCB 100.

The step of requesting the test controller 20 to fix the undivided PCB 100 to the inside of the drawer 2530 electrically connected to the selected main tester 2550 may include a step of requesting the test controller 20 to stop the undivided PCB 100 on the first bent portion 2110*a* of the first test conveyor unit 2110, a step of requesting the test controller 20 to fix the undivided PCB 100 to the load holder element 2440*i* of the PCB transfer unit 2400, a step of requesting the test controller 20 to insert the clasp element 2428 of the door opener 2420 of the PCB transfer unit 2400 into the door hole 2532*h* of the corresponding drawer 2530, a step of requesting the test controller 20 to open the corresponding drawer 2530 due to the drive of the door opener 2420, and a step of requesting the test controller 20 to fix the undivided PCB 100 to the drawer support plate 2533 of the corresponding drawer 2530 due to the drive of (e.g., with) the PCB transfer unit 2400.

The step of requesting the test controller 20 to electrically connect the undivided PCB 100 with the socket element 2534 of the corresponding drawer 2530 may include a step of requesting the test controller 20 to move the corresponding drawer support plate 2533 due to the drive of (e.g., with) the door opener 2420.

The step of transmitting the product information of the undivided PCB 100 to the main tester 2550 electrically connected to the undivided PCB 100 (operation S1620) may include a step of requesting the test controller 20 to confirm electrical connection between the undivided PCB 100 and the corresponding main tester 2550.

The step of requesting the main tester 2550 to which the product information is transmitted to perform the main test of the undivided PCB 100 (operation S1630) may include a step of requesting the selected main tester 2550 to update firmware for a main test corresponding to the product information from the cloud server 1 (operation S1631), and a step of requesting the selected main tester 2550 to perform the main test using the updated firmware (operation S1632).

The step of requesting the selected main tester 2550 to update the firmware for the main test corresponding to the product information from the cloud server 1 (operation S1631) may include a step of requesting the main test controller 2551 of the selected main tester 2550 to update firmware for a main test corresponding to the product information from the cloud server 1 via the main test interface 2552 of the selected main tester 2550.

The step of requesting the selected main tester 2550 to perform the main test using the updated firmware (operation S1632) may include a step of requesting the main test controller 2551 of the selected main tester 2550 to perform the main test using the updated firmware.

In the method of testing the semiconductor device according to embodiments of the inventive concept, each of the main testers 2550 may update firmware for a main test corresponding to product information of an undivided PCB electrically connected to the corresponding main tester 2550 from the cloud server 1. Thus, in the method of testing the semiconductor device according to embodiments of the inventive concept, main tests may be performed by the corresponding main testers on undivided PCBs having different product information. Accordingly, in the method of testing the semiconductor device according to embodiments of the inventive concept, the main tests may be efficiently performed on the undivided PCBs.

The method of testing the semiconductor device according to embodiments of the inventive concept may include a step of storing the results of the main test in the cloud server 1 (operation S1700).

The step of storing the results of the main test in the cloud server 1 (operation S1700) may include a step of requesting the selected main tester 2550 to store the results of the main tester in the cloud server 1.

The method of testing the semiconductor device according to embodiments of the inventive concept may include a step of recording the results of the main test in the undivided PCB 100 on which the main test has completely been performed by the corresponding main tester (operation S1800).

The step of recording the results of the main tester in the undivided PCB 100 (operation S1800) may include a step of receiving an end signal of the main test from the main test controller 2551, a step of requesting the results of the main test from the corresponding main test controller 2551, a step of receiving the results of the main test from the corresponding main test controller 2551, a step of requesting the test controller 20 to move the undivided PCB 100 to the unloading part 3000, a step of transmitting the results of the main test to the unloading controller 30 of the unloading part 3000, and a step of requesting the unloading controller 30 to record the results of the main test in the undivided PCB 100.

The step of requesting the unloading controller 30 to record the results of the main test in the undivided PCB 100 may include a step of requesting the unloading controller 30 to print a mark in which the results of the main test are stored on the undivided PCB 100 using the mark marking unit 3100 of the unloading part 3000.

The method of testing the semiconductor device according to embodiments of the inventive concept may include a step of unloading the undivided PCB 100 in which the results of the main test are recorded from the test equipment according to the embodiments of the inventive concept (operation S1900).

Figure 7:
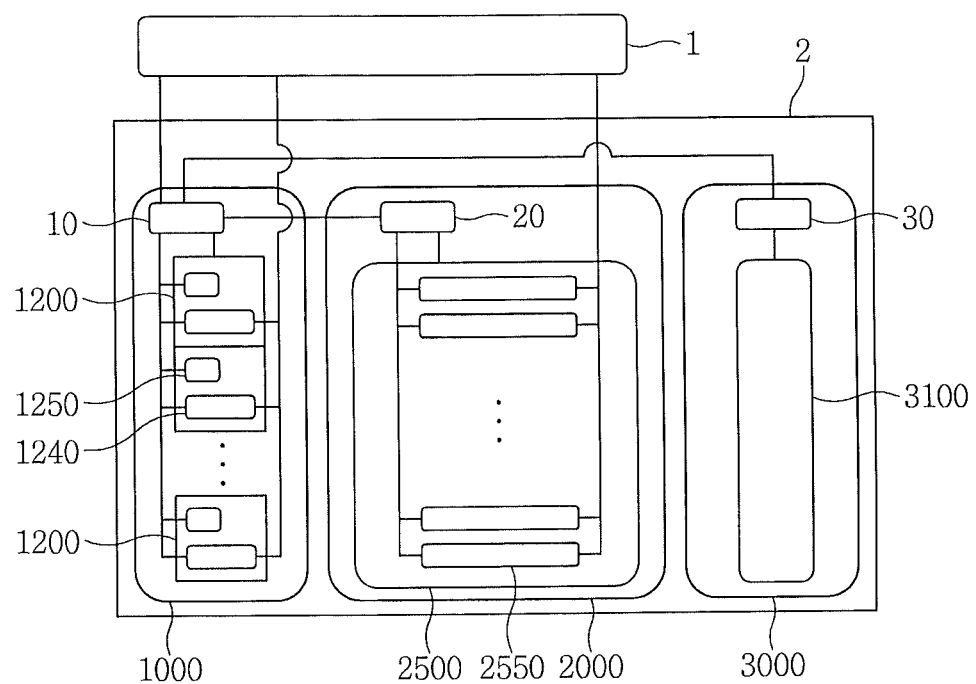
FIG. 7 is a block diagram of a test equipment for testing a semiconductor device according to other embodiments of the inventive concept.

FIG. 7 is a block diagram of test equipment for testing a semiconductor device according to embodiments of the inventive concept.

Referring to FIG. 7, the test equipment for testing the semiconductor device according to the embodiments of the inventive concept may include a cloud server 1 and a main equipment 2. The main equipment 2 may include a loading part 1000, a test part 2000, and an unloading part 3000.

Figure 8A:
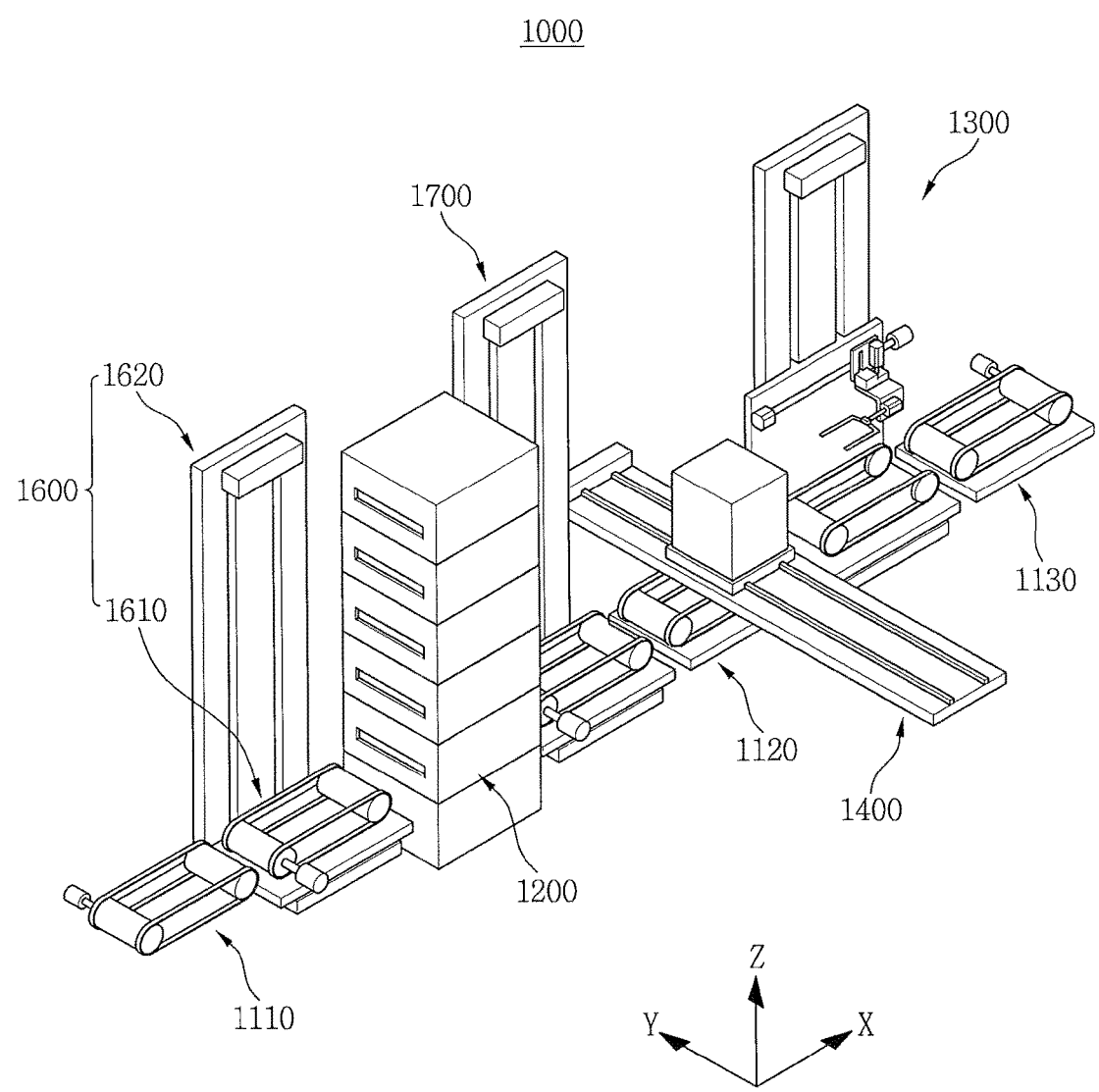
FIG. 8A is a perspective view of a loading part of a main equipment of the test equipment shown in FIG. 7.
Figure 8B:
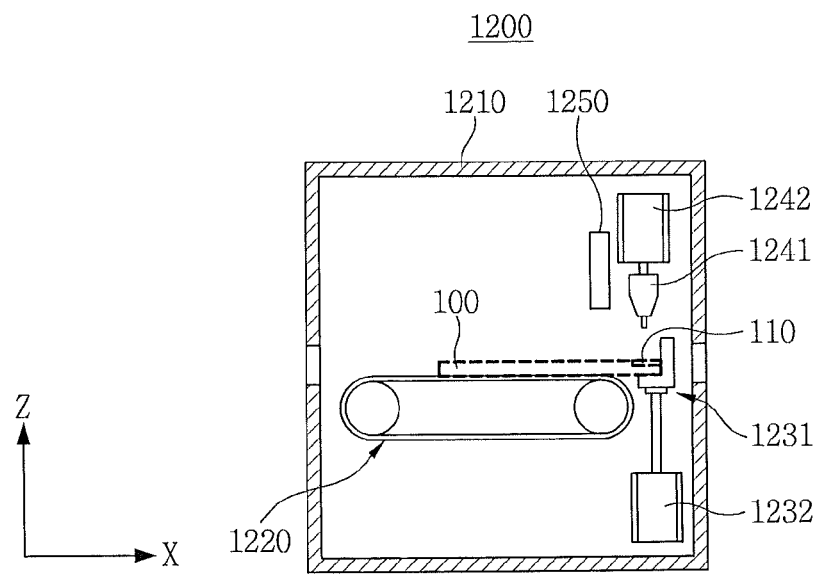
FIG. 8B is a cross-sectional view of an electrical connection test chamber of the loading part of the main equipment of the test equipment shown in FIG. 7.
Figure 8C:
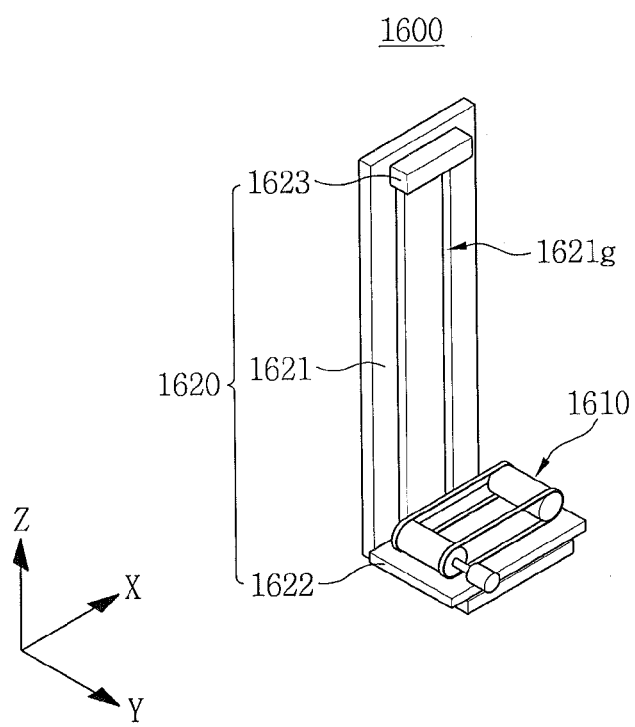
FIG. 8C is a perspective view of an electrical connection division unit of the loading part of the main equipment of the test equipment shown in FIG. 7.

FIG. 8A is a perspective view of the loading part 1000 of the main equipment 2 of the test equipment shown in FIG. 7, FIG. 8B is a cross-sectional view of an electrical connection test chamber 1200 of the loading part 1000 of the main equipment 2 of the test equipment shown in FIG. 7, and FIG. 8C is a perspective view of an electrical connection division unit of the loading part 1000 of the main equipment of the test equipment shown in FIG. 7.

Referring to FIGS. 7 and 8A through 8C, the loading part 1000 of the test equipment for testing the semiconductor device according to embodiments of the inventive concept may include a loading controller 10, a first loading conveyor unit 1110, a second loading conveyor unit 1120, a third loading conveyor unit 1130, electrical connection test chambers 1200, a recovery unit 1300, a recovery magazine unit 1400, an electrical connection carry-in unit 1600, and an electrical connection carry-out unit 1700. The electrical connection test chambers 1200 may be stacked in a third direction Z.

The electrical connection carry-in unit 1600 and the electrical connection carry-out unit 1700 may be electrically connected to the loading controller 10. The electrical connection carry-in unit 1600 and the electrical connection carry-out unit 1700 may be controlled by the loading controller 10.

Each of the electrical connection test chambers 1200 may include an electrical connection test housing 1210, an electrical connection conveyor unit 1220, an electrical connection stopper unit 1230, an electrical connection test unit 1240, and a code recognition unit 1250. The electrical connection test unit 1240 may be directly connected to the cloud server 1. The code recognition unit 1250 may confirm product information regarding an undivided PCB 100 disposed in the electrical connection test chamber 1200.

The electrical connection carry-in unit 1600 may flow the undivided PCB 100 disposed in the loading part 1000 into one of the electrical connection test chambers 1200. The undivided PCB 100 loaded in the loading part 1000 may be moved by the electrical connection carry-in unit 1600 into one of the electrical connection test chambers 1200. The electrical connection carry-in unit 1600 may be interposed between the first loading conveyor unit 1110 and the electrical connection test chambers 1200. The electrical connection carry-in unit 1600 may include a carry-in conveyor unit 1610 and a carry-in conveyor moving element 1620.

The carry-in conveyor unit 1610 may move the undivided PCB 100 disposed in the electrical connection carry-in unit 1600. The carry-in conveyor unit 1610 may be disposed along with the first loading conveyor unit 1110 in a first direction X. The undivided PCB 100 disposed in the electrical connection carry-in unit 1600 may be moved by the carry-in conveyor unit 1610 in the first direction X. The carry-in conveyor unit 1610 may move the undivided PCB 100 in the first direction X under the control of the loading controller 10.

The carry-in conveyor moving element 1620 may move the carry-in conveyor unit 1610. The carry-in conveyor unit 1610 may be moved by the carry-in conveyor moving element 1620 and disposed in a row along with (e.g., aligned with) one of the electrical connection test chambers 1200. The carry-in conveyor moving element 1620 may include a carry-in base plate 1621, a carry-in conveyor support plate 1622, and a carry-in base driving element 1623.

The carry-in base plate 1621 may be spaced apart from a side surface of the carry-in conveyor unit 1610. The carry-in base plate 1621 may face the side surface of the carry-in conveyor unit 1610. The carry-in base plate 1621 may extend in the third direction Z. The carry-in base plate 1621 may have a plate shape parallel to a plane surface formed by the first direction X and the third direction Z. The carry-in base plate 1621 may include a carry-in guide groove 1621g. The carry-in guide groove 1621g may extend in the third direction Z.

The carry-in conveyor support plate 1622 may support the carry-in conveyor unit 1610. The carry-in conveyor support plate 1622 may have a plate shape parallel to a plane surface formed by the first direction X and the second direction Y. The carry-in conveyor support plate 1622 may be combined with the carry-in guide groove 1621g. The carry-in conveyor support plate 1622 may be moved along the carry-in guide groove 1621g in the third direction Z.

The carry-in base driving element 1623 may drive the carry-in conveyor support plate 1622. The carry-in conveyor support plate 1622 may be moved by the carry-in base driving element 1623 in the third direction Z.

The carry-in base driving element 1623 may be disposed on the carry-in base plate 1621. The carry-in base driving element 1623 may be disposed at an upper end portion of the carry-in base plate 1621. The carry-in base driving element 1623 may include a motor.

The carry-in base driving element 1623 may be electrically connected to the loading controller 10. The carry-in base driving element 1623 may be controlled by the loading controller 10. The undivided PCB 100 disposed in the electrical connection carry-in unit 1600 may move to one of the electrical connection test chambers 1200 under the control of the loading controller 10.

The electrical connection carry-out unit 1700 may move the undivided PCB 100, which has been discharged from electrical connection test chambers 1200, to the second loading conveyor unit 1120. The electrical connection carry-out unit 1700 may be interposed between the electrical connection test chambers 1200 and the second loading conveyor unit 1120. The electrical connection carry-out unit 1700 may have the same or similar structure as the electrical connection carry-in unit 1600.

The test part 2000 may include a test controller 20, a test chamber 2500, and main testers 2550. Each of the main testers 2550 may be directly connected to the cloud server 1. The unloading part 3000 may include an unloading controller 30 and a mark marking unit 3100.

Figure 9A:
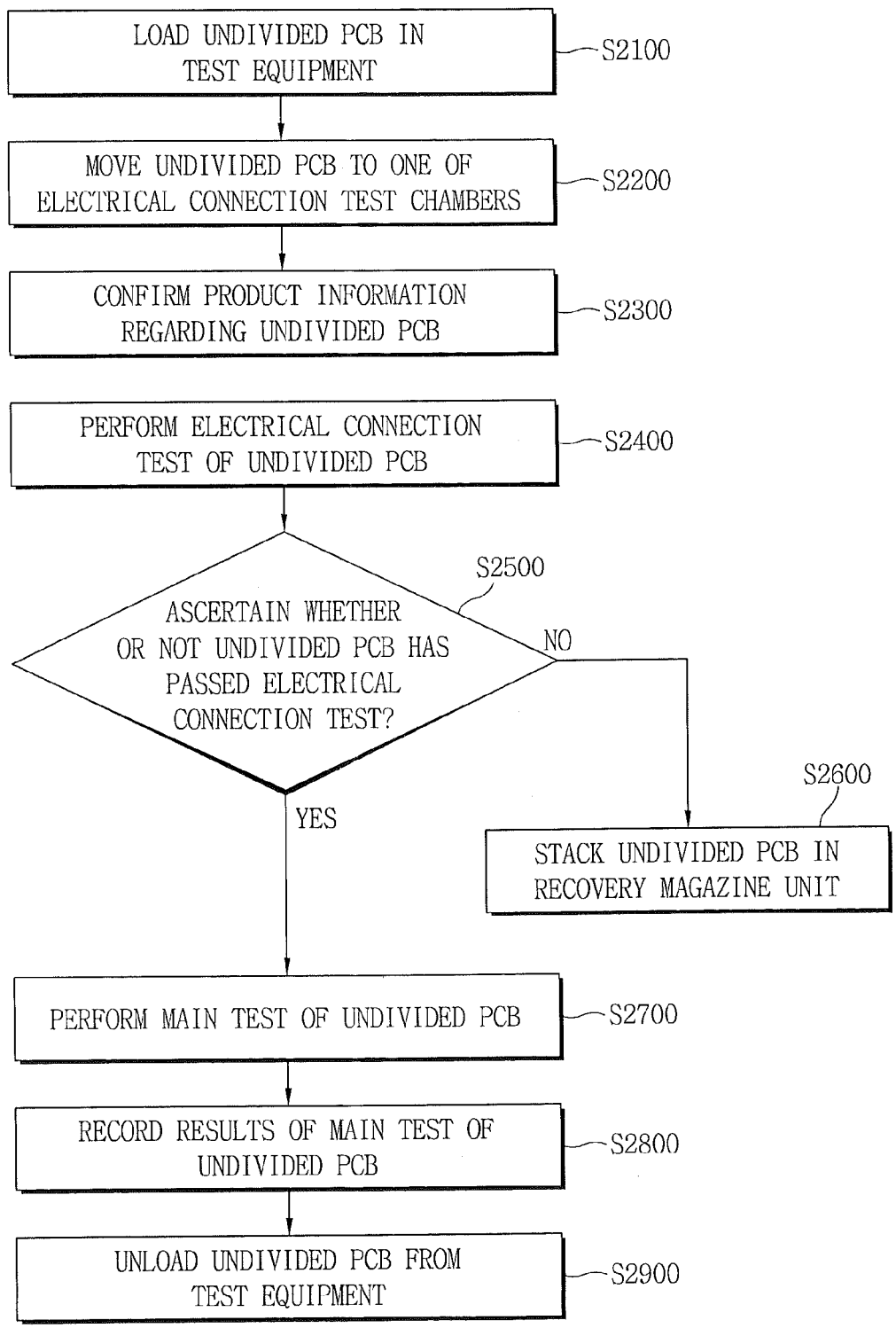
FIGS. 9A through 9C are flowcharts illustrating a method of testing a semiconductor device according to other embodiments of the inventive concept.
Figure 9B:
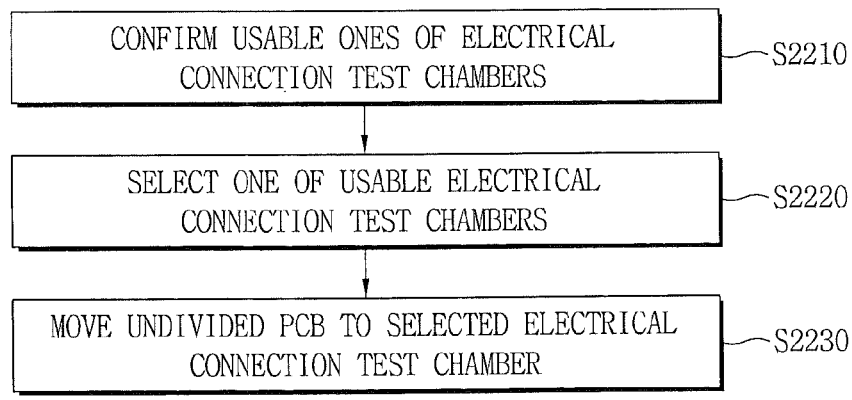
Figure 9C:
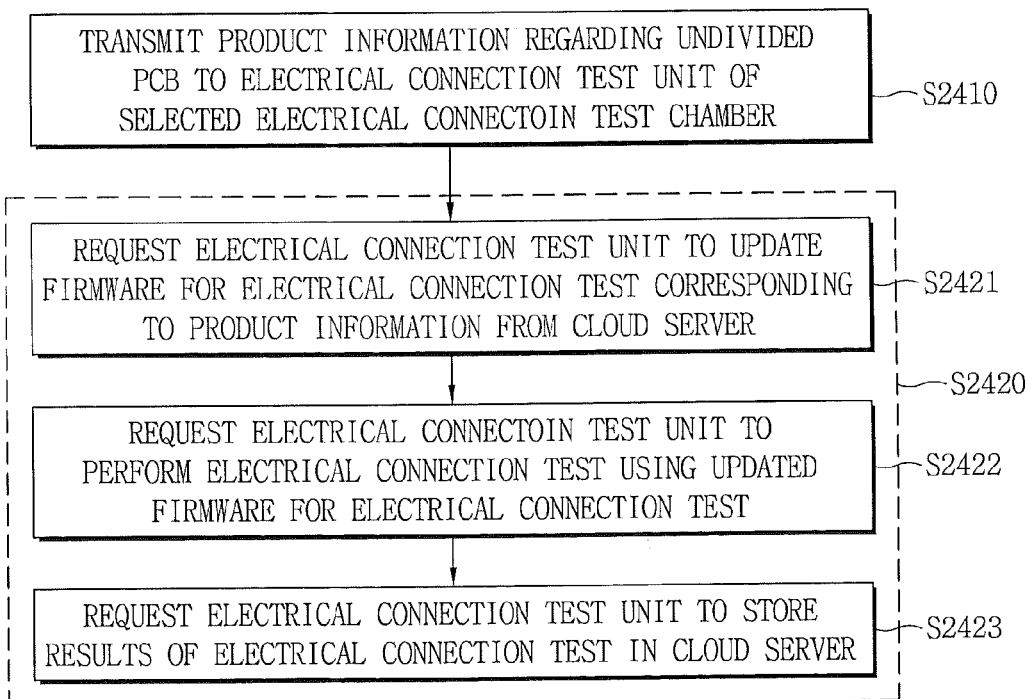

FIGS. 9A through 9C are flowcharts illustrating a method of testing a semiconductor device according to other embodiments of the inventive concept.

The method of testing the semiconductor device according to embodiments of the inventive concept will now be described with reference to FIGS. 7, 8A through 8C, and 9A through 9C. The method of testing the semiconductor device according to embodiments of the inventive concept may include a step of loading an undivided PCB 100 in the test equipment according to the embodiments of the inventive concept (operation S2100), a step of moving the undivided PCB 100 to one of the electrical connection test chambers 1200 (operation S2200), a step of confirming product information of the undivided PCB 100 disposed in the corresponding electrical connection test chamber 1200 (operation S2300), a step of performing an electrical connection test of the undivided PCB 100 disposed in the corresponding electrical connection test chamber 1200 (operation S2400), a step of ascertaining whether or not the undivided PCB 100, which has completed the electrical connection test, has passed the electrical connection test (operation S2500), a step of stacking the undivided PCB 100, which has not passed the electrical connection test, in the recovery magazine unit 1400 of the loading part 1000 (operation S2600), a step of performing a main test of the undivided PCB 100 that has passed the electrical connection test (operation S2700), a step of recording results of the main test of the undivided PCB 100 that has completed the main test (operation S2800), and a step of unloading the undivided PCB 100 on which the results of the main test are recorded from the test equipment according to embodiments of the inventive concept (operation S2900).

The step of moving the undivided PCB 100 to one of the electrical connection test chambers 1200 (operation S2200) may include a step of confirming usable ones of the electrical connection test chambers 1200 (operation S2210), a step of selecting one of the usable electrical connection test chambers 1200 (operation S2220), and a step of moving the undivided PCB 100 to the selected electrical connection test chamber 1200 (operation S2300).

The step of confirming the product information of the undivided PCB 100 disposed in the electrical connection test chamber 1200 (operation S2300) may include a step of confirming a code of the undivided PCB 100 using the code recognition unit 1250 of the corresponding electrical connection test chamber 1200.

The step of performing the electrical connection test of the undivided PCB 100 disposed in the electrical connection test chamber 1200 (operation S2400) may include a step of transmitting the product information of the undivided PCB 100 to the electrical connection test unit 1240 of the selected electrical connection test chamber 1200 (operation S2410), and a step of requesting the electrical connection test unit 1240, to which the product information has been transmitted, to perform the electrical connection test of the undivided PCB 100 (operation S2420).

The step of requesting the electrical connection test unit 1240, to which the product information has been transmitted, to perform the electrical connection test of the undivided PCB 100 (operation S2420) may include a step of requesting the corresponding electrical connection test unit 1240 to update firmware for an electrical connection test corresponding to the product information from the cloud server 1 (operation S2421), a step of requesting the electrical connection test unit 1240 to perform the electrical connection test using the updated firmware for the electrical connection test (operation S2422), and a step of requesting the electrical connection test unit 1240 to store results of the electrical connection test in the cloud server 1 (operation S2422).

Figure 10:
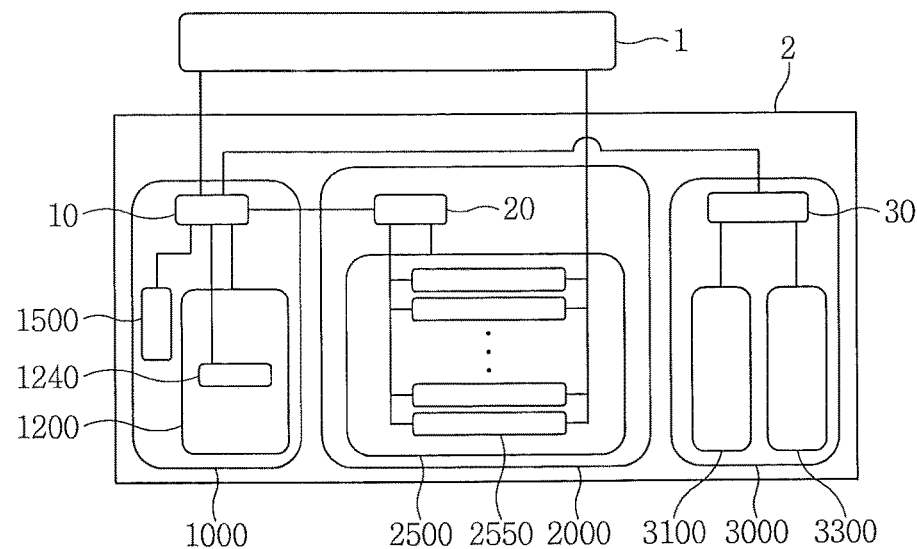
FIG. 10 is a block diagram of a test equipment for testing a semiconductor device according to other embodiments of the inventive concept.

FIG. 10 is a block diagram of a test equipment for testing a semiconductor device according to other embodiments of the inventive concept.

Referring to FIG. 10, the test equipment for testing the semiconductor device according to embodiments of the inventive concept may include a cloud server 1 and a main equipment 2. The main equipment 2 may include a loading part 1000, a test part 2000, and an unloading part 3000.

The loading part 1000 may include electrical connection test chambers 1200, an electrical connection test unit 1240, and a code recognition unit 1500. The test part 2000 may include a test controller 20, a test chamber 2500, and main testers 2550. Each of the main testers 2550 may be in direct contact with the cloud server 1.

Figure 11:
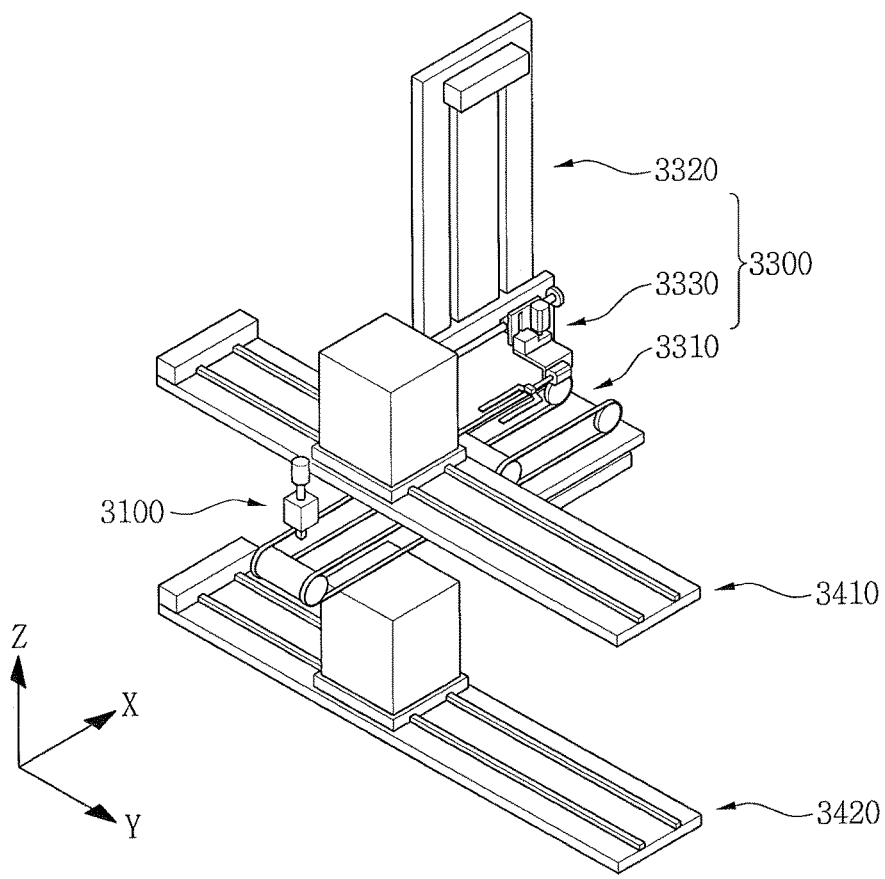
FIG. 11 is a perspective view of an unloading part of a main equipment of the test equipment shown in FIG. 10.

FIG. 11 is a perspective view of the unloading part 3000 of the main equipment 2 of the test equipment shown in FIG. 10.

The unloading part 3000 may include an unloading controller 30, a marking unit 3100, a classification unit 3300, a first keeping magazine unit 3410, and a second keeping magazine unit 3420. The classification unit 3300, the first keeping magazine unit 3410, and the second keeping magazine unit 3420 may be electrically connected to the unloading controller 30. The classification unit 3300, the first keeping magazine unit 3410, and the second keeping magazine unit 3420 may be controlled by the unloading controller 30.

The classification unit 3300 may classify the undivided PCB transferred from the marking unit 3100 based on results of a main test. An undivided PCB on which the results of the main test are recorded may be stacked by the classification unit 3300 in another magazine. For example, the classification unit 3300 may move an undivided PCB, which has passed the main test, to the first keeping magazine unit 3410. An undivided PCB, which has not passed the main test, may be moved by the classification unit 3300 to the second keeping magazine unit 3420. The classification unit 3300 may be disposed along with the marking unit 3100 in a first direction X.

The classification unit 3300 may have the same or similar structure as a recovery unit of the loading part 1000. For example, the classification unit 3300 may include a classification conveyor unit 3310, a classification conveyor moving element 3320, and a classification gripper unit 3330. The classification conveyor unit 3310 may have the same or similar structure as a recovery conveyor unit of the recovery unit. The classification conveyor moving element 3320 may have the same or similar structure as a recovery conveyor moving element of the recovery unit. The classification gripper unit 3330 may have the same or similar structure as a recovery gripper unit of the recovery unit.

The first keeping magazine unit 3410 and the second keeping magazine unit 3420 may contain the undivided PCB that has been moved by the classification unit 3300. The undivided PCB in which the results of the main test are recorded may be stacked by the classification unit 3300 in the first keeping magazine unit 3410 or the second keeping magazine unit 3420.

The first keeping magazine unit 3410 and the second keeping magazine unit 3420 may be disposed on or adjacent the marking unit 3100. For example, the first keeping magazine unit 3410 may be disposed over the marking unit 3100. The second keeping magazine unit 3420 may be disposed below the marking unit 3100. The marking unit 3100, the first keeping magazine unit 3410, and the second keeping magazine unit 3420 may be disposed in a third direction Z.

The first keeping magazine unit 3410 may have the same or similar structure as a recovery magazine unit of the loading part 1000. The second keeping magazine unit 3420 may have the same or similar structure as the first keeping magazine unit 3410.

Figure 12:
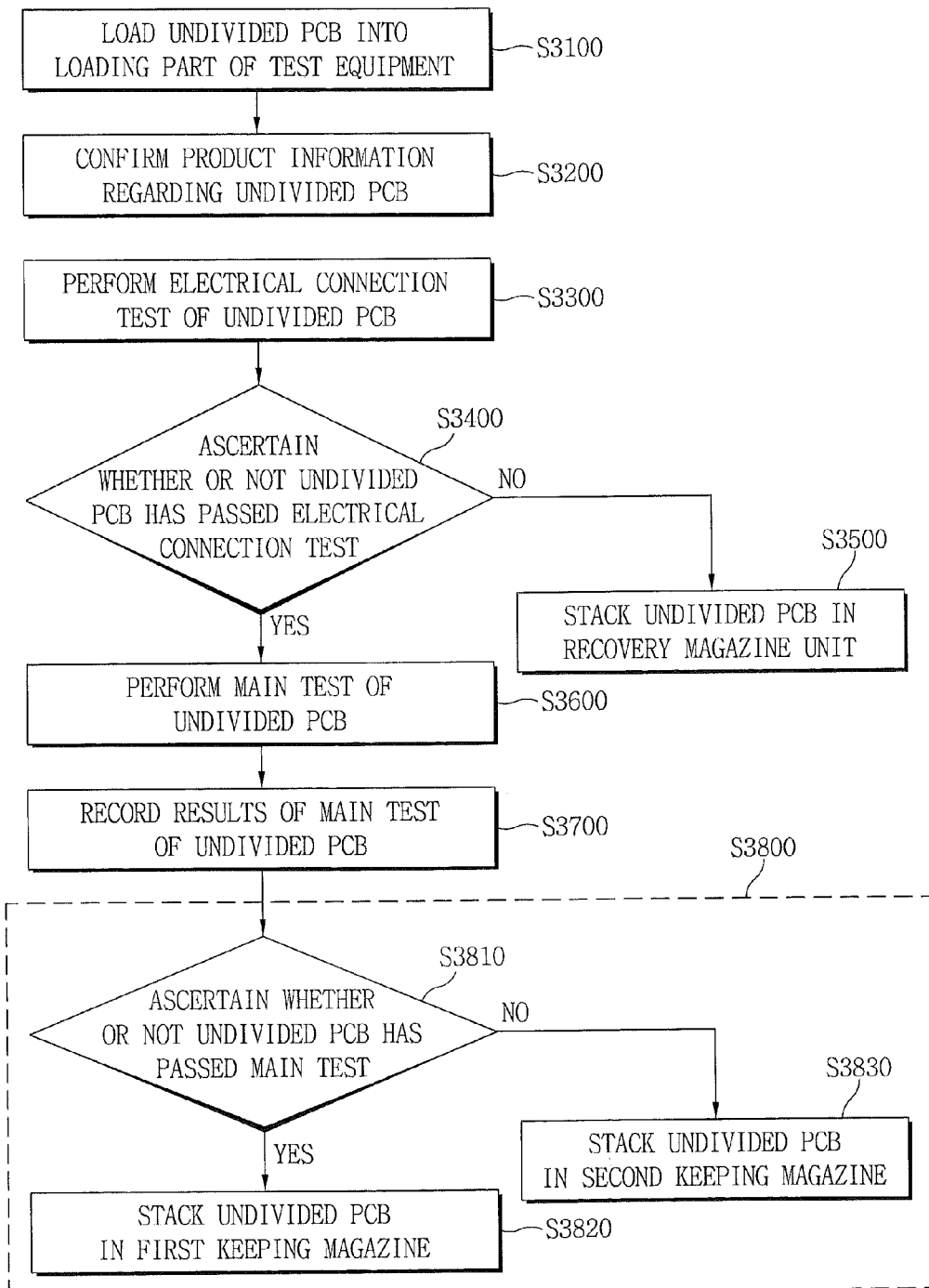
FIG. 12 is a flowchart illustrating a method of testing a semiconductor device according to other embodiments of the inventive concept.

FIG. 12 is a flowchart illustrating a method of testing a semiconductor device according to other embodiments of the inventive concept.

A method of testing a semiconductor device according to embodiments of the inventive concept will now be described with reference to FIGS. 10 through 12. The method of testing the semiconductor device according to embodiments of the inventive concept may include a step of loading an undivided PCB into the loading part 1000 of the test equipment according to embodiments of the inventive concept (operation S3100), a step of confirming product information of the undivided PCB disposed in the loading part 1000 (operation S3200), a step of performing an electrical connection test of the undivided PCB whose product information has been confirmed (operation S3300), a step of ascertaining whether or not the undivided PCB, which has completed the electrical connection test, has passed the electrical connection test (operation S3400), a step of stacking the undivided PCB, which has not passed the electrical connection test, in the recovery magazine unit of the loading part 1000 (operation S3500), a step of performing a main test of the undivided PCB that has passed the electrical connection test (operation S3600), a step of recording results of the main test of the undivided PCB that has completed the main test (operation S3700), and a step of classifying the undivided PCB based on the results of the main test (operation S3800).

The step of stacking the undivided PCB, which has passed the main test, in the first keeping magazine unit 3410 (operation S3820) may include a step of requesting the unloading controller 30 of the unloading part 3000 to move the undivided PCB to the first keeping magazine unit 3410.

The step of stacking the undivided PCB, which has not passed the main test, in the second keeping magazine unit 3420 (operation S3830) may include a step of requesting the unloading controller 30 of the unloading part 3000 to move the undivided PCB to the second keeping magazine unit 3420.

In a test equipment for testing a semiconductor device according to embodiments of the inventive concept and a method of testing a semiconductor device using the test equipment, each of main testers can update firmware for a main test corresponding to product information regarding an undivided PCB via a main test interface directly connected to a cloud server. Accordingly, in the test equipment for testing the semiconductor device according to embodiments of the inventive concept and the method of testing the semiconductor device using the test equipment, each of main testers can perform a test process on undivided PCBs irrespective of the arrangement of unit PCBs.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A method of testing a semiconductor device, the method comprising:

loading in a test equipment at a loading part thereof an undivided printed circuit board (PCB) including a plurality of unit PCBs fixed on the undivided PCB with a semiconductor device being mounted in each of the unit PCBs, wherein the undivided PCB includes a pad portion including test terminals;

confirming product information of the undivided PCB at the loading part of the test equipment including recognizing arrangement information of the unit PCBs stored in a code of the undivided PCB using a code recognition unit;

conveying the undivided PCB from the loading part of the test equipment to a testing part of the test equipment;

electrically connecting the undivided PCB whose product information has been confirmed to one of a plurality of main testers at the testing part of the test equipment by receiving the pad portion of the undivided PCB in a socket of the main tester, wherein each of the main testers includes a main test interface directly connected to a cloud server in which firmwares for various kinds of tests are stored;

transmitting the product information of the undivided PCB to the main tester electrically connected to the undivided PCB;

using the main tester, performing a main test of the undivided PCB using the transmitted product information; and unloading the undivided PCB on which the main test has been performed by the main tester from the test equipment, wherein electrically connecting the undivided PCB to one of the main testers comprises confirming usable main testers of the plurality of main testers, selecting one of the usable main testers, and electrically connecting the undivided PCB to the selected main tester, wherein electrically connecting the undivided PCB to the selected main tester comprises fixing the undivided PCB into a drawer of the test equipment electrically connected to the selected main tester using a test controller of the test equipment.

2. The method of claim 1, wherein performing the main test of the undivided PCB comprises updating firmware for a main test corresponding to the product information, which is stored in the cloud server, and performing the main test of the undivided PCB using the updated firmware.

3. The method of claim 1, wherein transmitting the product information of the undivided PCB to the main tester electrically connected to the undivided PCB comprises confirming an electrical connection between the undivided PCB and the selected main tester using the test controller.

4. The method of claim 1, further comprising:

electrically connecting the undivided PCB whose product information has been confirmed with an electrical connection tester at the loading part of the test equipment by contacting the electrical connection tester with the pad portion of the undivided PCB;

updating firmware for an electrical connection test corresponding to the product information from the cloud server;
transmitting the updated firmware for the electrical connection test to the electrical connection tester;
performing an electrical connection test of the undivided PCB using the updated firmware for the electrical connection test using the electrical connection tester; and
electrically connecting the undivided PCB, which has passed the electrical connection test, to one of the main testers.

5. The method of claim 4, further comprising stacking the undivided PCB, which has not passed the electrical connection test, in a recovery magazine unit of the test equipment.

6. The method of claim 1, further comprising:
recording results of the main test on the undivided PCB that has completed the main test; and
unloading the undivided PCB on which the results of the main test are recorded from the test equipment.

7. The method of claim 6, wherein recording the results of the main test on the undivided PCB comprises printing a mark in which the results of the main test are stored on the undivided PCB.

8. The method of claim 6, wherein unloading the undivided PCB on which the results of the main test are recorded from the test equipment comprises classifying the undivided PCB based on the results of the main test.

9. The method of claim 8, wherein classifying the undivided PCB based on the results of the main test comprises ascertaining whether or not the undivided PCB has passed the main test, stacking the undivided PCB, which has passed the main test, in a first keeping magazine unit, and stacking the undivided PCB, which has not passed the main test, in a second keeping magazine unit.

10. The method of claim 1, further comprising storing the results of the main test at the cloud server.

11. The method of claim 1, further comprising before conveying the undivided PCB from the loading part of the test equipment to a testing part of the test equipment:
loading the undivided PCB into an electrical connection test chamber at the loading part of the test equipment using a conveyor that conveys the undivided PCB into the electrical connection test chamber;
stopping the undivided PCB in the electrical connection test chamber using a stopper unit such that an electrical connection tester is disposed above the pad portion of the undivided PCB; and
performing an electrical connection test of the undivided PCB using an electrical connection tester in the electrical connection test chamber.

12. The method of claim 11, wherein performing an electrical connection test of the undivided PCB includes lowering the electrical connection tester to contact the pad portion of the undivided PCB.

13. A method of testing a semiconductor device, the method comprising:
loading an undivided printed circuit board (PCB) in a test equipment, wherein the undivided PCB includes a plurality of unit PCBs fixed on the undivided PCB, each unit PCB including a semiconductor device, wherein the undivided PCB includes a pad portion including test terminals;
moving the undivided PCB to an electrical connection test chamber at a loading part of the test equipment;
confirming product information of the undivided PCB disposed in the electrical connection test chamber including recognizing arrangement information of the unit PCBs stored in a code of the undivided PCB using a code recognition unit of the electrical connection test chamber;
transmitting the product information of the undivided PCB to an electrical connection test unit of the electrical connection test chamber, the electrical connection test unit being directly connected to a cloud server;
performing an electrical connection test of the undivided PCB using the product information using the electrical connection test unit;
conveying the undivided PCB, which has passed the electrical connection test, from the loading part of the test equipment to a testing part of the test equipment;
electrically connecting the undivided PCB, which has passed the electrical connection test, to one of a plurality of main testers of the test equipment at the testing part of the test equipment by receiving the pad portion of the undivided PCB in a socket of the main tester, the main testers being discretely connected to the cloud server;
transmitting the product information of the undivided PCB to the main tester electrically connected to the undivided PCB;
using the main tester, performing a main test of the undivided PCB using the transmitted product information;
recording results of the main test on the undivided PCB on which the main test has been performed by the main tester; and
classifying the undivided PCB on which the results of the main test are recorded based on the results of the main test,
wherein electrically connecting the undivided PCB to one of the main testers comprises confirming usable main testers of the plurality of main testers, selecting one of the usable main testers, and electrically connecting the undivided PCB to the selected main tester,
wherein electrically connecting the undivided PCB to the selected main tester comprises fixing the undivided PCB into a drawer of the test equipment electrically connected to the selected main tester using a test controller of the test equipment.

14. The method of claim 13, wherein performing the electrical connection test of the undivided PCB using the product information comprises receiving updated firmware for an electrical connection test corresponding to the product information from the cloud server and performing the electrical connection test of the undivided PCB using the updated firmware.

15. The method of claim 14, further comprising storing results of the electrical connection test in the cloud server.

16. A method of testing a semiconductor device, the method comprising:
loading an undivided printed circuit board (PCB) in a loading area of a test equipment, wherein the undivided PCB includes a plurality of unit PCBs fixed on the undivided PCB, each unit PCB including a semiconductor device, wherein the undivided PCB includes a pad portion including test terminals;
confirming product information of the undivided PCB including recognizing arrangement information of the unit PCBs stored in a code of the undivided PCB using a code recognition unit disposed at the loading area;
loading the undivided PCB into an electrical connection test chamber at the loading area of the test equipment using a conveyor that conveys the undivided PCB into the electrical connection test chamber;

stopping the undivided PCB in the electrical connection test chamber using a stopper unit such that an electrical connection tester is disposed above the pad portion of the undivided PCB;

performing an electrical connection test of the undivided PCB using an electrical connection tester in the electrical connection test chamber including lowering the electrical connection tester to contact the pad portion of the undivided PCB;

conveying the undivided PCB to a testing area of the test equipment;

electrically connecting the undivided PCB to one of a plurality of main testers at the testing area by receiving the pad portion of the undivided PCB in a socket of the main tester;

receiving firmware corresponding to the product information from a cloud server at the main tester; and performing a main test of the undivided PCB at the main tester using the received firmware, wherein electrically connecting the undivided PCB to one of the main testers comprises confirming usable main testers of the plurality of main testers, selecting one of the usable main testers, and electrically connecting the undivided PCB to the selected main tester, wherein electrically connecting the undivided PCB to the selected main tester comprises fixing the undivided PCB into a drawer of the test equipment electrically connected to the selected main tester using a test controller of the test equipment.

17. The method of claim 16, further comprising:
transmitting the product information to a cloud server using a controller associated with the loading area; and
receiving from the cloud server firmware corresponding to the product information at the controller associated with the loading area;
wherein performing the electrical connection test of the undivided PCB comprises performing the electrical connection test of the undivided PCB using the received firmware.

18. The method of claim 16, wherein the code recognition unit is disposed above the conveyor that conveys the undivided PCB into the electrical connection test chamber.

19. The method of claim 16, further comprising:
ascertaining whether the undivided PCB has passed the electrical connection test using an electrical connection tester disposed in the electrical connection test chamber;
conveying the undivided PCB to the testing area of the test equipment if the undivided PCB has passed the electrical connection test; and
conveying the undivided PCB to a recovery magazine unit if the undivided PCB has not passed the electrical connection test.

* * * * *